United States Patent
Shionoiri

(10) Patent No.: US 8,050,070 B2
(45) Date of Patent: *Nov. 1, 2011

(54) RECTIFIER CIRCUIT, POWER SUPPLY CIRCUIT, AND SEMICONDUCTOR DEVICE

(75) Inventor: Yutaka Shionoiri, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/022,789

(22) Filed: Feb. 8, 2011

(65) Prior Publication Data

US 2011/0127338 A1 Jun. 2, 2011

Related U.S. Application Data

(63) Continuation of application No. 11/979,991, filed on Nov. 13, 2007, now Pat. No. 7,889,528.

(30) Foreign Application Priority Data

Nov. 29, 2006 (JP) ................................. 2006-321034

(51) Int. Cl.
*H02M 7/00* (2006.01)
(52) U.S. Cl. ........................... 363/125; 363/61; 363/126
(58) Field of Classification Search .................... 363/60, 363/61, 123, 125, 126, 127; 323/269, 270, 323/271, 273
See application file for complete search history.

(56) References Cited

U.S. PATENT DOCUMENTS

| | | | |
|---|---|---|---|
| 3,940,681 A * | 2/1976 | Ohsawa | 363/127 |
| 5,483,207 A | 1/1996 | Gabara | |
| 5,870,031 A | 2/1999 | Kaiser et al. | |
| 6,809,952 B2 | 10/2004 | Masui | |
| 7,424,265 B2 | 9/2008 | Umeda et al. | |
| 7,424,266 B2 | 9/2008 | Ootaka et al. | |
| 7,660,145 B2 * | 2/2010 | Nomura | 365/129 |
| 2002/0195648 A1 * | 12/2002 | Hirata | 257/315 |
| 2005/0282505 A1 * | 12/2005 | Umeda et al. | 455/100 |
| 2008/0083969 A1 | 4/2008 | Osada | |

FOREIGN PATENT DOCUMENTS

| | | |
|---|---|---|
| JP | 07-142182 | 6/1995 |
| JP | 2909867 | 6/1999 |
| WO | WO 2005/098955 | 10/2005 |
| WO | WO 2006/129742 | 12/2006 |

* cited by examiner

*Primary Examiner* — Bao Q Vu
*Assistant Examiner* — Nguyen Tran
(74) *Attorney, Agent, or Firm* — Eric J. Robinson; Robinson Intellectual Property Law Office, P.C.

(57) ABSTRACT

It is an object of the present invention to provide a rectifier circuit that can suppress deterioration or dielectric breakdown of a semiconductor element due to excessive current. A rectifier circuit of the present invention includes at least a first capacitor, a second capacitor, and a diode which are sequentially connected in series in a path which connects an input terminal and one of two output terminals, and a transistor. The second capacitor is connected between one of a source region and a drain region and a gate electrode of the transistor. Further, the other one of the source region and the drain region and the other one of two output terminals are connected each other.

18 Claims, 24 Drawing Sheets

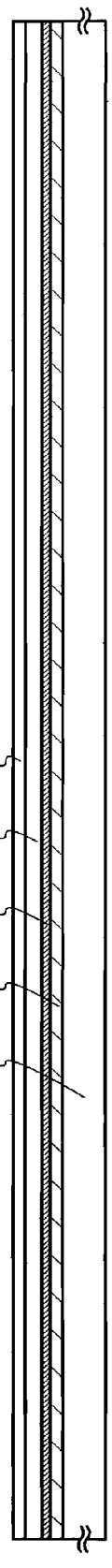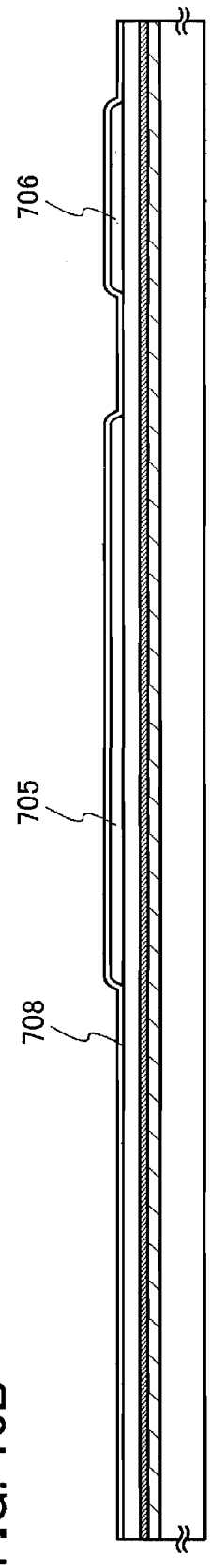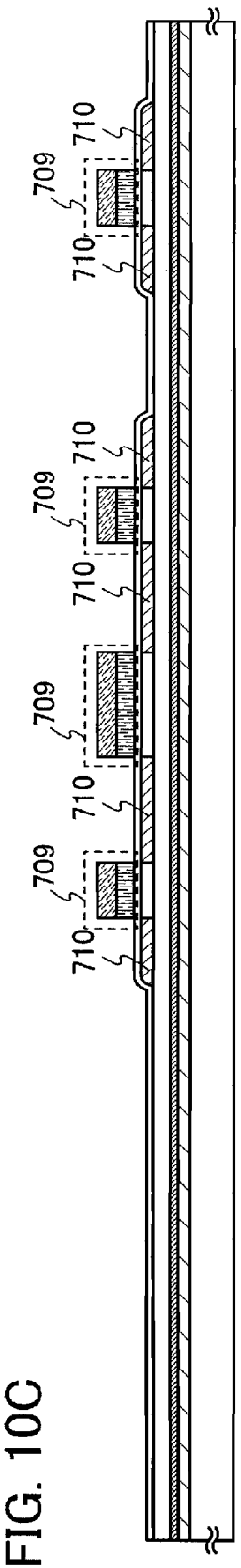

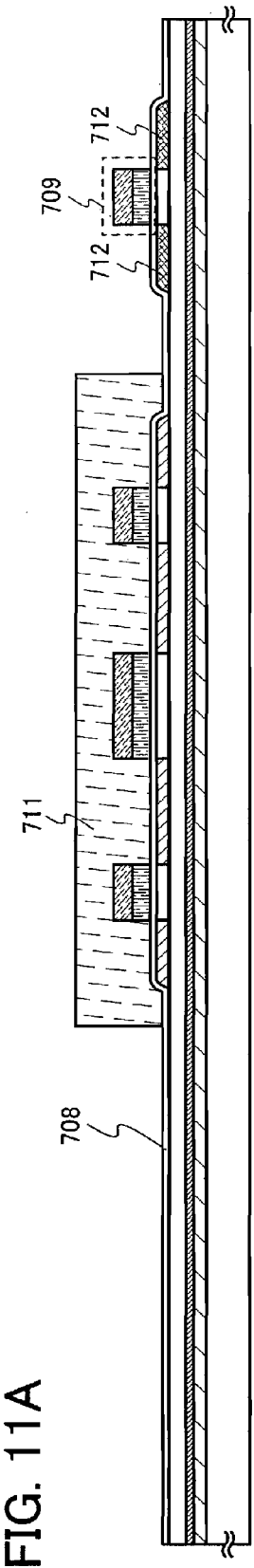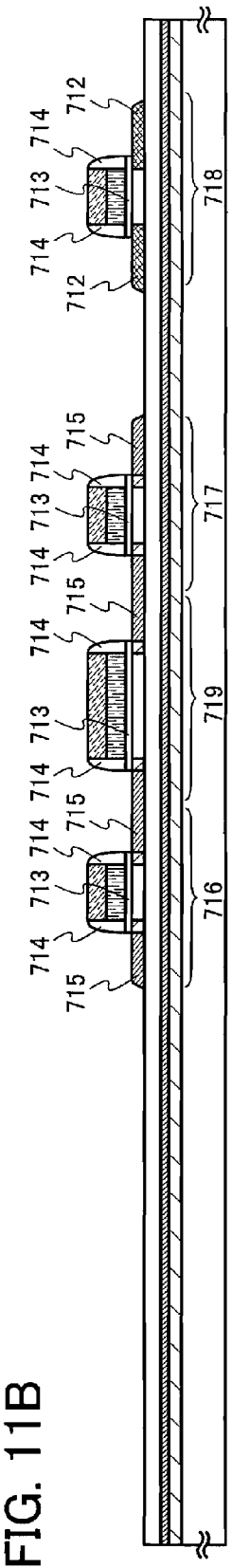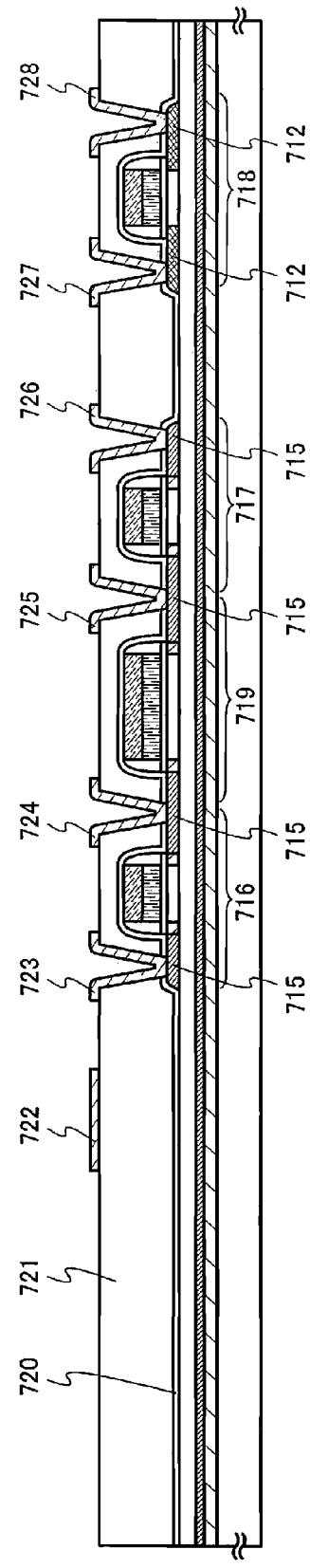

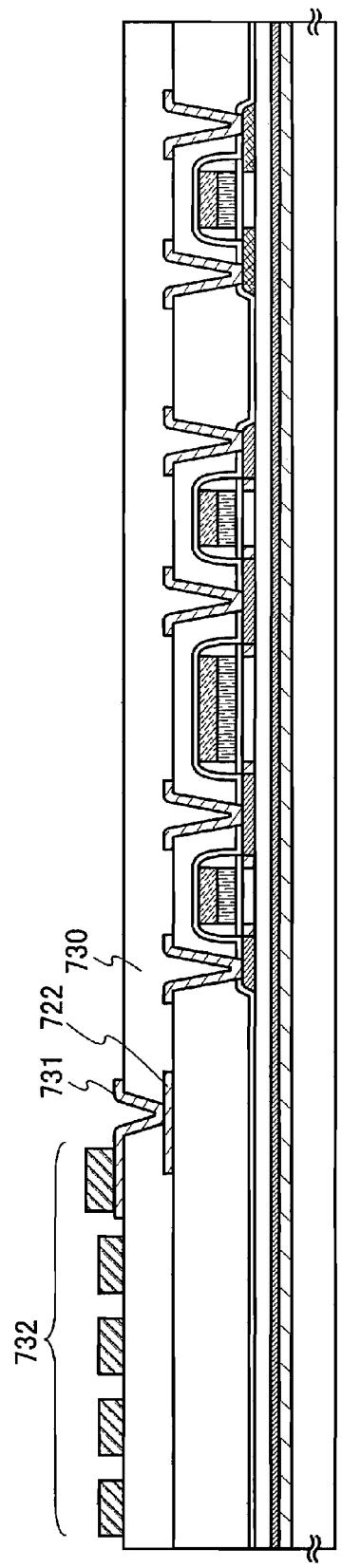
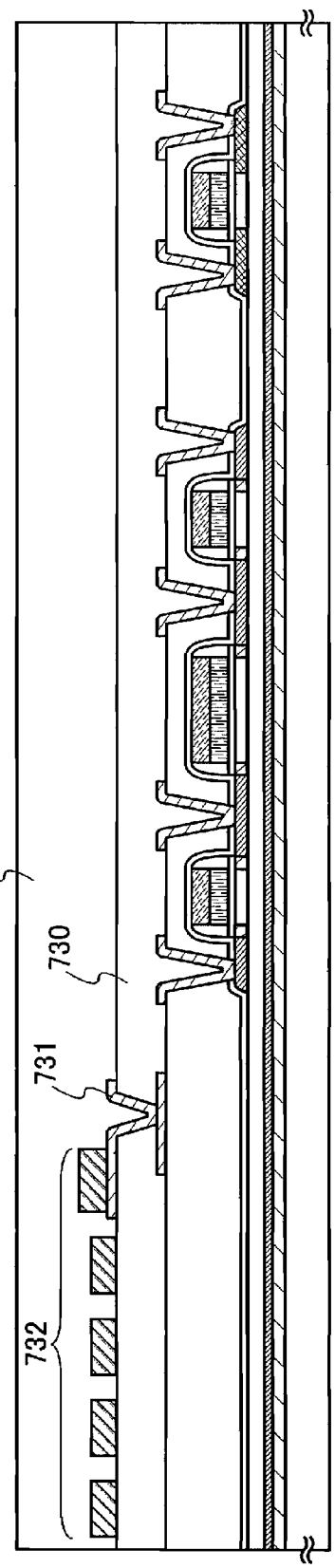

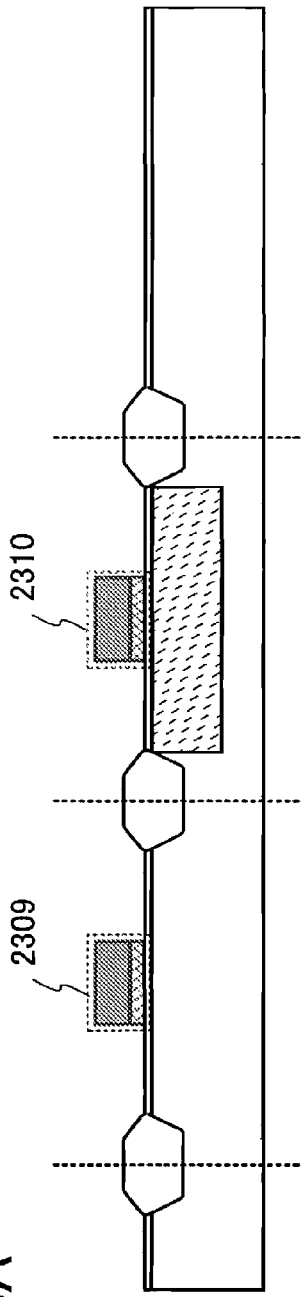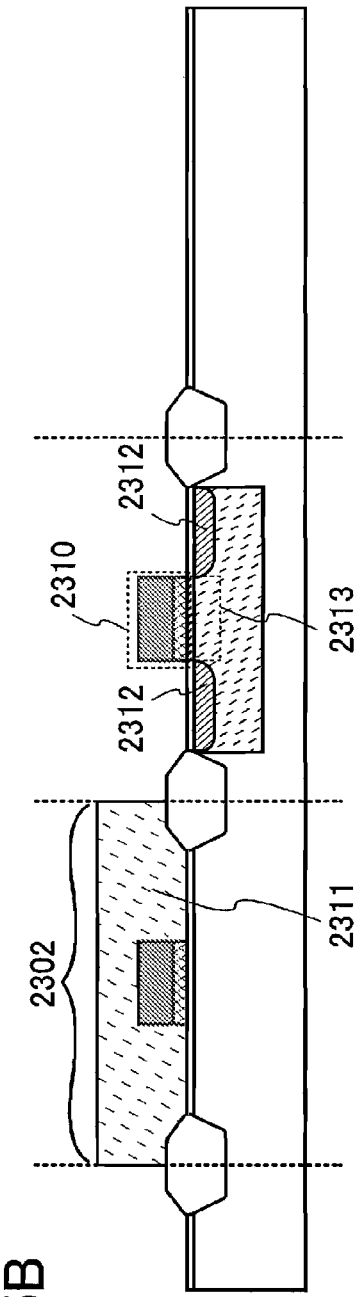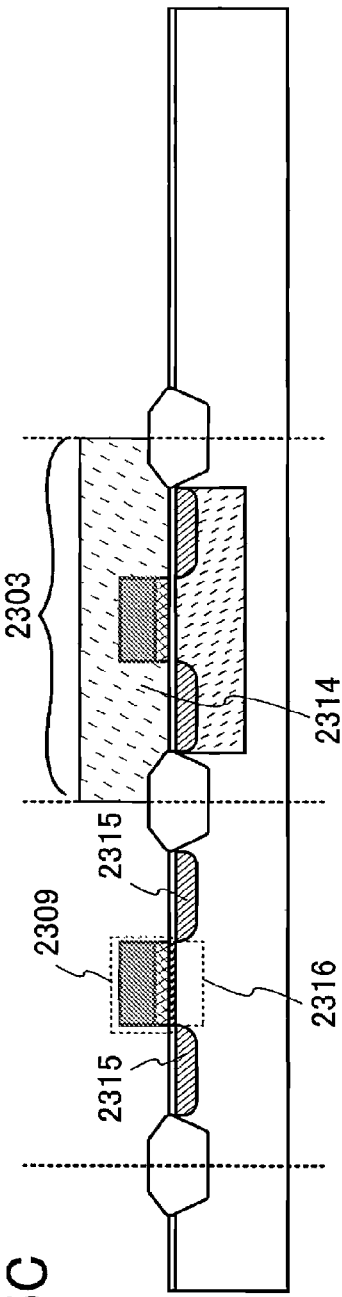

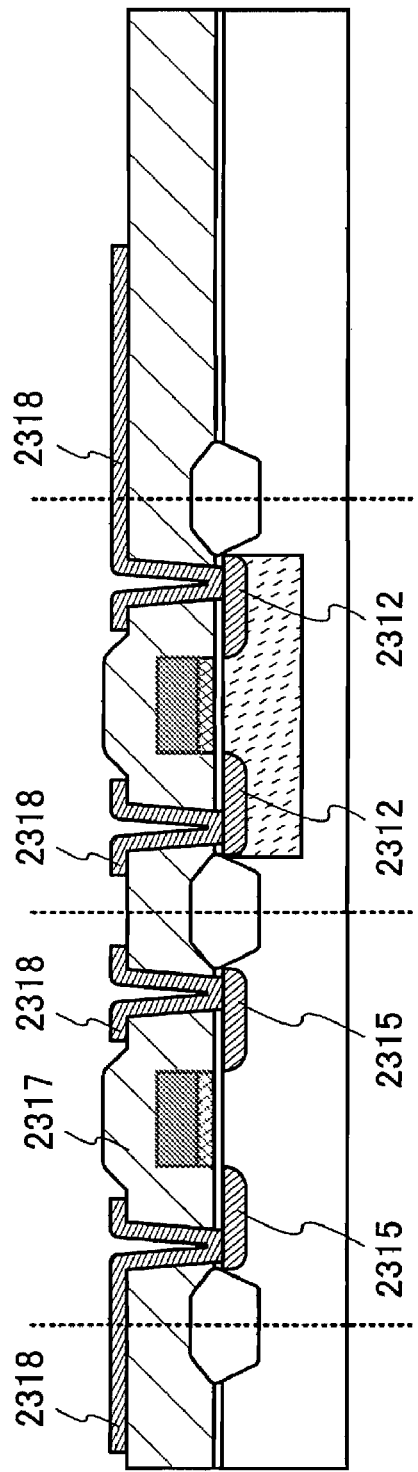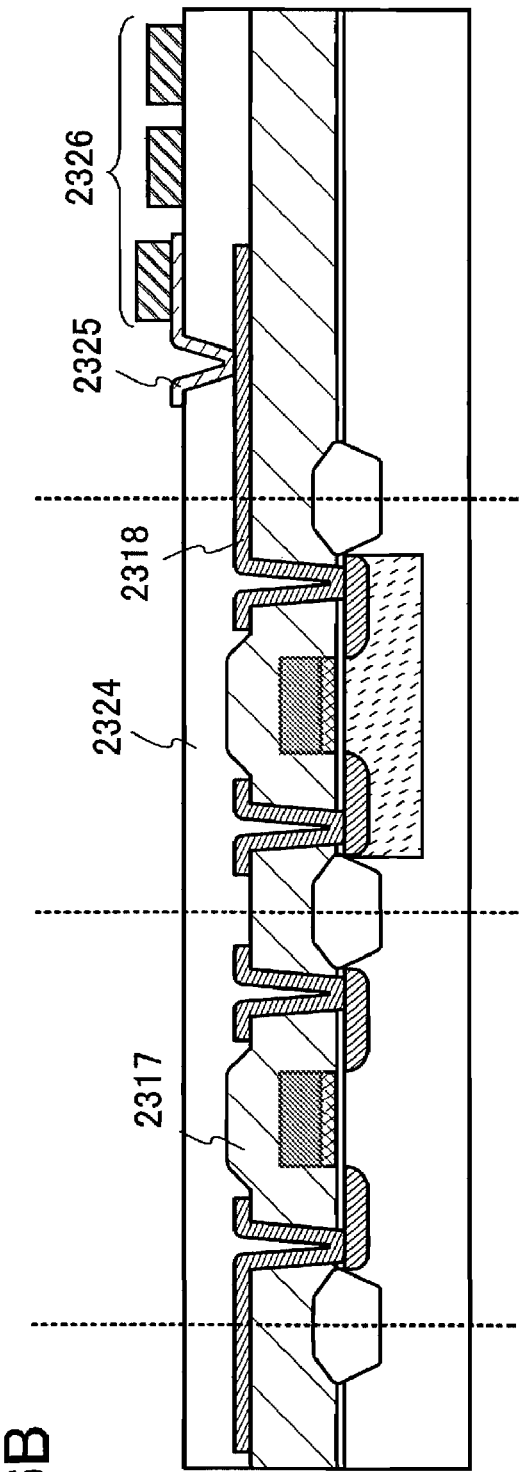

RECTIFIER CIRCUIT, POWER SUPPLY CIRCUIT, AND SEMICONDUCTOR DEVICE

BACKGROUND OF THE INVENTION

1. Field of the Invention

The present invention relates to a rectifier circuit which uses a diode and a power supply circuit which uses the rectifier circuit. More particularly, the present invention relates to a semiconductor device which uses the rectifier circuit or the power supply circuit and can perform wireless communication.

2. Description of the Related Art

Technology by which a signal is transmitted and received without contact between media (RF tags) each incorporating an integrated circuit and an antenna (RFID: Radio Frequency Identification) has been put to practical use in various fields and has been anticipated to further expand the market as a new mode of information communication. As the shape of an RF tag used for an RFID, a card shape or a chip shape which is smaller than such a card shape are employed in many cases; however, various shapes can be employed in accordance with an application.

As for RFID, communication between a reader, a reader/writer, or an interrogator and an RF tag can be performed with a radio wave. Specifically, a radio wave generated from an interrogator is converted into an electric signal by an antenna in an RF tag, and an integrated circuit in the RF tag is operated in accordance with the electric signal. Then, the radio wave modulated in accordance with an electric signal which is outputted from the integrated circuit is generated from the antenna; thus, a signal can be transmitted to the interrogator without contact. Here, the interrogator also has an antenna.

Note that RF tags can be broadly categorized into two types: active RF tags and passive RF tags. An active RF tag incorporates a primary battery and does not generate electric energy in the RF tag. On the other hand, a passive RF tag can generate electric energy in the RF tag with the use of a radio wave generated from an interrogator. Specifically, after a radio wave received from the interrogator is converted into an AC voltage by an antenna, the AC voltage is rectified by a rectifier circuit and then supplied to each circuit in the RF tag as a power supply voltage by using a smoothing capacitor or the like.

A structure of a rectifier circuit which uses one diode and a smoothing capacitor connected to an output side of the rectifier circuit is disclosed in Patent Document 1 (Japanese Patent No. 2909867 (p. 6, FIG. 1)). FIG. 18 illustrates the structure of the rectifier circuit and the smoothing capacitor which are disclosed in Patent Document 1. In the rectifier circuit illustrated in FIG. 18, a diode 800 is connected between an input terminal 801 and an output terminal 802. An anode and a cathode of the diode 800 are disposed on the input terminal 801 side and the output terminal 802 side, respectively. In addition, one of two electrodes of a capacitor 803 is connected to the output terminal 802, and the other is connected to a ground (GND).

SUMMARY OF THE INVENTION

As for RFID, intensity of a radio wave generated from an interrogator is prescribed by a standard such as ISO or JIS, or by decree.

However, even when intensity of radio waves generated from an interrogator are constant, the shorter a communication distance between an RF tag and an interrogator is, the higher amplitude of a voltage of an AC signal received by an antenna in the RF tag is. When amplitude of the voltage of the AC signal that is received by the antenna is high, a voltage higher than a desired value is generated by a rectifier circuit, a smoothing capacitor, and the like that receive the signal first. The generated voltage is supplied to a circuit connected to a next stage of the rectifier circuit. Consequently, a voltage higher than a desired value is supplied to a semiconductor element in the circuit, and a current higher than expected flows through the semiconductor element. Therefore, there has been a problem in likeliness of deterioration or breakdown of the semiconductor element.

When a radio wave generated from the interrogator includes noise, or radiation which is unnecessary is emitted from an electronic device other than the interrogator, the RF tag is exposed to an intense radio wave that exceeds a predetermined level. In this case, an AC signal which has such a high amplitude of voltage that deviates from a predetermined range is received by the antenna. When amplitude of the AC signal that is received by the antenna is high, a voltage higher than a desired value is generated by the rectifier circuit that receives the signal first. The generated voltage is supplied to a circuit connected to a next stage of the rectifier circuit. Consequently, a voltage higher than a desired value is supplied to a semiconductor element in the circuit, and a current higher than expected flows through the semiconductor element. Therefore, there has been a problem in likeliness of deterioration or breakdown of the semiconductor element.

In addition, in order to reduce the cost of an integrated circuit, in general, the size of an integrated circuit formed of a semiconductor element is reduced by miniaturizing the semiconductor element and the number of integrated circuits that can be formed over one mother glass is increased. However, there is a problem that, when the semiconductor element is miniaturized, a withstand voltage gets low and thus an RF tag is more likely to be broken down due to excessive current.

Moreover, an RF tag has another problem that, when a radio wave generated from the interrogator includes noise, a normal operation of a circuit in the RF tag is impeded by the noise.

It is assumed that an AC signal which has a characteristic illustrated in FIG. 19A is inputted into the input terminal 801 of the rectifier circuit illustrated in FIG. 18. In this case, as illustrated by a broken line in FIG. 19B, the AC signal inputted into the input terminal 801 is rectified by the diode 800 and outputted to the output terminal 802. The signal outputted to the output terminal 802 is smoothed by the capacitor 803; thus, actually, a signal which has such a characteristic that is illustrated by a solid line in FIG. 19B is outputted to the output terminal 802.

FIG. 19C illustrates temporal change of a voltage in the output terminal 802 illustrated in FIG. 19B, with the time scale increased. As illustrated in FIG. 19C, although periodic increase and decrease of voltage can be observed, an average of a voltage in each period is ideally kept the same, and the voltage of the signal outputted to the output terminal 802 is considered to be a DC voltage.

However, when a radio wave generated from the interrogator includes noise, the noise is directly included also in a voltage generated by the rectifier circuit and the smoothing capacitor connected to an output side thereof. FIG. 19D illustrates temporal change of a voltage in the output terminal 802, in the case where a radio wave generated from the interrogator includes noise which has a low frequency wave. As illustrated in FIG. 19D, noise (noise which has a low frequency wave) occurs so that an average of a voltage in each period is increased and decreased with a longer period. When the voltage outputted from the rectifier circuit includes such noise illustrated in FIG. 19D, a DC voltage fluctuates over time; thus, there is a possibility that an operation of a circuit of a next stage is adversely affected.

In addition, FIG. 19E illustrates temporal change of a voltage in the output terminal 802, in the case where a radio wave generated from the interrogator includes noise which has a high frequency wave. Since the signal illustrated in FIG. 19A includes a signal which has a higher frequency, noise with which voltage changes accidentally (noise which has a high frequency wave) occurs as illustrated in FIG. 19E. When the voltage outputted from the rectifier circuit includes such noise illustrated in FIG. 19E, similarly to the case where noise which has a low frequency wave occurs, a DC voltage fluctuates over time; thus, there is a possibility that an operation of a circuit of a next stage is adversely affected.

In view of the above problems, it is an object of the present invention to provide a rectifier circuit that can suppress deterioration or breakdown of a semiconductor element due to excessive voltage or current, in a rectifier circuit or a circuit connected to a next stage of the rectifier circuit. In addition, it is another object of the present invention to provide a semiconductor device that can suppress deterioration or breakdown of a semiconductor element due to excessive voltage or current, in a rectifier circuit or a circuit connected to a next stage of the rectifier circuit, and that can perform communication wirelessly.

Moreover, in view of the above problems, it is still another object of the present invention to provide a power supply circuit which includes a rectifier circuit and a smoothing capacitor which can prevent the outputted voltage from including noise. In addition, it is still further another object of the present invention to provide a semiconductor device that can prevent a normal operation of an integrated circuit from being impeded by noise even when a radio wave generated from an interrogator includes the noise and that can perform communication wirelessly.

In addition to a diode that already exists, the rectifier circuit of the present invention has at least one MOS (metal-oxide semiconductor) transistor including a capacitor between a gate electrode and one of a source region and a drain region.

Specifically, the rectifier circuit of the present invention has at least a first capacitor, a second capacitor, and a diode which are sequentially connected in series in a path which connects an input terminal and one of two output terminals and a transistor. Then, the second capacitor is connected between one of the source region and drain region and the gate electrode of the transistor. The other one of the source region and drain region and the other one of two output terminals are connected each other. When the transistor is an n-channel type, one of the source region and the drain region of the transistor is connected to a cathode of the diode. To the contrary, when the transistor is a p-channel type, one of the source region and the drain region of the transistor is connected to an anode of the diode. According to the above structure, a signal rectified from one of the two output terminals is outputted when an AC signal is inputted into the input terminal.

In addition, the power supply circuit of the present invention has a third capacitor connected between the two output terminals in parallel, in addition to the rectifier circuit. A signal outputted from one of the output terminals is smoothed by the third capacitor; thus, a DC voltage is generated.

Note that a resistor or a diode may be connected between the gate electrode of the transistor and the output terminal in the rectifier circuit or the power supply circuit of the present invention.

In addition, the semiconductor device of the present invention has the rectifier circuit or the power supply circuit in an integrated circuit, and an AC signal received by an antenna is inputted into the input terminal of the rectifier circuit or an input terminal of the power supply circuit. Note that the semiconductor device of the present invention does not necessarily include the antenna as long as at least the integrated circuit is included. Further, the integrated circuit included in the semiconductor device of the present invention may have at least the rectifier circuit which rectifies an AC signal received by the antenna or the power supply circuit which rectifies a voltage of the AC signal received by the antenna and generates a DC voltage.

In the rectifier circuit of the present invention, the first capacitor and the second capacitor are connected in series in a preceding stage of the diode or the transistor, between the input terminal and the one of the output terminals. Therefore, even when an AC voltage which has high amplitude is fed to the input terminal, the voltage applied to the transistor or the diode can be reduced. In addition, voltages are not directly applied to the diode or the transistor. Therefore, deterioration or breakdown of the diode or the transistor due to excessive voltage can be suppressed.

Thus, even when a communication distance between an interrogator and an RF tag is short or an RF tag is exposed to an intense radio wave that exceeds a predetermined level due to radiation which is unnecessary, reliability of the semiconductor device can be secured.

In the power supply circuit of the present invention, the transistor or the diode in an on state can be considered to be a resistor. Thus, the second capacitor and the resistor are connected in series. In addition, the third capacitor is connected to the transistor and the diode in parallel. Since the second capacitor, the resistor, and the third capacitor collectively function as a low-pass filter, it is possible to prevent noise which has a high frequency wave from being directly included in a DC voltage generated by the rectifier circuit and the smoothing capacitor, even when the noise is included in an AC voltage which is fed to the input terminal.

Further, in the power supply circuit of the present invention, in the case where the resistor is connected between the gate electrode of the transistor and the output terminal, the resistor and the first capacitor collectively function as a high-pass filter. Therefore, it is possible to prevent noise which has a low frequency wave from being directly included in a DC voltage generated by the power supply circuit, even when the noise is included in an AC voltage which is fed to the input terminal.

Thus, even when noise which has a high frequency wave or a low frequency wave is included in a radio wave generated from the interrogator, the noise is unlikely to be included in a DC voltage generated in the power supply circuit. Consequently, operations of various circuits which operate using the DC voltage in the semiconductor device are unlikely to be affected by the noise; thus, operations of the semiconductor device can be stabilized.

BRIEF DESCRIPTION OF THE DRAWINGS

In the accompanying drawings:

FIGS. 10A to 10C are views illustrating a manufacturing method of a semiconductor device of the present invention;

FIGS. 11A to 11C are views illustrating a manufacturing method of a semiconductor device of the present invention;

FIGS. 12A and 12B are views illustrating a manufacturing method of a semiconductor device of the present invention;

FIGS. 15A to 15C are views illustrating a manufacturing method of a semiconductor device of the present invention;

FIGS. 16A and 16B are views illustrating a manufacturing method of a semiconductor device of the present invention;

DETAILED DESCRIPTION OF THE INVENTION

Embodiment modes of the present invention will be described hereinafter with reference to the accompanying drawings. However, the present invention can be embodied in many different modes, and those skilled in the art can easily understand that modes and details of the present invention can be changed in various ways without departing from the purpose and the scope of the present invention. Therefore, the present invention should not be interpreted as being limited to the description of the embodiment modes.

Embodiment Mode 1

Figure 1A:
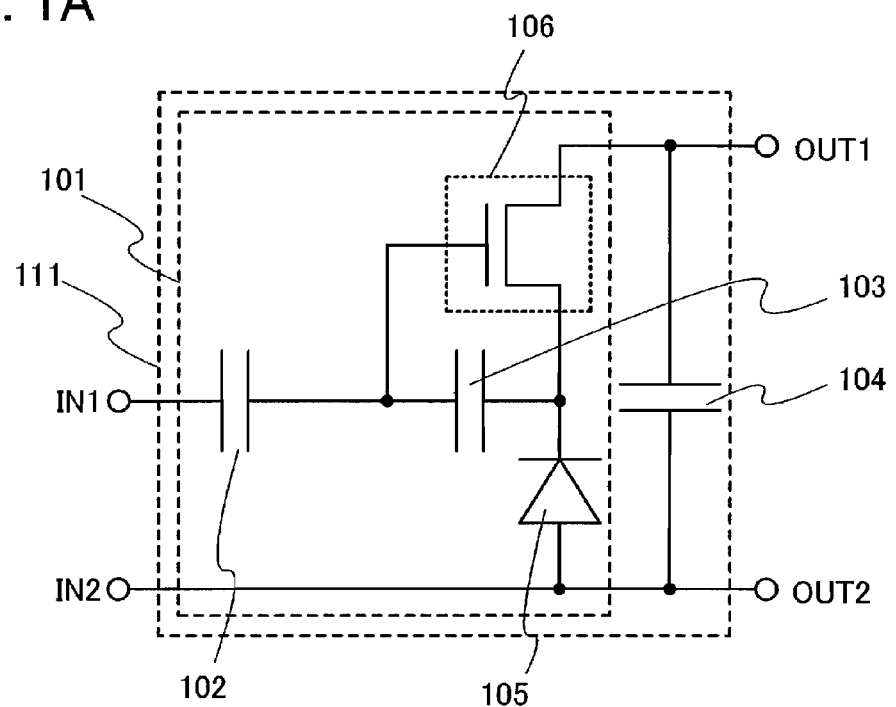
FIGS. 1A and 1B are circuit diagrams each illustrating a structure of a rectifier circuit and a power supply circuit of the present invention.
Figure 1B:
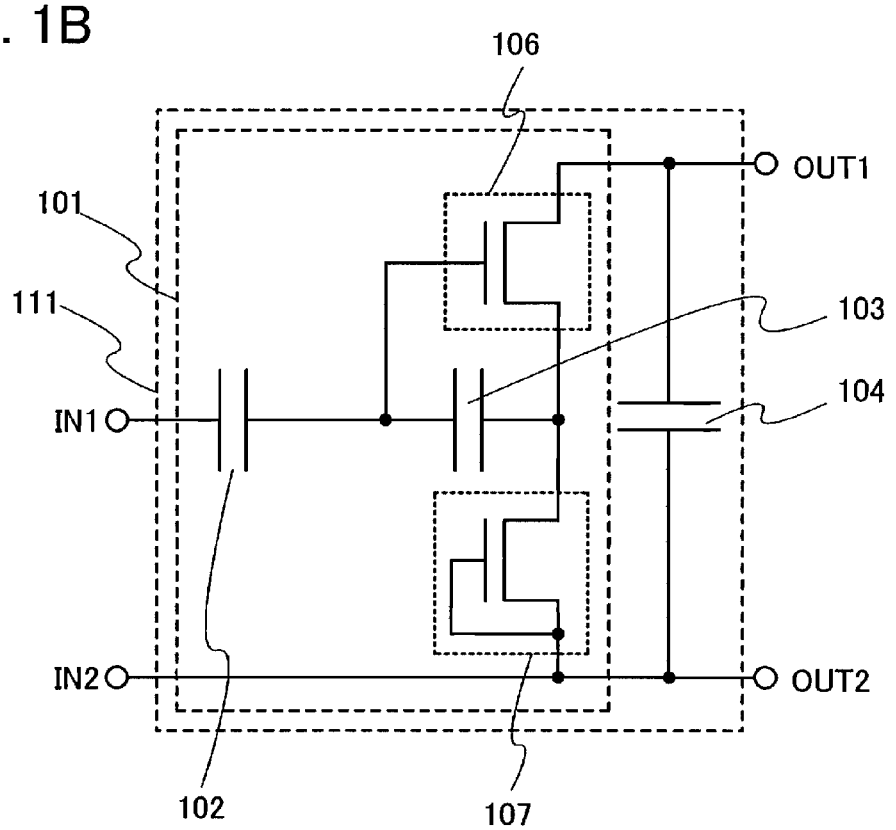

A structure of a rectifier circuit and a power supply circuit of the present invention will be described with reference to FIGS. 1A and 1B. In FIG. 1A, reference numeral 101 corresponds to a rectifier circuit of the present invention. The rectifier circuit 101 is connected to two input terminals IN1 and IN2 and two output terminals OUT1 and OUT2. Two terminals of an antenna are each connected to the input terminal IN1 or IN2. In addition, the rectifier circuit 101 has at least a first capacitor 102, a second capacitor 103, a diode 105, and a transistor 106. Note that FIG. 1A illustrates a structure of the rectifier circuit 101 in the case where the transistor 106 is an n-channel type. In addition, a power supply circuit 111 of the present invention has a third capacitor 104, in addition to the rectifier circuit 101.

The first capacitor 102, the second capacitor 103, and the diode 105 are sequentially connected in series in a path which connects the input terminal IN1 and the output terminal OUT2. With description in more detail, a first electrode of the first capacitor 102 is connected to the input terminal IN1. In addition, a second electrode of the first capacitor 102 is connected to a first electrode of the second capacitor 103. A second electrode of the second capacitor 103 is connected to a cathode of the diode 105. An anode of the diode 105 is connected to the output terminal OUT2 and the input terminal IN2.

The first capacitor 102 is connected between the input terminal IN1 and a gate electrode of the transistor 106. Further, the second capacitor 103 is connected between one of a source region and a drain region and a gate electrode of the transistor 106. One of the source region and the drain region of the transistor 106 is connected to the output terminal OUT1, and the other is connected to the cathode of the diode 105. The anode of the diode 105 is connected not only to the output terminal OUT2 but also to the input terminal IN2. The third capacitor 104 is connected to the output terminal OUT1, and between the output terminal OUT2 and the input terminal IN2.

Note that a resistor or a diode may be connected between the second electrode of the first capacitor 102 and the output terminal OUT2.

In addition, a transistor may be used as the diode 105. In this case, the diode 105 can also be formed using the same manufacturing process as the transistor 106. A structure in the case where an n-channel transistor 107 is used as the diode 105 in the rectifier circuit 101 and the power supply circuit 111 of FIG. 1A is illustrated in FIG. 1B. In FIG. 1B, a gate electrode of the transistor 107 is connected to the input terminal IN2 and the output terminal OUT2. In addition, one of a source region and a drain region of the transistor 107 is connected to the second electrode of the second capacitor 103, and the other is connected to the gate electrode, the output terminal OUT2, and the input terminal IN2. When the n-channel transistor 107 is regarded as the diode, one of the source region and the drain region, which is connected to the gate electrode, functions as an anode, along with the gate electrode, and the other functions as a cathode.

Note that the transistor 107 may be a p-channel type. In this case, the gate electrode of the transistor 107 is connected to the second electrode of the second capacitor 103. In addition, one of the source region and the drain region of the transistor 107 is connected to the input terminal IN2 and the output terminal OUT2, and the other is connected to the gate electrode and the second electrode of the second capacitor 103. When the p-channel transistor 107 is regarded as the diode, one of the source region and the drain region, which is connected to the gate electrode, functions as a cathode, along with the gate electrode, and the other functions as an anode.

Figure 2A:
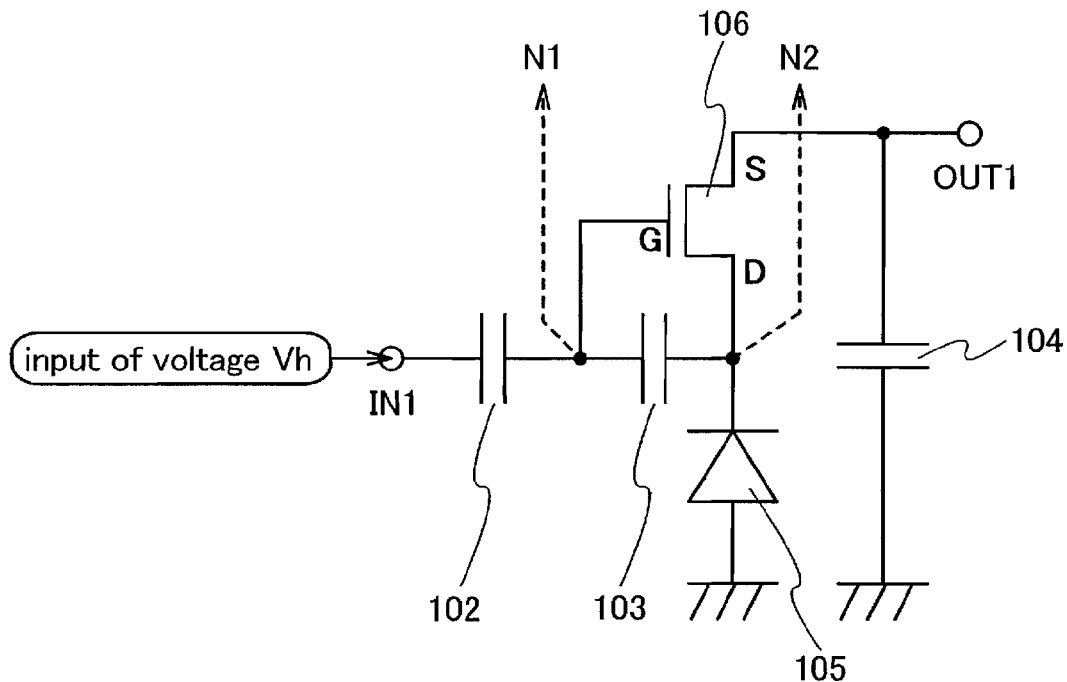
FIGS. 2A and 2B are diagrams each illustrating an operation of a rectifier circuit and a power supply circuit of the present invention.

Next, operations of the rectifier circuit 101 and the power supply circuit 111 illustrated in FIG. 1A will be described with reference to FIG. 2A. As illustrated in FIG. 2A, it is assumed that a voltage Vh higher than a ground (GND) is applied to the input terminal IN1. At this time, the input terminal IN1 and the output terminal OUT2 are supposed to be connected to the ground (GND). When the voltage Vh is applied to the input terminal IN1, the voltage Vh is applied to the second electrode of the first capacitor 102, the first electrode of the second capacitor 103, and the gate electrode of the transistor 106. Hereinafter, the voltages of the second electrode of the first capacitor 102, the first electrode of the second capacitor 103, and the gate electrode of the transistor 106 are each expressed as a voltage of a first node (N1). Note that the voltage actually decreases depending on the first capacitor 102, the second capacitor 103, gate capacitance of the transistor 106, parasitic resistance, and parasitic capacitance. Therefore, the voltage of the first node (N1) gets lower than the voltage Vh; however, there is no problem in explaining the operations even when the voltage of the first node (N1) is considered to be almost the same as the voltage Vh.

When the voltage of the first node (N1) is the voltage Vh, the voltage Vh is applied to the second electrode of the second capacitor 103 and the cathode of the diode 105. Hereinafter, the voltages of the second electrode of the second capacitor 103 and the cathode of the diode 105 are each expressed as a voltage of a second node (N2). Note that the voltage actually decreases depending on the second capacitor 103, capacitance between the gate electrode and the drain region of the transistor 106, parasitic resistance, and parasitic capacitance. Therefore, the voltage of the second node (N2) gets much lower than the voltage Vh; however, there is no problem in explaining the operations even when the voltage of the second node (N2) is considered to be almost the same as the voltage Vh.

When the voltage of the second node (N2) is the voltage Vh, since the transistor 106 is an n-channel type, as to a pair of impurity regions included in the transistor 106, one impurity region connected to the second electrode of the second capacitor 103 and the cathode of the diode 105 can be considered to be a drain region (D), and the other impurity region connected to the output terminal OUT1 can be considered to be a source region (S). When a gate voltage corresponding to a voltage between the gate electrode and the source region gets higher than a threshold voltage Vth of the transistor 106, the transistor 106 is turned on. Since a reverse bias voltage is applied to the diode 105, the diode 105 is turned off. Thus, a voltage which is lower than the voltage of the second node (N2) by the threshold voltage Vth of the transistor 106, a voltage (Vh−Vth) in this case, is fed to the output terminal OUT1.

Figure 2B:
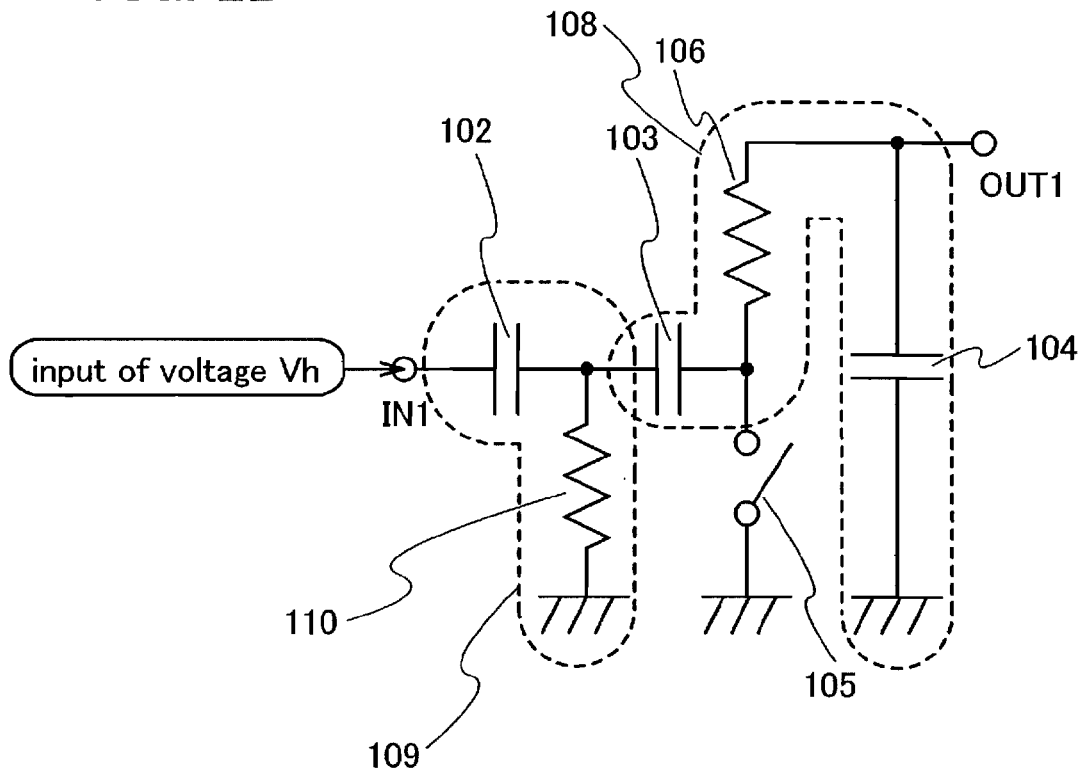

A structure of the power supply circuit 111 in the case where the transistor 106 in an on state is considered to be a resistor is illustrated in FIG. 2B. Since the diode 105 is off in FIG. 2A, the diode 105 is illustrated as a switch which is opened in FIG. 2B. When the voltage Vh is applied to the input terminal IN1, the first capacitor 102, the second capacitor 103, and the transistor 106 which is a resistor are connected in series. The third capacitor 104 is connected between the output terminal OUT1 and the output terminal OUT2 which is connected to the ground (GND). Here, since the second capacitor 103, the transistor 106 which is a resistor, and the third capacitor 104 collectively function as a low-pass filter 108, it is possible to prevent noise which has a high frequency wave from being directly included in a DC voltage outputted from the output terminal OUT1, even when the noise is included in an AC signal which is fed to the input terminal IN1.

Further, when a resistor 110 is connected between the second electrode of the first capacitor 102 and the input terminal IN2 in the power supply circuit 111 of the present invention, the first capacitor 102 and the resistor 110 collectively function as a high-pass filter 109. Therefore, it is possible to prevent noise which has a low frequency wave from being directly included in a DC voltage outputted from the output terminal OUT1, even when the noise is included in an AC signal which is fed to the input terminal IN1.

Thus, even when noise which has a high frequency wave or a low frequency wave is included in a radio wave generated from an interrogator, the noise is unlikely to be included in a DC voltage outputted from the power supply circuit 111, and operations of various circuits which operate using the DC voltage are unlikely to be affected by the noise. Thus, the operations of the various circuits can be stabilized.

In the low-pass filter 108, when a frequency of a voltage which passes through the filter is $F_L$, capacitance of the second capacitor 103 is C2, resistance of the transistor 106 in the case of being considered to be a resistor is $R_t$, and capacitance of the third capacitor 104 is C3, $F_L$ satisfies an equation shown in Formula (1). Thus, values of the capacitance C2, the resistance $R_t$, and the capacitance C3 are desirably set in accordance with a frequency of noise which is desired to be cut. In addition, in the high-pass filter 109, when a frequency of a voltage which passes through the filter is $F_H$, capacitance of the first capacitor 102 is C1, and resistance of the resistor 110 is R, $F_H \geq 1/(2\pi \times C1 \times R)$ is satisfied. Thus, values of the capacitance C1 and the resistance R are desirably set in accordance with a frequency of noise which is desired to be cut.

$$F_L \leq \frac{\sqrt{2 - (1 + C3/C2)^2}}{2\pi \times C3 \times R_t} \qquad \text{Formula (1)}$$

Figure 3A:
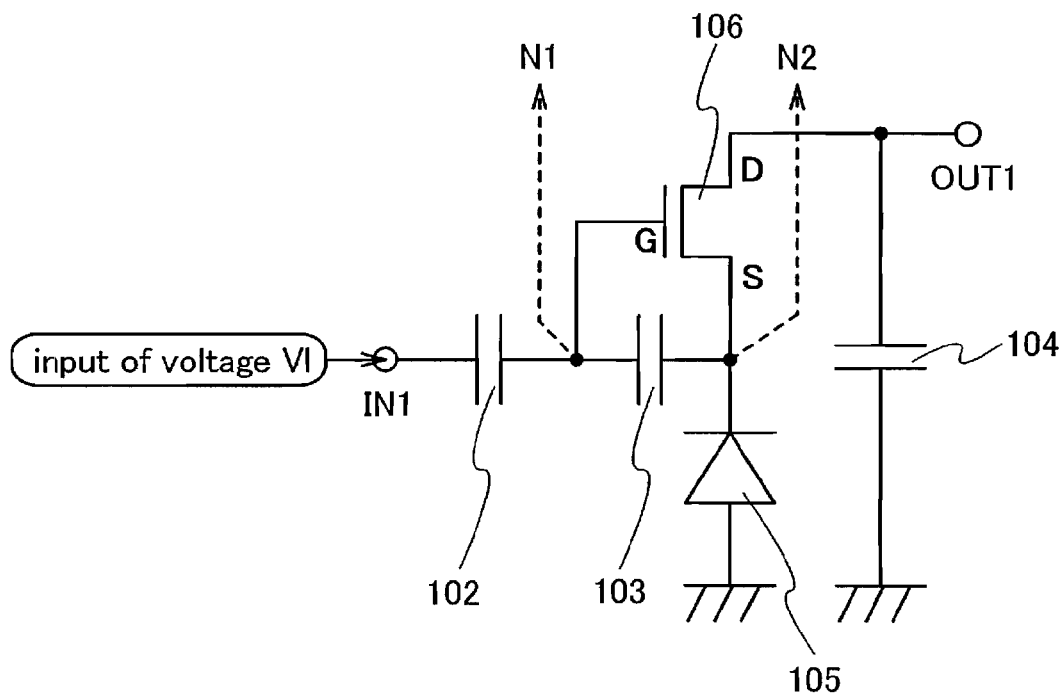
FIGS. 3A and 3B are diagrams each illustrating an operation of a rectifier circuit and a power supply circuit of the present invention.

Next, as illustrated in FIG. 3A, it is assumed that a voltage V1 (=−Vh) lower than the ground (GND) is applied to the input terminal IN1. At this time, the input terminal IN2 is connected to the ground (GND). When the voltage V1 is applied to the input terminal IN1, the voltage of the first node (N1) is the voltage V1. Note that the voltage actually increases depending on the first capacitor 102, the second capacitor 103, gate capacitance of the transistor 106, parasitic resistance, and parasitic capacitance. Therefore, the voltage of the first node (N1) gets higher than the voltage V1; however, there is no problem in explaining the operations even when the voltage of the first node (N1) is considered to be almost the same as the voltage V1.

When the voltage of the first node (N1) is the voltage V1, the voltage of the second node (N2) is also the voltage V1. Note that the voltage actually increases depending on the second capacitor 103, capacitance between the gate electrode and the drain region of the transistor 106, parasitic resistance, and parasitic capacitance. Therefore, the voltage of the second node (N2) gets much higher than the voltage V1; however, there is no problem in explaining the operations even when the voltage of the second node (N2) is considered to be almost the same as the voltage V1.

When the voltage of the second node (N2) is the voltage V1, since the transistor 106 is an n-channel type, as to a pair of impurity regions included in the transistor 106, one impurity region connected to the second electrode of the second capacitor 103 and the cathode of the diode 105 can be considered to be a source region (S), and the other impurity region connected to the output terminal OUT1 can be considered to be a drain region (D). When the gate voltage gets lower than the threshold voltage Vth of the transistor 106, the transistor 106 is turned off. Here, a voltage of the output terminal OUT1 is retained by the third capacitor 104. On the other hand, since a forward bias voltage is applied to the diode 105, the diode 105 is turned on. Thus, the voltage of the second node (N2) gradually reaches the voltage of the ground (GND).

Figure 3B:
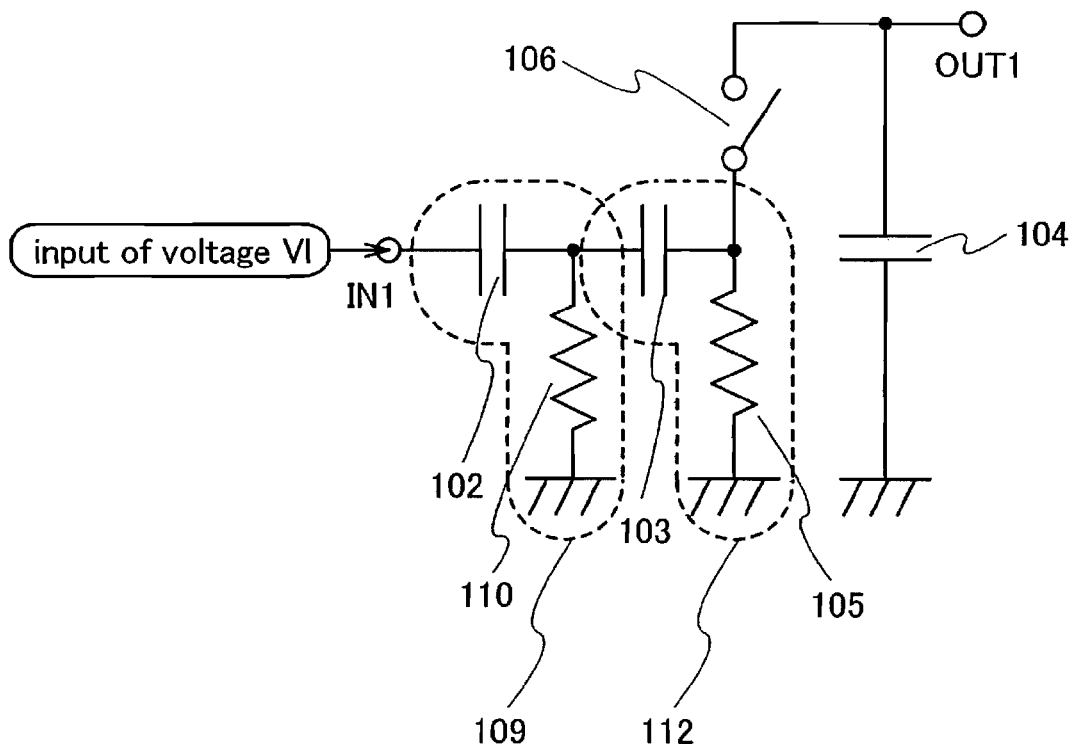

A structure of the power supply circuit 111 in the case where the transistor 106 in an off state is considered to be a switch which is opened is illustrated in FIG. 3B. Since the diode 105 is on in FIG. 3A, the diode 105 is illustrated as a resistor in FIG. 3B.

As illustrated in FIG. 3B, the first capacitor 102 and the resistor 110 collectively function as the high-pass filter 109 in the case where the voltage V1 is applied to the input terminal IN1, similarly to the case illustrated in FIG. 2B. Further, the second capacitor 103 and a resistor formed of the diode 105 collectively function as a high-pass filter 112. Thus, two stages of the high-pass filters are connected in series in its structure; therefore, noise which has a low frequency wave is more unlikely to be included in a DC voltage outputted from the output terminal OUT1.

Note that the kind and the number of semiconductor elements used for the rectifier circuit 101 and the power supply circuit 111 are not limited to those in the structure shown in this embodiment mode. In order to obtain more ideal rectifying characteristics, a resistor, a capacitor, a diode, an inductor, a switch, or the like may be added as appropriate, in addition to the semiconductor elements illustrated in FIG. 1A.

As thus described, in the rectifier circuit of this embodiment mode, the first capacitor 102 and the second capacitor 103 are connected in series at the preceding stage of the diode 105 or the transistor 106. Therefore, even when an AC signal the voltage of which has large amplitude is fed to the input terminal IN1, the voltage applied to the diode 105 or the transistor 106 can be reduced, or the voltage is not directly applied to the diode 105 or the transistor 106. Therefore, deterioration or breakdown of the diode 105 or the transistor 106 due to excessive voltage can be suppressed.

In addition, even when noise which has a high frequency wave or a low frequency wave is included in a radio wave generated from the interrogator, in the power supply circuit 111 of this embodiment mode, the noise is unlikely to be included in a DC voltage outputted from the power supply circuit 111. Consequently, operations of various circuits which operate using the DC voltage in a semiconductor device are unlikely to be affected by the noise. Thus, the operations of the semiconductor device can be stabilized.

Embodiment Mode 2

Figure 4A:
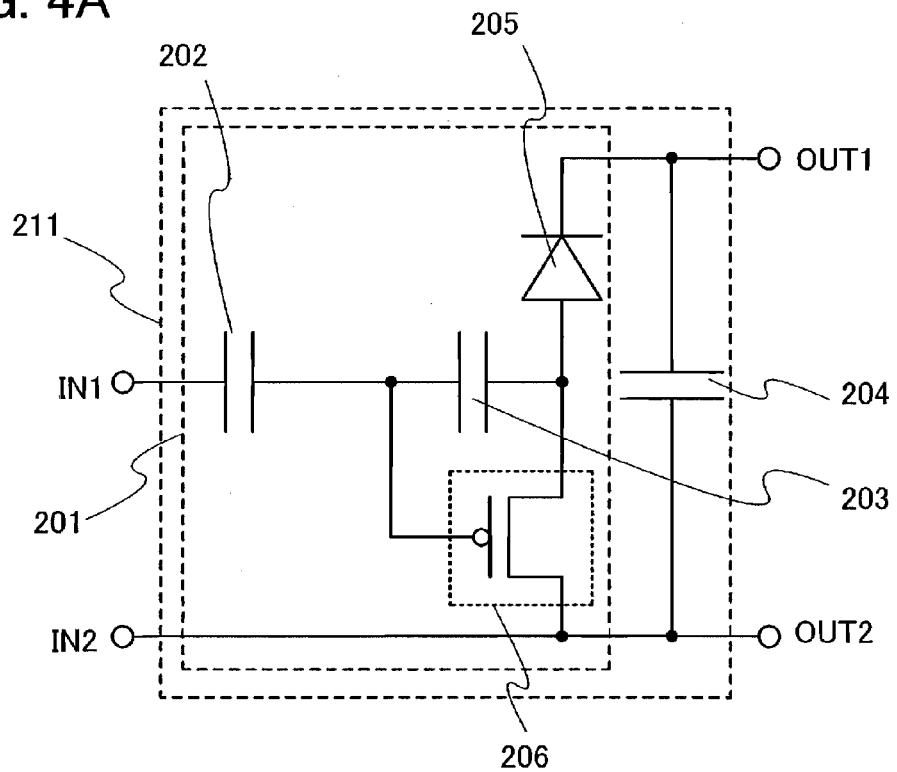
FIGS. 4A and 4B are circuit diagrams each illustrating a structure of a rectifier circuit and a power supply circuit of the present invention.
Figure 4B:
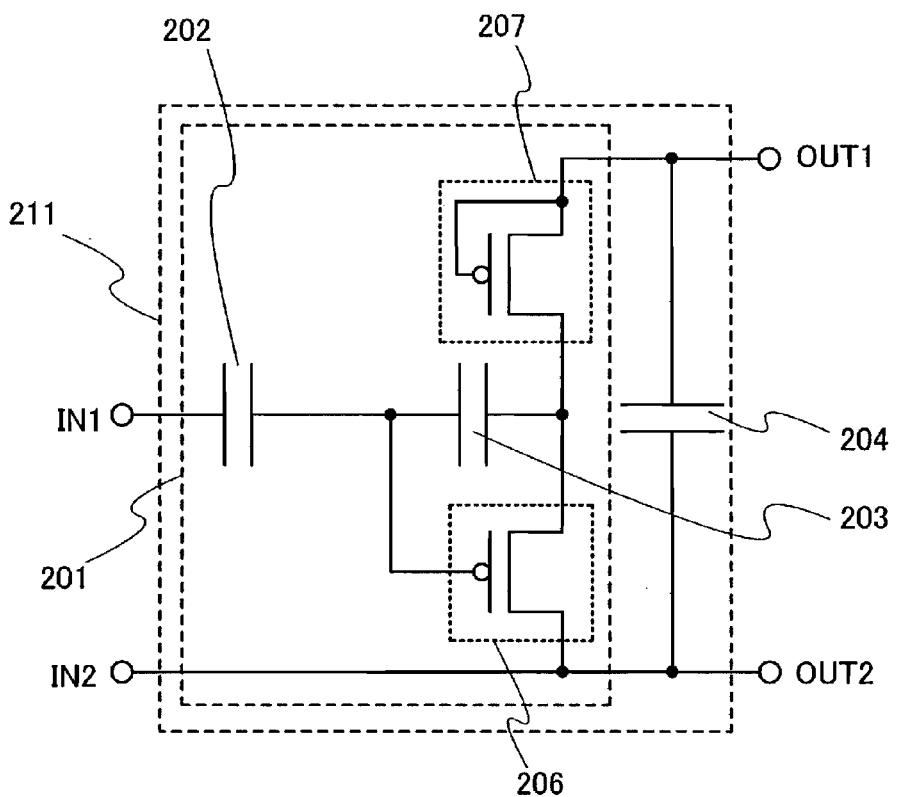

A structure of a rectifier circuit and a power supply circuit of the present invention will be described with reference to FIGS. 4A and 4B. In FIG. 4A, reference numeral 201 corresponds to a rectifier circuit of the present invention. The rectifier circuit 201 is connected to two input terminals IN1 and IN2 and two output terminals OUT1 and OUT2. Two terminals of an antenna are each connected to the input terminal IN1 or IN2. In addition, the rectifier circuit 201 has at least a first capacitor 202, a second capacitor 203, a diode 205, and a transistor 206. Note that FIG. 4A illustrates a structure of the rectifier circuit 201 in the case where the transistor 206 is a p-channel type. In addition, a power supply circuit 211 of the present invention has a third capacitor 204, in addition to the rectifier circuit 201.

The first capacitor 202, the second capacitor 203, and the diode 205 are sequentially connected in series in a path which connects the input terminal IN1 and the output terminal OUT1. With description in more detail, a first electrode of the first capacitor 202 is connected to the input terminal IN1. In addition, a second electrode of the first capacitor 202 is connected to a first electrode of the second capacitor 203. A second electrode of the second capacitor 203 is connected to an anode of the diode 205. A cathode of the diode 205 is connected to the output terminal OUT1.

The first capacitor 202 is connected between the input terminal IN1 and a gate electrode of the transistor 206. Further, the second capacitor 203 is connected between one of a source region and a drain region and a gate electrode of the transistor 206.

One of the source region and the drain region of the transistor 206 is connected to the input terminal IN2 and the output terminal OUT2, and the other is connected to the anode of the diode 205. The third capacitor 204 is connected between the output terminal OUT1 and the output terminal OUT2.

Note that a resistor or a diode may be connected between the second electrode of the first capacitor 202 and the output terminal OUT2.

In addition, a transistor may be used as the diode 205. In this case, the diode 205 can also be formed using the same manufacturing process as the transistor 206. A structure in the case where a p-channel transistor 207 is used as the diode 205 in the rectifier circuit 201 and the power supply circuit 211 of FIG. 4A is illustrated in FIG. 4B. In FIG. 4B, a gate electrode of the transistor 207 is connected to the output terminal OUT1. In addition, one of a source region and a drain region of the transistor 207 is connected to the second electrode of the second capacitor 203, and the other is connected to the gate electrode and the output terminal OUT1. When the p-channel transistor 207 is regarded as the diode, one of the source region and the drain region, which is connected to the gate electrode, functions as a cathode, along with the gate electrode, and the other functions as an anode.

Note that the transistor 207 may be an n-channel type. In this case, the gate electrode of the transistor 207 is connected to the second electrode of the second capacitor 203. In addition, one of the source region and the drain region of the transistor 207 is connected to the second electrode of the second capacitor 203, along with the gate electrode, and the other is connected to the output terminal OUT1. When the n-channel transistor 207 is regarded as the diode, one of the source region and the drain region, which is connected to the gate electrode, functions as an anode, along with the gate electrode, and the other functions as a cathode.

Figure 5A:
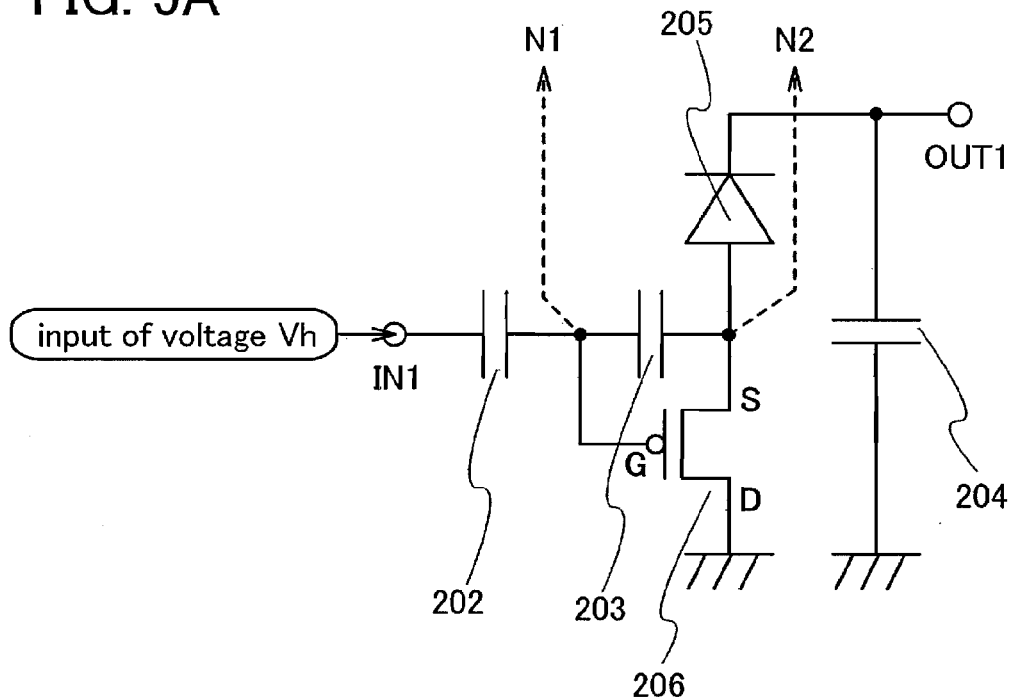
FIGS. 5A and 5B are diagrams each illustrating an operation of a rectifier circuit and a power supply circuit of the present invention.

Next, operations of the rectifier circuit 201 and the power supply circuit 211 illustrated in FIG. 4A will be described with reference to FIG. 5A. As illustrated in FIG. 5A, it is assumed that a voltage Vh higher than a ground (GND) is applied to the input terminal IN1. At this time, the input terminal IN2 is supposed to be connected to the ground (GND). When the voltage Vh is applied to the input terminal IN1, the voltage Vh is applied to the second electrode of the first capacitor 202, the first electrode of the second capacitor 203, and the gate electrode of the transistor 206. Hereinafter, the voltages of the second electrode of the first capacitor 202, the first electrode of the second capacitor 203, and the gate electrode of the transistor 206 are each expressed as a voltage of a first node (N1). Note that the voltage actually decreases depending on the first capacitor 202, the second capacitor 203, gate capacitance of the transistor 206, parasitic resistance, and parasitic capacitance. Therefore, the voltage of the first node (N1) gets lower than the voltage Vh; however, there is no problem in explaining the operations even when the voltage of the first node (N1) is considered to be almost the same as the voltage Vh.

When the voltage of the first node (N1) is the voltage Vh, the voltage Vh is applied to the second electrode of the second capacitor 203 and the anode of the diode 205. Hereinafter, the voltages of the second electrode of the second capacitor 203 and the anode of the diode 205 are each expressed as a voltage of a second node (N2). Note that the voltage actually decreases depending on the second capacitor 203, capacitance between the gate electrode and the source region of the transistor 206, parasitic resistance, and parasitic capacitance. Therefore, the voltage of the second node (N2) gets much lower than the voltage Vh; however, there is no problem in explaining the operations even when the voltage of the second node (N2) is considered to be almost the same as the voltage Vh.

When the voltage of the second node (N2) is the voltage Vh, since the transistor 206 is a p-channel type, as to a pair of impurity regions included in the transistor 206, one impurity region connected to the second electrode of the second capacitor 203 and the anode of the diode 205 can be considered to be a source region (S), and the other impurity region connected to the output terminal OUT2 can be considered to be a drain region (D). When a gate voltage corresponding to a voltage between the gate electrode and the source region gets higher than a threshold voltage Vth of the transistor 206, the transistor 206 is turned off. Since a forward bias voltage is applied to the diode 205, the diode 205 is turned on. Thus, a voltage which is the voltage of the second node (N2) less a voltage Vd reduced in the diode 205; in this case, a voltage (Vh−Vd); is fed to the output terminal OUT1, and the voltage of the output terminal OUT1 is retained by the third capacitor 204.

Figure 5B:
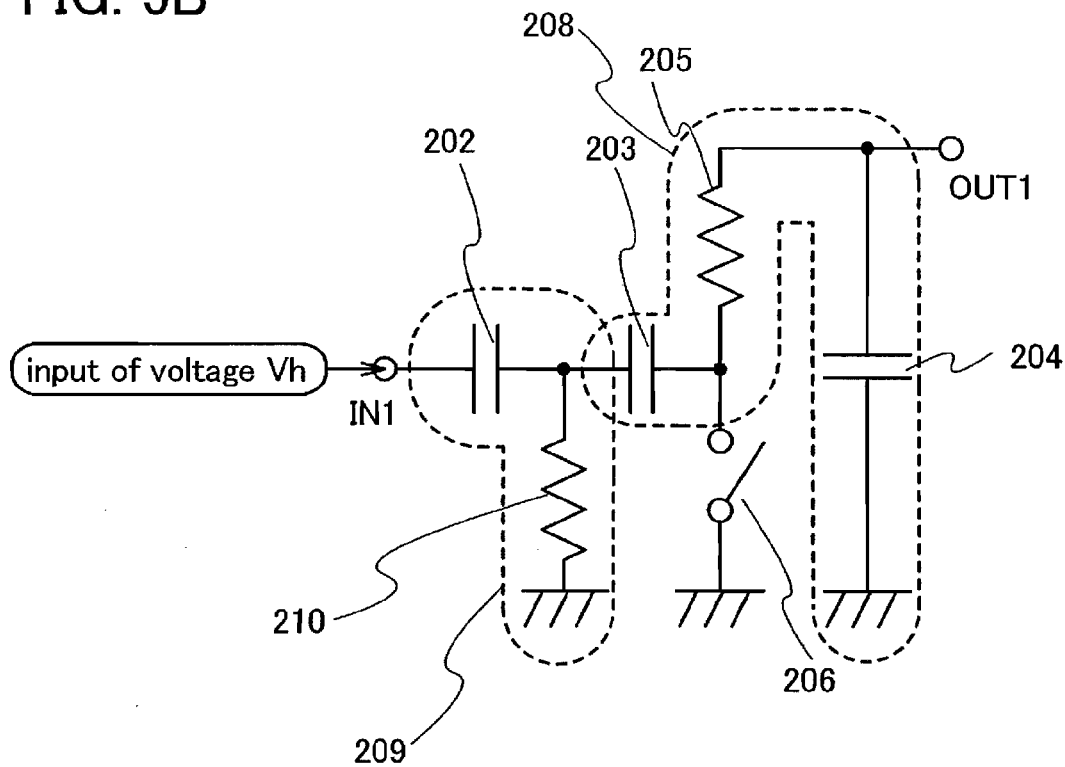

A structure of the power supply circuit 211 in the case where the diode 205 in an on state is considered to be a resistor is illustrated in FIG. 5B. Since the transistor 206 is off in FIG. 5A, the transistor 206 is illustrated as a switch which is opened in FIG. 5B. When the voltage Vh is applied to the input terminal IN1, the first capacitor 202, the second capacitor 203, and the diode 205 which is a resistor are connected in series.

The third capacitor 204 is connected between the output terminal OUT1 and the output terminal OUT2 which is connected to the ground (GND). Here, since the second capacitor 203, the diode 205 which is a resistor, and the third capacitor 204 collectively function as a low-pass filter 208, it is possible to prevent noise which has a high frequency wave from being directly included in a DC voltage outputted from the output terminal OUT1, even when the noise is included in an AC signal which is fed to the input terminal IN1.

Further, when a resistor 210 is connected between the second electrode of the first capacitor 202 and the input terminal IN2 in the power supply circuit 211 of the present invention, the first capacitor 202 and the resistor 210 collectively function as a high-pass filter 209. Therefore, it is possible to prevent noise which has a low frequency wave from being directly included in a DC voltage outputted from the output terminal OUT1, even when the noise is included in an AC signal which is fed to the input terminal IN1.

Thus, even when noise which has a high frequency wave or a low frequency wave is included in a radio wave generated from an interrogator, the noise is unlikely to be included in a DC voltage outputted from the rectifier circuit 201, and operations of various circuits which operates using the DC voltage are unlikely to be impeded by the noise.

In the low-pass filter 208, when a frequency of a voltage which passes through the filter is $F_L$, capacitance of the second capacitor 203 is C2, resistance of the diode 205 in the case of being considered to be a resistor is $R_r$, and capacitance of the third capacitor 204 is C3, $F_L$ satisfies the equation shown in the formula (1). Thus, values of the capacitance C2, the resistance $R_r$, and the capacitance C3 are desirably set in accordance with a frequency of noise which is desired to be cut. In addition, in the high-pass filter 209, when a frequency of a voltage which passes through the filter is $F_H$, capacitance of the first capacitor 202 is C1, and resistance of the resistor 210 is R, $F_H \geq 1/(2\pi \times C1 \times R)$ is satisfied. Thus, values of the capacitance C1 and the resistance R are desirably set in accordance with a frequency of noise which is desired to be cut.

Figure 6A:
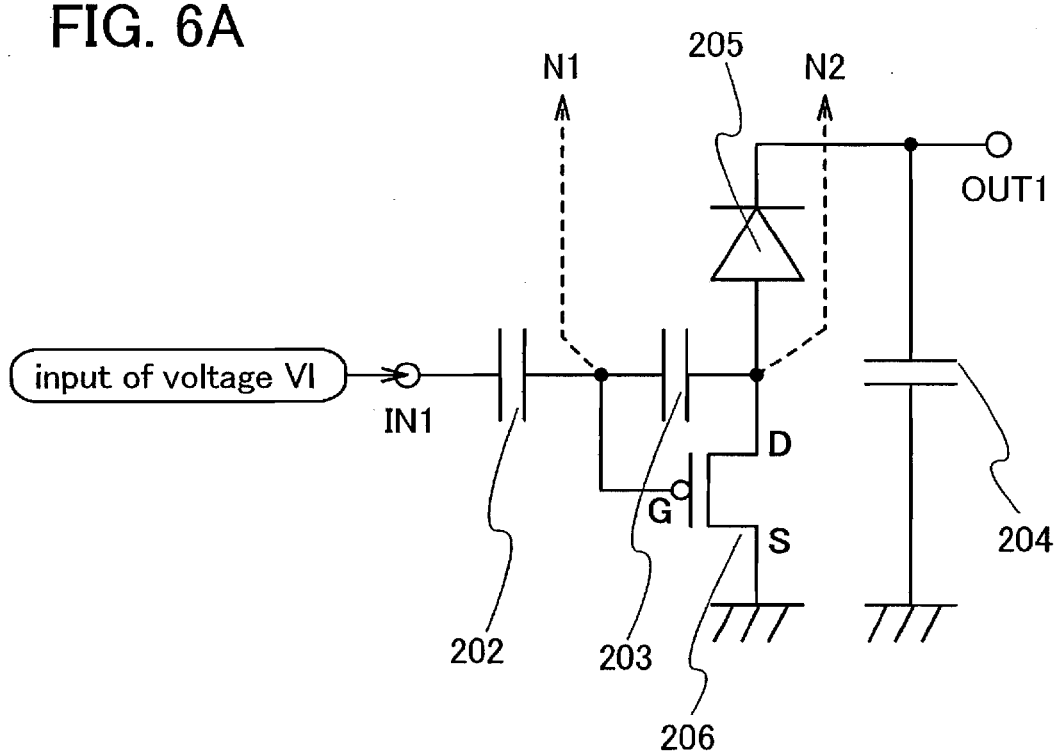
FIGS. 6A and 6B are diagrams each illustrating an operation of a rectifier circuit and a power supply circuit of the present invention.

Next, as illustrated in FIG. 6A, it is assumed that a voltage V1 (=−Vh) lower than the ground (GND) is applied to the input terminal IN1. At this time, the input terminal IN2 is supposed to be connected to the ground (GND). When the voltage V1 is applied to the input terminal IN1, the voltage of the first node (N1) is the voltage V1. Note that the voltage actually increases depending on the first capacitor 202, the second capacitor 203, gate capacitance of the transistor 206, parasitic resistance, and parasitic capacitance. Therefore, the voltage of the first node (N1) gets higher than the voltage V1; however, there is no problem in explaining the operations even when the voltage of the first node (N1) is considered to be almost the same as the voltage V1.

When the voltage of the first node (N1) is the voltage V1, the voltage of the second node (N2) is also the voltage V1. Note that the voltage actually increases depending on the second capacitor 203, capacitance between the gate electrode and the source region of the transistor 206, parasitic resistance, and parasitic capacitance. Therefore, the voltage of the second node (N2) gets much higher than the voltage V1; however, there is no problem in explaining the operations even when the voltage of the second node (N2) is considered to be almost the same as the voltage V1.

When the voltage of the second node (N2) is the voltage V1, since the transistor 206 is a p-channel type, as to a pair of impurity regions included in the transistor 206, one impurity region connected to the second electrode of the second capacitor 203 and the anode of the diode 205 can be considered to be a drain region (D), and the other impurity region connected to the output terminal OUT2 can be considered to be a source region (S). When a gate voltage corresponding to a voltage between the gate electrode and the source region gets lower than the threshold voltage Vth of the transistor 206, the transistor 206 is turned on. On the other hand, since a reverse bias voltage is applied to the diode 205, the diode 205 is turned off. Thus, the voltage of the second node (N2) gradually reaches the voltage of the ground (GND). The voltage of the output terminal OUT1 is retained by the third capacitor 204.

Figure 6B:
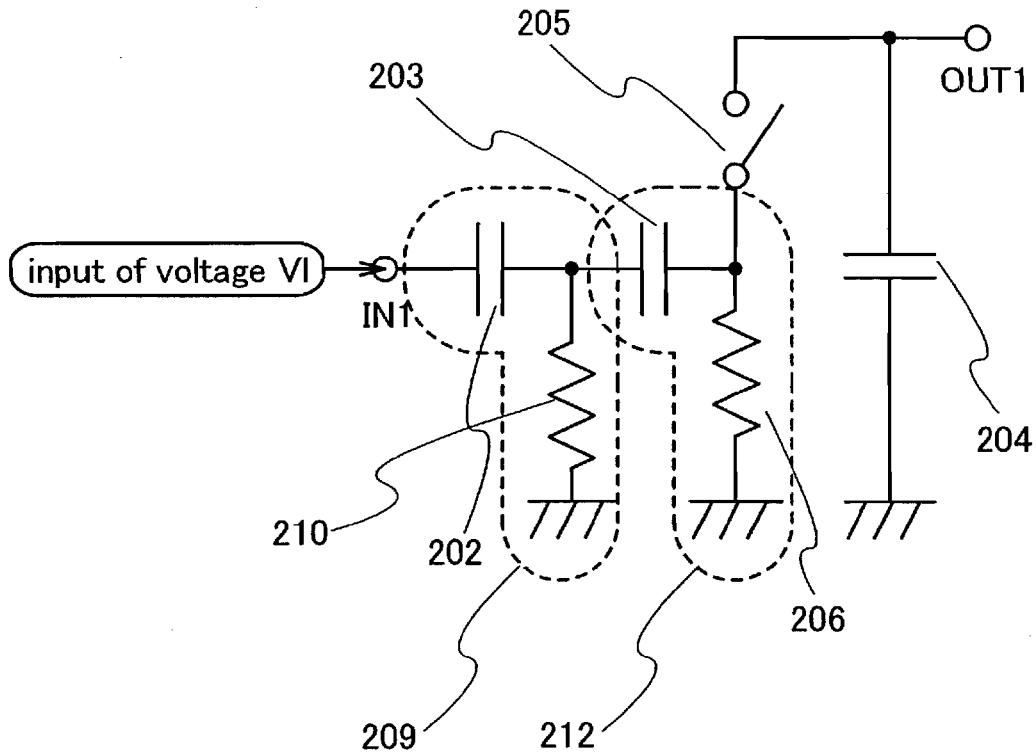

A structure of the power supply circuit 211 in the case where the diode 205 in an off state is considered to be a switch which is opened is illustrated in FIG. 6B. Since the transistor 206 is on in FIG. 6A, the transistor 206 is illustrated as a resistor in FIG. 6B. As illustrated in FIG. 6B, the first capacitor 202 and the resistor 210 collectively function as the high-pass filter 209 in the case where the voltage V1 is applied to the input terminal IN1, similarly to the case illustrated in FIG. 5B. Further, the second capacitor 203 and a resistor formed of the transistor 206 collectively function as a high-pass filter 212. Thus, two stages of the high-pass filters are connected in series in its structure; therefore, noise which has a low frequency wave is more unlikely to be included in a DC voltage outputted from the output terminal OUT1.

Note that the kind and the number of semiconductor elements used for the rectifier circuit 201 and the power supply circuit 211 are not limited to those in the structure shown in this embodiment mode. In order to obtain more ideal rectifying characteristics, a resistor, a capacitor, a diode, an inductor, a switch, or the like may be added as appropriate, in addition to the semiconductor elements illustrated in FIG. 4A.

As thus described, in the rectifier circuit of this embodiment mode, the first capacitor 202 and the second capacitor 203 are connected in series at the preceding stage of the diode 205 or the transistor 206. Therefore, even when an AC signal the voltage of which has large amplitude is fed to the input terminal IN1, the voltage applied to the diode 205 or the transistor 206 can be reduced, or the voltage is not directly applied to the diode 205 or the transistor 206. Therefore, deterioration or breakdown of the diode 205 or the transistor 206 due to excessive voltage can be suppressed.

In addition, even when noise which has a high frequency wave or a low frequency wave is included in a radio wave generated from the interrogator in this embodiment mode, the noise is unlikely to be included in a DC voltage outputted from the power supply circuit 211. Consequently, operations of various circuits which operate using the DC voltage in a semiconductor device are unlikely to be affected by the noise. Thus, the operations of the semiconductor device can be stabilized.

Embodiment Mode 3

In each of Embodiment Modes 1 and 2, the structure of the rectifier circuit and the power supply circuit which can obtain a positive DC voltage from the output terminal OUT1 is described. In this embodiment mode, a structure of a rectifier circuit and a power supply circuit of the present invention which can obtain a negative DC voltage will be described.

Figure 7A:
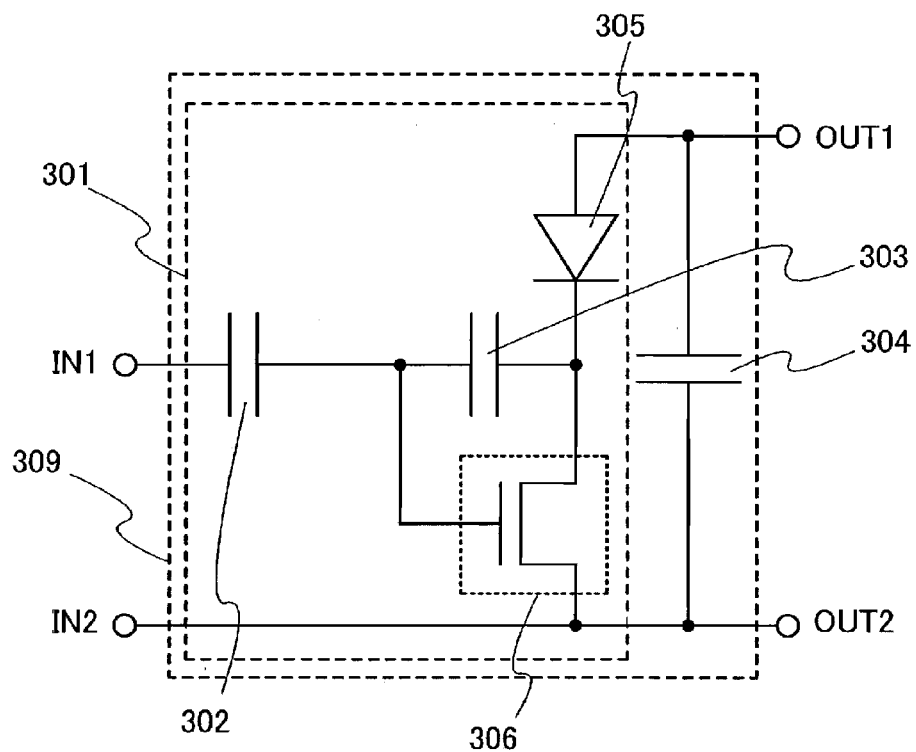
FIGS. 7A and 7B are circuit diagrams each illustrating a structure of a rectifier circuit and a power supply circuit of the present invention.

A structure of a rectifier circuit and a power supply circuit of this embodiment mode is illustrated in FIG. 7A. A rectifier circuit 301 illustrated in FIG. 7A is connected to two input terminals IN1 and IN2 and two output terminals OUT1 and OUT2. Two terminals of an antenna are each connected to the input terminal IN1 or IN2. In addition, the rectifier circuit 301 has at least a first capacitor 302, a second capacitor 303, a diode 305, and a transistor 306. Note that FIG. 7A illustrates a structure of the rectifier circuit 301 in the case where the transistor 306 is an n-channel type. In addition, a power supply circuit 309 of the present invention has a third capacitor 304, in addition to the rectifier circuit 301.

The first capacitor 302, the second capacitor 303, and the diode 305 are sequentially connected in series in a path which connects the input terminal IN1 and the output terminal OUT1. With description in more detail, a first electrode of the first capacitor 302 is connected to the input terminal IN1. In addition, a second electrode of the first capacitor 302 is connected to a first electrode of the second capacitor 303. A second electrode of the second capacitor 303 is connected to a cathode of the diode 305. An anode of the diode 305 is connected to the output terminal OUT1.

The first capacitor 302 is connected between the input terminal IN1 and a gate electrode of the transistor 306. Further, the second capacitor 303 is connected between one of a source region and a drain region and a gate electrode of the transistor 306. One of the source region and the drain region of the transistor 306 is connected to the input terminal IN2 and the output terminal OUT2, and the other is connected to the cathode of the diode 305. The third capacitor 304 is connected between the output terminal OUT1 and the output terminal OUT2.

Note that a resistor or a diode may be connected between the second electrode of the first capacitor 302 and the output terminal OUT2.

In addition, a transistor may be used as the diode 305. In this case, the diode 305 can also be formed using the same manufacturing process as for the transistor 306. In the case where an n-channel transistor is used as the diode 305, a gate electrode of the transistor is connected to the output terminal OUT1. In addition, one of a source region and a drain region of the transistor used as the diode 305 is connected to the second electrode of the second capacitor 303, and the other is connected to the gate electrode and the output terminal OUT1. When the n-channel transistor is regarded as the diode, one of the source region and the drain region, which is connected to the gate electrode, functions as an anode, along with the gate electrode, and the other functions as a cathode. In the case where a p-channel transistor is used as the diode 305, a gate electrode of the transistor is connected to the second electrode of the second capacitor 303. In addition, one of a source region and a drain region of the transistor used as the diode 305 is connected to the output terminal OUT1, and the other is connected to the gate electrode and the second electrode of the second capacitor 303. When the p-channel transistor is regarded as the diode, one of the source region and the drain region, which is connected to the gate electrode, functions as a cathode, along with the gate electrode, and the other functions as an anode.

According to the above structure, a negative DC voltage is outputted from the output terminal OUT1 when an AC signal is inputted into the input terminal IN1.

Note that the kind and the number of semiconductor elements used for the rectifier circuit 301 and the power supply circuit 309 are not limited to those in the structure shown in this embodiment mode. In order to obtain more ideal rectifying characteristics, a resistor, a capacitor, a diode, an inductor, a switch, or the like may be added as appropriate, in addition to the semiconductor elements illustrated in FIG. 7A.

In the rectifier circuit illustrated in FIG. 7A, the first capacitor 302 and the second capacitor 303 are connected in series at the preceding stage of the diode 305 or the transistor 306. Therefore, even when an AC signal the voltage of which has large amplitude is fed to the input terminal IN1, the voltage applied to the diode 305 or the transistor 306 can be reduced, or the voltage is not directly applied to the diode 305 or the transistor 306. Therefore, deterioration or breakdown of the diode 305 or the transistor 306 due to excessive voltage can be suppressed.

In addition, even when noise which has a high frequency wave or a low frequency wave is included in a radio wave generated from an interrogator, in the power supply circuit 309 illustrated in FIG. 7A, which is similar to the case of the rectifier circuit illustrated in FIG. 1A, the noise is unlikely to be included in a DC voltage outputted from the power supply circuit 309. Consequently, operations of various circuits which operate using the DC voltage in a semiconductor device are unlikely to be affected by the noise. Thus, the operations of the semiconductor device can be stabilized.

Next, another structure of a rectifier circuit and a power supply circuit of the present invention which can obtain a negative DC voltage will be described.

Figure 7B:
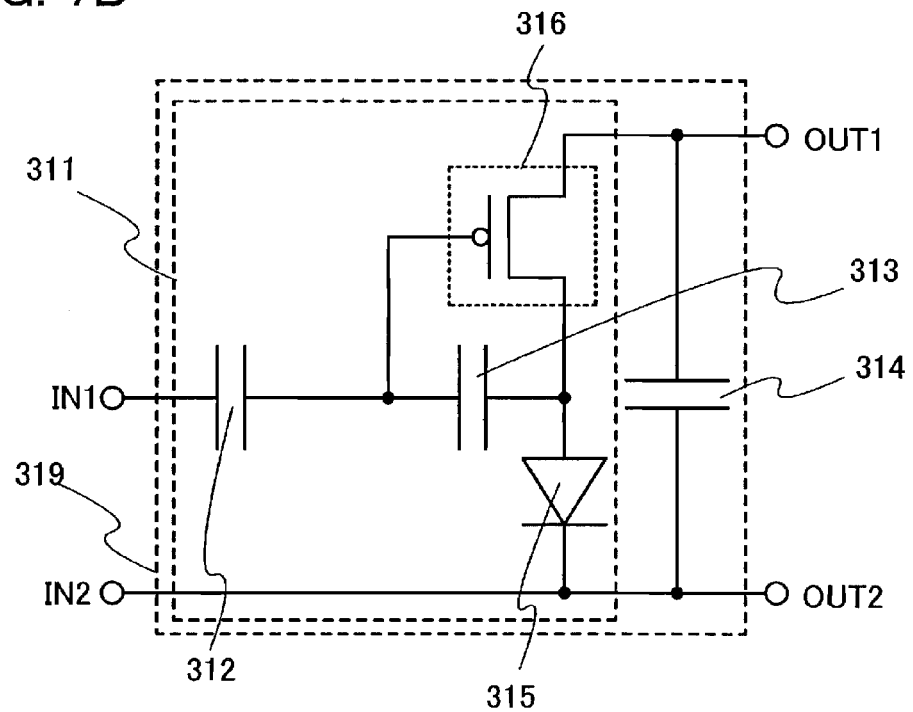

A structure of a rectifier circuit and a power supply circuit of this embodiment mode is illustrated in FIG. 7B. A rectifier circuit 311 illustrated in FIG. 7B is connected to two input terminals IN1 and IN2 and two output terminals OUT1 and OUT2. Two terminals of an antenna are each connected to the input terminal IN1 or IN2. In addition, the rectifier circuit 311 has at least a first capacitor 312, a second capacitor 313, a diode 315, and a transistor 316. Note that FIG. 7B illustrates a structure of the rectifier circuit 311 in the case where the transistor 316 is a p-channel type. In addition, a power supply circuit 319 of the present invention has a third capacitor 314, in addition to the rectifier circuit 311.

The first capacitor 312, the second capacitor 313, and the diode 315 are sequentially connected in series in a path which connects the input terminal N1 and the output terminal OUT2. With description in more detail, a first electrode of the first capacitor 312 is connected to the input terminal IN1. In addition, a second electrode of the first capacitor 312 is connected to a first electrode of the second capacitor 313. A second electrode of the second capacitor 313 is connected to an anode of the diode 315. A cathode of the diode 315 is connected to the output terminal OUT2.

The first capacitor 312 is connected between the input terminal IN1 and a gate electrode of the transistor 316. Further, the second capacitor 313 is connected between one of a source region and a drain region and a gate electrode of the transistor 316. One of the source region and the drain region of the transistor 316 is connected to the output terminal OUT1, and the other is connected to the anode of the diode 315. The third capacitor 314 is connected between the output terminal OUT1 and the output terminal OUT2.

Note that a resistor or a diode may be connected between the second electrode of the first capacitor 312 and the output terminal OUT2.

In addition, a transistor may be used as the diode 315. In this case, the diode 315 can also be formed using the same manufacturing process as the transistor 316. In the case where a p-channel transistor is used as the diode 315, a gate electrode of the transistor is connected to the input terminal IN2 and the output terminal OUT2. In addition, one of a source region and a drain region of the transistor used as the diode 315 is connected to the second electrode of the second capacitor 313, and the other is connected to the input terminal IN2 and the output terminal OUT2, along with the gate electrode. When the p-channel transistor is regarded as the diode, one of the source region and the drain region, which is connected to the gate electrode, functions as a cathode, along with the gate electrode, and the other functions as an anode. In the case where an n-channel transistor is used as the diode 315, a gate electrode of the transistor is connected to the output terminal OUT2. In addition, one of a source region and a drain region of the transistor used as the diode 315 is connected to the second electrode of the second capacitor 313, and the other is connected to the gate electrode and the output terminal OUT2. When the n-channel transistor is regarded as the diode, one of the source region and the drain region, which is connected to the gate electrode, functions as an anode, along with the gate electrode, and the other functions as a cathode.

According to the above structure, a negative DC voltage is outputted from the output terminal OUT1 when an AC signal is inputted into the input terminal IN1.

Note that the kind and the number of semiconductor elements used for the rectifier circuit 311 and the power supply circuit 319 are not limited to those in the structure shown in this embodiment mode. In order to obtain more ideal rectifying characteristics, a resistor, a capacitor, a diode, an inductor, a switch, or the like may be added as appropriate, in addition to the semiconductor elements illustrated in FIG. 7B.

In the rectifier circuit illustrated in FIG. 7B, the first capacitor 312 and the second capacitor 313 are connected in series at the preceding stage of the diode 315 or the transistor 316. Therefore, even when an AC signal the voltage of which has large amplitude is fed to the input terminal IN1, the voltage applied to the diode 315 or the transistor 316 can be reduced. In addition, the voltage is not directly applied to the diode 315 or the transistor 316. Therefore, deterioration or breakdown of the diode 315 or the transistor 316 due to excessive voltage can be suppressed.

In addition, even when noise which has a high frequency wave or a low frequency wave is included in a radio wave generated from an interrogator, in the power supply circuit 319 illustrated in FIG. 7B, which is similar to the case of the rectifier circuit illustrated in FIG. 4A, the noise is unlikely to be included in a DC voltage outputted from the power supply circuit 311. Consequently, operations of various circuits which operate using the DC voltage in a semiconductor device are unlikely to be affected by the noise. Thus, the operations of the semiconductor device can be stabilized.

Embodiment 1

Figure 8:
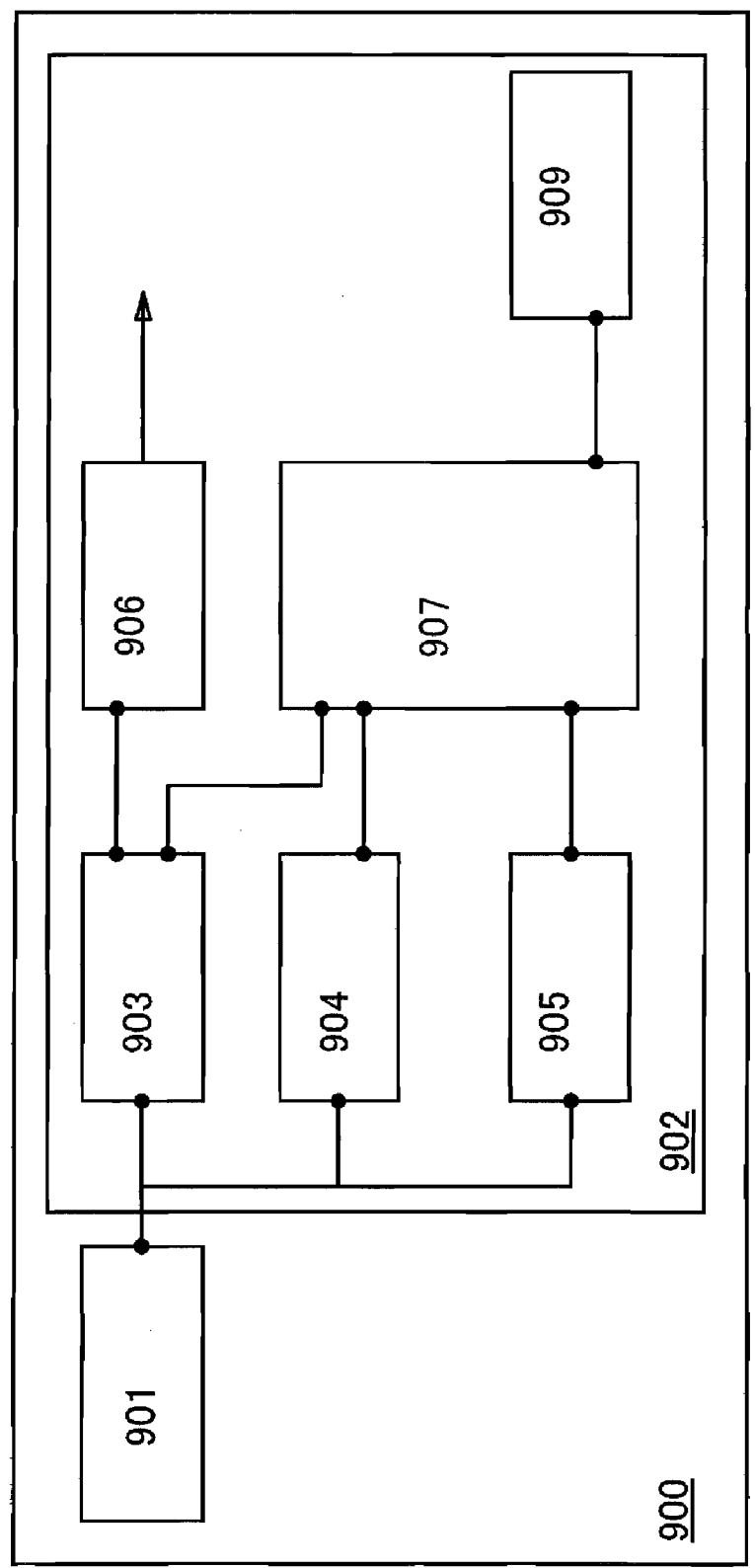
FIG. 8 is a block diagram illustrating a structure of a semiconductor device of the present invention.

A structure of a semiconductor device of the present invention will be described with reference to FIG. 8. FIG. 8 is a block diagram illustrating one mode of the semiconductor device of the present invention. In FIG. 8, a semiconductor device 900 has an antenna 901 and an integrated circuit 902. The integrated circuit 902 has a power supply circuit 903, a demodulation circuit 904, a modulation circuit 905, a regulator 906, a control circuit 907, and a memory 909. The rectifier circuit of the present invention can be used in the power supply circuit 903 and the demodulation circuit 904.

When a radio wave is transmitted from an interrogator, the radio wave is converted into an AC voltage in the antenna 901. In the power supply circuit 903, the AC voltage from the antenna 901 is rectified to generate a voltage for a power supply. In the power supply circuit 903 of the present invention, even when an AC signal received by the antenna 901 has a voltage with amplitude large enough to exceed a predetermined range, a voltage for a power supply can be generated while preventing deterioration or breakdown of a semiconductor element in the power supply circuit 903. In addition, even when noise is included in the AC signal received by the antenna 901, the noise can be prevented from being included in a DC voltage to be outputted. Thus, operations of the regulator 906 and the control circuit 907, which are circuits of a next stage of the power supply circuit 903, can be prevented from being adversely affected by the noise.

The voltage for a power supply, which is generated in the power supply circuit 903, is fed to the control circuit 907 and the regulator 906. After stabilizing the voltage for a power supply from the power supply circuit 903 or after adjusting the level thereof, the regulator 906 supplies the voltage to various circuits such as the demodulation circuit 904, the modulation circuit 905, the control circuit 907, and the memory 909 in the integrated circuit 902.

The demodulation circuit 904 demodulates the AC signal received by the antenna 901 to output the signal to the control circuit 907 of a next stage. The control circuit 907 performs arithmetic processing in accordance with the signal inputted from the demodulation circuit 904 and generates another signal. When the arithmetic processing is performed, the memory 909 can be used as a primary cache memory or a secondary cache memory. Further, the control circuit 907 analyses the signal inputted from the demodulation circuit 904, and information in the memory 909 is outputted or the content of an instruction in the memory 909 is stored in accordance with the content of an instruction transmitted from the interrogator. The signal outputted from the control circuit 907 is encoded and transmitted to the modulation circuit 905. The modulation circuit 905 modulates the radio wave received by the antenna 901 in accordance with the signal. The radio wave modulated in the antenna 901 is received by the interrogator. Then, information outputted from the semiconductor device 900 can be obtained.

Thus, communication between the semiconductor device 900 and the interrogator can be performed by modulating a radio wave used as a carrier (carrier wave). As the carrier, there are radio waves with frequencies of 125 kHz, 13.56 MHz, 950 MHz, 2.45 GHz, and the like, which are various depending on the standard. A modulation method includes various methods such as amplitude modulation, frequency modulation, and phase modulation, depending on the standard; however, any modulation may be employed as long as it is based on the standard.

A signal transmission method can be categorized into an electromagnetic coupling method, an electromagnetic induction method, a microwave method, and the like depending on the wavelength of a carrier. In the case of an electromagnetic coupling method or an electromagnetic induction method, there is a possibility that a semiconductor device is subjected to an intense radio wave and thus an excessively high AC voltage occurs in an antenna. Using the rectifier circuit of the present invention makes it possible to prevent deterioration or breakdown of a semiconductor element in an integrated circuit, which is particularly effective in the case of an electromagnetic coupling method or an electromagnetic induction method.

The memory 909 may be either a nonvolatile memory or a volatile memory. As the memory 909, for example, an SRAM, a DRAM, a flash memory, an EEPROM, an FeRAM, or the like can be used.

In this embodiment, a structure of the semiconductor device 900 including the antenna 901 is described; however, the semiconductor device of the present invention does not necessarily include an antenna. In addition, the semiconductor device illustrated in FIG. 8 may be provided with an oscillation circuit or a secondary battery.

In FIG. 8, a structure of the semiconductor device including only one antenna is described; however, the present invention is not limited to this structure. A semiconductor device may include two antennas, that is, an antenna for receiving power and an antenna for receiving a signal. If a semiconductor device includes one antenna, in the case where both supply of power and transmission of a signal are performed with a radio wave of 950 MHz for example, there is a possibility that a large amount of power is transmitted to a distance and thus reception of other wireless devices is impeded. Therefore, it is desirable that power be supplied in a short distance with a radio wave which has reduced frequency; however, a communication distance is inevitably short in this case. On the other hand, if a semiconductor device includes two antennas, frequency of a radio wave for supplying power and frequency of a radio wave for transmitting a signal can be separately used. For example, in the case of transmitting power, a radio wave with a frequency of 13.56 MHz and a magnetic field are used, and in the case of transmitting a signal, a radio wave with a frequency of 950 MHz and an electric field are used. By thus separately using antennas depending on functions, power can be supplied for communication only in a short distance and a signal can be transmitted even in a long distance.

This embodiment can be implemented in combination with any of Embodiment Modes 1 to 3 as appropriate.

Embodiment 2

Next, an exterior view of the semiconductor device of the present invention will be described.

Figure 9A:
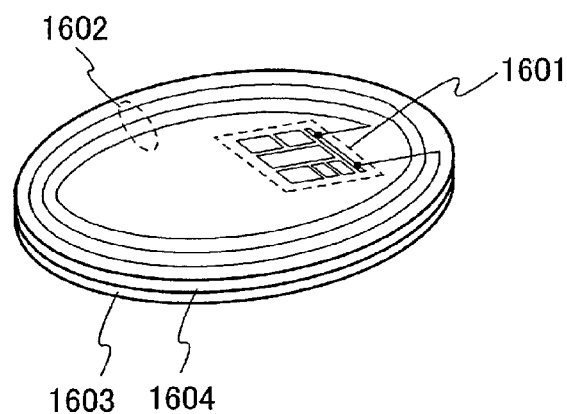
FIGS. 9A and 9B are views each illustrating an exterior appearance of a semiconductor device of the present invention.

FIG. 9A is a perspective view illustrating one mode of the semiconductor device of the present invention, which is formed into a chip. Reference numerals 1601 and 1602 denote an integrated circuit and an antenna, respectively. The antenna 1602 is connected to the integrated circuit 1601. Reference numerals 1603 and 1604 denote a substrate and a cover material, respectively. The rectifier circuit and the power supply circuit of the present invention are included in the integrated circuit 1601. The integrated circuit 1601 is formed over the substrate 1603, and the cover material 1604 overlaps the substrate 1603 so as to cover the integrated circuit 1601 and the antenna 1602. Note that the antenna 1602 may be formed over the substrate 1603 or formed separately to be attached to the substrate 1603 after the integrated circuit 1601 is formed.

Figure 9B:
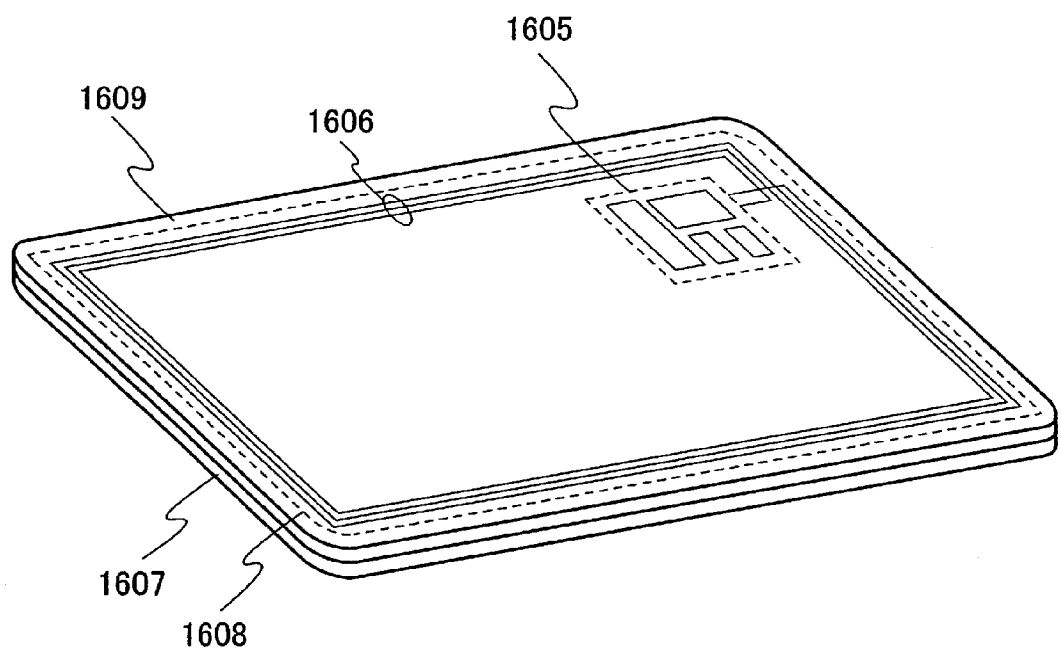

FIG. 9B is a perspective view illustrating one mode of the semiconductor device of the present invention, which is formed into a card. Reference numerals 1605 and 1606 denote an integrated circuit and an antenna, respectively, and the antenna 1606 is connected to the integrated circuit 1605. Reference numeral 1608 denotes a substrate functioning as an inlay sheet, and reference numerals 1607 and 1609 denote cover materials. The integrated circuit 1605 and the antenna 1606 are formed over the substrate 1608, and the substrate 1608 is interposed between the cover materials 1607 and 1609.

Note that FIGS. 9A and 9B illustrate cases where the antenna 1602 and the antenna 1606 have coil shapes; however, the shape of the antenna used in the present invention is not limited to this. When communication is performed using an electric field instead of a magnetic field, a dipole antenna may be used as the antenna 1602 and the antenna 1606.

The rectifier circuit and the power supply circuit of the present invention can be formed through a normal MOS process.

This embodiment can be implemented in combination with any of Embodiment Modes 1 to 3 and Embodiment 1 as appropriate.

Embodiment 3

Subsequently, a method for manufacturing the semiconductor device of the present invention will be specifically described. Note that a thin film transistor (TFT) is shown as an example of a semiconductor element in this embodiment; however, the semiconductor element used in the semiconductor device of the present invention is not limited to this. For example, a memory element, a diode, a resistor, a capacitor, an inductor, or the like can be used instead of a TFT.

First, as illustrated in FIG. 10A, an insulating film 701, a peeling layer 702, an insulating film 703 functioning as a base film, and a semiconductor film 704 are sequentially formed over a substrate 700 which has heat resistance. The insulating film 701, the peeling layer 702, the insulating film 703, and the semiconductor film 704 can be successively formed.

As the substrate 700, a glass substrate such as barium borosilicate glass or aluminoborosilicate glass, a quartz substrate, a ceramic substrate, or the like can be used. Alternatively, a metal substrate including a stainless steel substrate or a semiconductor substrate such as a silicon substrate may be used. A substrate formed of a synthetic resin which has flexibility, such as plastic, generally tends to have lower allowable temperature limit than the above substrates; however, the substrate can be used as long as it can resist a processing temperature in a manufacturing process.

As a plastic substrate, polyester typified by polyethylene terephthalate (PET); polyether sulfone (PES); polyethylene naphthalate (PEN); polycarbonate (PC); nylon; polyether etherketone (PEEK); polysulfone (PSF); polyether imide (PEI); polyarylate (PAR); polybutylene terephthalate (PBT); polyimide; an acrylonitrile butadiene styrene resin; polyvinyl chloride; polypropylene; polyvinyl acetate; an acrylic resin; or the like can be used.

Note that the peeling layer 702 is provided over an entire surface of the substrate 700 in this embodiment; however, the present invention is not limited to this structure. For example, the peeling layer 702 may be partially formed over the substrate 700 by a photolithography method or the like.

The insulating film 701 and the insulating film 703 are formed using an insulating material such as silicon oxide, silicon nitride ($SiN_x$, $Si_3N_4$, or the like), silicon oxynitride ($SiO_xN_y$) (x>y>0), or silicon nitride oxide ($SiN_xO_y$) (x>y>0) by a CVD method, a sputtering method, or the like.

The insulating film 701 and the insulating film 703 are provided to prevent an alkali metal such as Na or an alkaline earth metal contained in the substrate 700 from diffusing into the semiconductor film 704 and having an adverse effect on a characteristic of a semiconductor element such as a TFT. In addition, the insulating film 703 prevents an impurity element contained in the peeling layer 702 from diffusing into the semiconductor film 704 and has a role of protecting the semiconductor element in a subsequent step of peeling the semiconductor element.

Each of the insulating film 701 and the insulating film 703 may be a single insulating film or a stacked layer of a plurality of insulating films. In this embodiment, a silicon oxynitride film with a thickness of 100 nm which contains a larger amount of nitrogen than oxygen, a silicon nitride oxide film with a thickness of 50 nm which contains a larger amount of oxygen than nitrogen, and a silicon oxynitride film with a thickness of 100 nm which contains a larger amount of nitrogen than oxygen are sequentially stacked to form the insulating film 703. However, materials, thickness, and the number of stacked layers of each film are not limited thereto. For example, instead of the silicon oxynitride film which is a lower layer, a siloxane-based resin with a thickness of 0.5 to 3 μm may be formed by a spin coating method, a slit coating method, a droplet discharging method, a printing method, or the like. Instead of the silicon nitride oxide film, which is a middle layer, a silicon nitride film ($SiN_x$, $Si_3N_4$, or the like) may be used. Instead of the silicon oxynitride film which is an upper layer, a silicon oxide film may be used. It is desirable that a thickness of each film be 0.05 to 3 μm, and the thickness can be freely selected within this range.

Alternatively, the lower layer of the insulating film 703, which is closest to the peeling layer 702, may be formed of a silicon oxynitride film or a silicon oxide film, the middle layer may be formed of a siloxane-based resin, and the upper layer may be formed of a silicon oxide film.

Note that the siloxane-based resin corresponds to a resin including a Si—O—Si bond, which is formed using a siloxane-based material as a starting material. The siloxane-based resin may have at least one of fluorine, an alkyl group, and aromatic hydrocarbon besides hydrogen as a substituent.

The silicon oxide film can be formed using a mixed gas of silane and oxygen, TEOS (tetraethoxysilane) and oxygen, or the like by a method such as thermal CVD, plasma CVD, atmospheric pressure CVD, or bias ECRCVD. Further, the silicon nitride film can be formed typically using a mixed gas of silane and ammonia by plasma CVD. Furthermore, the silicon oxynitride film and the silicon nitride oxide film can be formed typically using a mixed gas of silane and dinitrogen monoxide by plasma CVD.

As the peeling layer 702, a metal film, a metal oxide film, or a film in which a metal film and a metal oxide film are stacked can be used. Each of a metal film and a metal oxide film may be a single layer or a stacked layer in which a plurality of layers are stacked. Alternatively, metal nitride or metal oxynitride may be used instead of a metal film or a metal oxide film. The peeling layer 702 can be formed by a sputtering method, various CVD methods such as a plasma CVD method, or the like.

As a metal used for the peeling layer 702, tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or the like can be used. Alternatively, for the peeling layer 702, a film formed of an alloy containing any of the above metals as its main component or a film formed of a compound containing any of the above metals may be used instead of a film formed of any of the above metals.

For the peeling layer 702, a film formed of silicon (Si) itself or a film formed of a compound containing silicon (Si) as a main component may be used. Alternatively, a film formed of silicon (Si) and an alloy containing any of the above metals may be used. A film containing silicon may be any of amorphous, microcrystalline, or polycrystalline.

As the peeling layer 702, the above film may be used as a single layer or the above plurality of films may be used as a stacked layer. In order to obtain the peeling layer 702 formed by stacking a metal film and a metal oxide film, a starting metal film is formed and then a surface thereof is oxidized or nitrided. Specifically, a starting metal film may be subjected to plasma treatment in an oxygen atmosphere or a dinitrogen monoxide atmosphere or may be subjected to heat treatment in an oxygen atmosphere or a dinitrogen monoxide atmosphere. Alternatively, by forming a silicon oxide film or a silicon oxynitride film so as to be in contact with a starting metal film, oxidation of the metal film may be performed, and by forming a silicon oxynitride film or a silicon nitride film so as to be in contact with a starting metal film, nitridation of the metal film may be performed.

As plasma treatment for oxidation or nitridation of a metal film, high-density plasma treatment by a high frequency wave such as a microwave (for example, a frequency of 2.45 GHz) with a plasma density of $1\times10^{11}$ cm$^{-3}$ or more, preferably, $1\times10^{11}$ to $9\times10^{15}$ cm$^{-3}$ may be performed.

Note that the peeling layer 702 in which a metal film and a metal oxide film are stacked may be formed by oxidizing a surface of a starting metal film; however, a metal oxide film may be separately formed after formation of a metal film.

In a case of using tungsten as a metal, for example, a tungsten film is formed as a starting metal film by a sputtering method, a CVD method, or the like and then the tungsten film is subjected to plasma treatment. Accordingly, the tungsten film corresponding to a metal film and a metal oxide film formed of an oxide of tungsten, which is in contact with the metal film, can be formed.

Note that an oxide of tungsten is expressed by $WO_x$, and x is 2 to 3. There are cases of x=2 ($WO_2$), x=2.5 ($W_2O_5$), x=2.75 ($W_4O_{11}$), and x=3 ($WO_3$). In a case of forming an oxide of tungsten, the value of x described above is not particularly limited and may be set based on an etching rate or the like.

It is desirable that, after forming the insulating film 703, the semiconductor film 704 be formed without being exposed to the air. The thickness of the semiconductor film 704 is 20 to 200 nm (desirably, 40 to 170 nm, preferably, 50 to 150 nm). Note that the semiconductor film 704 may be an amorphous semiconductor or a polycrystalline semiconductor. Not only silicon but also silicon germanium can be used for the semiconductor. In the case of using silicon germanium, it is preferable that a concentration of germanium be approximately 0.01 to 4.5 atomic %.

Note that the semiconductor film 704 may be crystallized by a known technique. As the known crystallization method, a laser crystallization method which uses laser light or a crystallization method which uses a catalytic element may be used. Alternatively, a crystallization method which uses a catalytic element and a laser crystallization method may be used in combination. In the case of using a substrate superior in heat resistance, such as a quartz substrate, as the substrate 700, a crystallization method in which at least two or more of a thermal crystallization method which uses an electrically-heated furnace, a lump anneal crystallization method which uses infrared light, a crystallization method which uses a catalytic element, and a crystallization method which uses high-temperature annealing at approximately 950° C. are combined may be used.

For example, in the case of using laser crystallization, heat treatment at 550° C. for four hours is performed on the semiconductor film 704 before laser crystallization in order to improve resistance of the semiconductor film 704 with respect to laser. By using a solid state laser capable of continuous oscillation and irradiating the semiconductor film 704 with laser light of a second to fourth harmonic thereof, large grain crystals can be obtained. Typically, a second harmonic (532 nm) or a third harmonic (355 nm) of an Nd:$YVO_4$ laser (fundamental wave is 1064 nm) is desirably used, for example. Specifically, laser light emitted from a continuous-wave $YVO_4$ laser is converted into a harmonic by using a non-linear optical element, whereby laser light, the output of which is 10 W, is obtained. Then, the laser light is preferably shaped into a rectangular or elliptical shape on an irradiation surface by an optical system, for the irradiation of the semiconductor film 704. The power density at this time needs to be approximately 0.01 to 100 $MW/cm^2$ (preferably, 0.1 to 10 $MW/cm^2$). In addition, the scan rate is set at approximately 10 to 2000 cm/sec.

As a continuous-oscillation gas laser, an Ar laser, a Kr laser, or the like can be used. Further, as a continuous-oscillation solid-state laser, a YAG laser, a $YVO_4$ laser, a YLF laser, a $YAlO_3$ laser, a forsterite ($Mg_2SiO_4$) laser, a $GdVO_4$ laser, a $Y_2O_3$ laser, a glass laser, a ruby laser, an alexandrite laser, a Ti:sapphire laser, or the like can be used.

As a pulsed-oscillation laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper-vapor laser, or a gold-vapor laser can be used.

The laser crystallization may be performed by pulsed-oscillation laser light at a repetition rate of greater than or equal to 10 MHz, which is a considerably higher frequency band than a usually used frequency band of several ten to several hundred Hz. It is said that the time the semiconductor film 704 is irradiated with pulsed-oscillation laser light and melted until the semiconductor film 704 is completely solidified is several tens to several hundreds of nsec. Therefore, by using the above frequency band, the semiconductor film 704 can be irradiated with laser light of the next pulse until the semiconductor film is solidified after being melted by laser light of the preceding pulse. Therefore, since a solid-liquid interface can be continuously moved in the semiconductor film 704, the semiconductor film 704 which has crystal grains that have grown continuously in a scanning direction is formed. Specifically, an aggregate of contained crystal grains which have widths of 10 to 30 μm in the scanning direction and widths of approximately 1 to 5 μm in the direction perpendicular to the scanning direction can be formed. By forming single crystal grains which grow continuously along the scanning direction, a semiconductor film 704 which has almost no crystal boundary at least in a channel direction of a TFT can be formed.

Note that the laser crystallization may be performed by irradiation with continuous wave laser light of a fundamental wave and continuous wave laser light of a harmonic in parallel or by irradiation with continuous wave laser light of a fundamental wave and pulsed-oscillation laser light of a harmonic in parallel.

Note that laser light irradiation may be performed in an inert gas atmosphere of rare gas, nitrogen, or the like. Accordingly, roughness of a semiconductor surface due to laser light irradiation can be prevented, and variation of a threshold voltage due to variation of an interface state density can be suppressed.

By irradiation with the above laser light, the semiconductor film 704 with higher crystallinity can be formed. Note that a polycrystalline semiconductor formed by a sputtering method, a plasma CVD method, a thermal CVD method, or the like may be used for the semiconductor film 704.

The semiconductor film 704 is crystallized in this embodiment; however, an amorphous silicon film or a microcrystalline semiconductor film may be directly subjected to a process described below without being crystallized. A TFT which uses an amorphous semiconductor or a microcrystalline semiconductor has advantages of lower cost and higher yield because it needs fewer manufacturing processes than a TFT which uses a polycrystalline semiconductor.

An amorphous semiconductor can be obtained by glow discharge decomposition of a gas containing silicon. As the gas containing silicon, $SiH_4$ and $Si_2H_6$ are given. The gas containing silicon diluted with hydrogen or hydrogen and helium may be used.

Next, channel doping, by which an impurity element which imparts p-type conductivity or an impurity element which imparts n-type conductivity is added at a low concentration, is performed on the semiconductor film 704. Channel doping may be performed on the entire semiconductor film 704 or may be selectively performed on part thereof. As the impurity element which imparts p-type conductivity, boron (B), aluminum (Al), gallium (Ga), or the like can be used. As the impurity element which imparts n-type conductivity, phosphorus (P), arsenic (As), or the like can be used. Here, boron (B) is used as the impurity element and is added at a concentration of $1\times10^{16}$ to $5\times10^{17}/cm^3$.

Next, as illustrated in FIG. 10B, the semiconductor film 704 is processed (patterned) to have a predetermined shape, so that island-shaped semiconductor films 705 and 706 are formed. Then, a gate insulating film 708 is formed so as to cover the island-shaped semiconductor films 705 and 706. The gate insulating film 708 can be formed as a single layer or stacked layer of a film containing silicon nitride, silicon oxide, silicon nitride oxide, or silicon oxynitride by a plasma CVD method, a sputtering method, or the like. In the case of the stacked layer, a three-layer structure is preferably employed for example, where a silicon oxide film, a silicon nitride film, and a silicon oxide film are sequentially stacked from the substrate 700 side.

The gate insulating film 708 may be formed by performing high-density plasma treatment to the island-shaped semiconductor films 705 and 706 to oxidize or nitride the surfaces thereof. The high-density plasma treatment is performed using a mixed gas of a rare gas such as He, Ar, Kr, or Xe and oxygen, nitrogen oxide, ammonia, nitrogen, hydrogen, or the like. When excitation of the plasma in this case is performed by introduction of a microwave, high density plasma can be generated at a low electron temperature. By oxidizing or nitriding the surfaces of the semiconductor films by an oxygen radical (there is the case where an OH radical is included) or a nitrogen radical (there is the case where an NH radical is included) generated by such high density plasma, an insulating film with a thickness of 1 to 20 nm, typically 5 to 10 nm is formed so as to be in contact with the semiconductor films. The insulating film with a thickness of 5 to 10 nm is used as the gate insulating film 708.

Oxidation or nitridation of the semiconductor films by the above high-density plasma treatment proceeds under a solid-phase reaction; therefore, interface state density between the gate insulating film and the semiconductor films can be extremely reduced. Further, since the semiconductor films are directly oxidized or nitrided by the high-density plasma treatment, variation in thickness of the insulating film to be formed can be suppressed. In the case where the semiconductor films have crystallinity, by oxidizing surfaces of the semiconductor films under a solid-phase reaction by the high-density plasma treatment, rapid oxidation can be prevented only in a crystal grain boundary; thus, a gate insulating film with good uniformity and low interface state density can be formed. When a transistor in which a gate insulating film partially or entirely includes the insulating film formed by high-density plasma treatment is used, variations in characteristics thereof can be suppressed.

Next, as illustrated in FIG. 10C, a conductive film is formed over the gate insulating film 708 and then the conductive film is processed (patterned) to have a predetermined shape, so that an electrode 709 is formed above the island-shaped semiconductor films 705 and 706. In this embodiment, stacked two conductive films are patterned to form the electrode 709. The conductive film can be formed of tantalum (Ta), tungsten (W), titanium (Ti), molybdenum (Mo), aluminum (Al), copper (Cu), chromium (Cr), niobium (Nb), or the like; an alloy containing any of the above metals as its main component; or a compound containing any of the above metals. Alternatively, the conductive film may be formed of a semiconductor such as polycrystalline silicon, in which a semiconductor film is doped with an impurity element such as phosphorus which imparts conductivity.

In this embodiment, a tantalum nitride film or a tantalum (Ta) film is used for a first conductive film, and a tungsten (W) film is used for a second conductive film. As a combination of two conductive films, a tungsten nitride film and a tungsten film, a molybdenum nitride film and a molybdenum film, an aluminum film and a tantalum film, an aluminum film and a titanium film, and the like are given as well as an example described in this embodiment. Since tungsten and tantalum nitride have high heat resistance, heat treatment for thermal activation can be performed in a step after two conductive films are formed. In addition, as a combination of the second conductive film, for example, nickel silicide and silicon doped with an impurity which imparts n-type conductivity, WSix and silicon doped with an impurity which imparts n-type conductivity, or the like may be used.

In this embodiment, the electrode 709 is formed of stacked two conductive films; however, this embodiment is not limited to this structure. The electrode 709 may be formed of a single conductive film or stacked three or more conductive films. In the case of a three-layer structure in which three or more conductive films are stacked, a stacked-layer structure of a molybdenum film, an aluminum film, and a molybdenum film may be employed.

The conductive film can be formed by a CVD method, a sputtering method, or the like. In this embodiment, the first conductive film is formed to a thickness of 20 to 100 nm, and the second conductive film is formed to a thickness of 100 to 400 nm.

Note that a mask of silicon oxide, silicon oxynitride, or the like may be used instead of a resist as a mask used when the electrode 709 is formed. In this case, a step of patterning the mask of silicon oxide, silicon oxynitride, or the like is additionally needed; however, the mask film is less reduced in etching as compared with the resist; thus, the electrode 709 with a desired width can be formed. Alternatively, the electrode 709 may be selectively formed by a droplet discharging method without a mask.

Note that a droplet discharging method refers to a method in which droplets containing a predetermined composition are discharged or ejected from fine pores to form a predetermined pattern, and includes an ink-jet method and the like in its category.

Next, an impurity element which imparts n-type conductivity (typically, P (phosphorous) or As (arsenic)) is doped into the island-shaped semiconductor films 705 and 706 at a low concentration with the electrode 709 used as a mask (first doping step). The first doping step is performed under the following condition: a dose amount of $1 \times 10^{15}$ to $1 \times 10^{19}$/cm$^3$ and an accelerated voltage of 50 to 70 keV; however, the condition is not limited thereto. In the first doping step, doping is performed through the gate insulating film 708 to form a pair of low concentration impurity regions 710 in each of the island-shaped semiconductor films 705 and 706. Note that the first doping step may be performed covering the island-shaped semiconductor film 706 to be a p-channel TFT with the mask.

Next, as illustrated in FIG. 11A, a mask 711 is formed so as to cover the island-shaped semiconductor film 705 to be an n-channel TFT. An impurity element which imparts p-type conductivity (typically B (boron)) is doped into the island-shaped semiconductor film 706 at a high concentration with the electrode 709 as well as the mask 711 used as masks (second doping step). The second doping step is performed under the following condition: a dose amount of $1 \times 10^{19}$ to $1 \times 10^{20}$/cm$^3$ and an accelerated voltage of 20 to 40 keV. In the second doping step, doping is performed through the gate insulating film 708 to form p-type high concentration impurity regions 712 in the island-shaped semiconductor film 706.

Next, as illustrated in FIG. 11B, after the mask 711 is removed by ashing or the like, an insulating film is formed so as to cover the gate insulating film 708 and the electrode 709. The insulating film is formed as a single layer or stacked layer of a silicon film, a silicon oxide film, a silicon oxynitride film, a silicon nitride oxide film, or a film containing an organic material such as an organic resin by a plasma CVD method, a sputtering method, or the like. In this embodiment, a silicon oxide film with a thickness of 100 nm is formed by a plasma CVD method.

Next, the gate insulating film 708 and the insulating film are partially etched by anisotropic etching which mainly etches in a perpendicular direction. By the anisotropic etching, the gate insulating film 708 is partially etched to form a gate insulating film 713 partially formed over the island-shaped semiconductor films 705 and 706. In addition, by the anisotropic etching, the insulating film is partially etched to form a sidewall 714 which is in contact with a side surface of the electrode 709. The sidewall 714 is used for a mask for doping when an LDD (Lightly Doped Drain) region is formed. In this embodiment, a mixed gas of CHF$_3$ and He is used as an etching gas. Note that a process for forming the sidewall 714 is not limited thereto.

Next, a mask is formed so as to cover the island-shaped semiconductor film 706 to be a p-channel TFT. An impurity element which imparts n-type conductivity (typically, P or As) is doped at a high concentration with the electrode 709 and the sidewall 714 as well as the formed mask used as masks (third doping step). The third doping step is performed under the following condition: a dose amount of $1 \times 10^{19}$ to $1 \times 10^{20}/cm^3$ and an accelerated voltage of 60 to 100 keV. In the third doping step, n-type high concentration impurity regions 715 are formed in the island-shaped semiconductor film 705.

Note that the sidewall 714 is doped with an impurity which imparts n-type conductivity at a high concentration in a subsequent step, which functions as a mask when a low concentration impurity region or a non-doped offset region is formed under the sidewall 714. Therefore, in order to control a width of the low concentration impurity region or the offset region, a condition of anisotropic etching in forming the sidewall 714 or thickness of the insulating film for forming the sidewall 714 may be changed as appropriate so that the size of the sidewall 714 is adjusted. Note that a low concentration impurity region or a non-doped offset region may be formed under the sidewall 714 of a p-channel TFT 718.

After the mask is removed by ashing or the like, the impurity region may be activated by heat treatment. For example, after a silicon oxynitride film is formed to a thickness of 50 nm, heat treatment may be performed at 550° C. for 4 hours in a nitrogen atmosphere.

Alternatively, after a silicon nitride film containing hydrogen is formed to a thickness of 100 nm, heat treatment may be performed in a nitrogen atmosphere at 410° C. for 1 hour to hydrogenate the island-shaped semiconductor films 705 and 706. Further alternatively, heat treatment may be performed in an atmosphere containing hydrogen at a temperature of 300 to 450° C. for 1 to 12 hours to hydrogenate the island-shaped semiconductor films 705 and 706. For the heat treatment, thermal annealing, a laser annealing method, an RTA method, or the like may be employed. By the heat treatment, the impurity element added to the semiconductor films can be activated as well as hydrogenation. As another means for the hydrogenation, plasma hydrogenation (which uses hydrogen excited by plasma) may be performed. In the hydrogenation process, a dangling bond can be terminated by using the thermally excited hydrogen.

Through the above series of steps, n-channel TFTs 716 and 717, a capacitor 719, and the p-channel TFT 718 are formed. Note that the capacitor 719 includes the island-shaped semiconductor film 705, the gate insulating film 713, and the electrode 709. In the capacitor 719, impurities may be doped into a region where the island-shaped semiconductor film 705 overlaps with the electrode 709.

Next, as illustrated in FIG. 11C, an insulting film 720 functioning as a passivation film for protecting the TFTs 716 to 718 and the capacitor 719 is formed. The insulating film 720 is not necessarily provided; however, by forming the insulating film 720, impurities such as alkali metal or alkaline earth metal can be prevented from entering the TFTs 716 to 718 and the capacitor 719. Specifically, silicon nitride, silicon nitride oxide, aluminum nitride, aluminum oxide, silicon oxide, or the like is desirably used for the insulating film 720. In this embodiment, a silicon oxynitride film with a thickness of approximately 600 nm is used as the insulating film 720. In this case, the hydrogenation process described above may be performed after formation of the silicon oxynitride film.

Next, an insulating film 721 is formed over the insulating film 720 so as to cover the TFTs 716 to 718 and the capacitor 719. For the insulating film 721, an organic material which has heat resistance such as polyimide, acrylic, benzocyclobutene, polyamide, or epoxy can be used. Alternatively, a low-dielectric constant material (Low-k material), a siloxane resin, silicon oxide, silicon nitride, silicon oxynitride, silicon nitride oxide, PSG (phosphosilicate glass), BPSG (borophosphosilicate glass), alumina, or the like can be used besides the above organic material. A siloxane resin may contain at least one of fluorine, an alkyl group, or aromatic hydrocarbon besides hydrogen as a substituent. Note that the insulating film 721 may be formed by stacking a plurality of insulating films formed of any of the above materials.

The insulating film 721 can be formed by a CVD method, a sputtering method, an SOG method, spin coating, dipping, spray coating, a droplet discharging method (an ink-jet method, screen printing, offset printing, or the like), a doctor knife, a roll coater, a curtain coater, a knife coater, or the like, depending on a material of the insulating film 721.

Next, contact holes are formed in the insulating film 720 and the insulating film 721 so that each of the island-shaped semiconductor films 705 and 706 is partially exposed. Then, a conductive film 722 and conductive films 723 to 728 which are in contact with the island-shaped semiconductor films 705 and 706 through the contact holes are formed. As an etching gas for forming the contact holes, a mixed gas of $CHF_3$ and He is employed; however, the etching gas is not limited thereto.

The conductive films 722 to 728 can be formed by a CVD method, a sputtering method, or the like. Specifically, for the conductive films 722 to 728, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like; an alloy containing any of the above metals as its main component; or a compound containing any of the above metals can be used. Each of the conductive films 722 to 728 can be formed as a single layer of a film which uses any of the above metals or a stacked layer of a plurality of the films.

As examples of an alloy containing aluminum as its main component, an alloy containing aluminum as its main component and also containing nickel, an alloy containing aluminum as its main component and also containing nickel and one or both carbon and silicon are given. Aluminum and aluminum silicon are optimal for a material for forming the conductive films 722 to 728 because they have low resistance and are inexpensive. In particular, an aluminum silicon (Al—Si) film can prevent generation of a hillock in resist baking when the conductive films 722 to 728 are patterned, compared to an aluminum film. Cu may be mixed by approximately 0.5% instead of silicon (Si).

For the conductive films 722 to 728, for example, a stacked-layer structure of a barrier film, an aluminum silicon (Al—Si) film, and a barrier film or a stacked-layer structure of a bather film, an aluminum silicon (Al—Si) film, a titanium nitride film, and a barrier film is preferably employed. Note that a barrier film is a film formed using titanium, a nitride of titanium, molybdenum, or a nitride of molybdenum. When barrier films are formed so as to interpose an aluminum silicon (Al—Si) film, generation of a hillock of aluminum or aluminum silicon can be further prevented. Further, when a barrier film is formed using titanium that is a highly-reducible element, even if a thin oxide film is formed over the island-shaped semiconductor films 705 and 706, the oxide film is reduced by titanium contained in the barrier film so that preferable contact between the conductive films 723 to 728 and the island-shaped semiconductor films 705 and 706 can be obtained. Alternatively, a plurality of barrier films may be stacked to be used. In this case, for example, each of the conductive films 722 to 728 can be formed to have a five-layer structure in which titanium, titanium nitride, aluminum silicon, titanium, and titanium nitride are sequentially stacked from a lower layer side.

Note that the conductive films 723 and 724 are connected to the high concentration impurity regions 715 of the n-channel TFT 716. The conductive films 725 and 726 are connected to the high concentration impurity regions 715 of the n-channel TFT 717. The conductive films 727 and 728 are connected to the high concentration impurity regions 712 of the p-channel TFT 718. Note that the electrode 709 of the n-channel TFT 716 and the electrode 709 of the capacitor 719 are electrically connected to each other. In addition, the conductive film 724 and the conductive film 725 are electrically connected to each other.

Next, as illustrated in FIG. 12A, an insulating film 730 is formed so as to cover the conductive films 722 to 728, and after that a contact hole is formed in the insulating film 730 so that part of the conductive film 722 is exposed. Then, a conductive film 731 is formed so as to be in contact with the conductive film 722 in the contact hole. Any material can be used as a material for the conductive film 731 as long as it is a material which can be used for the conductive films 722 to 728.

The insulating film 730 can be formed using an organic resin film, an inorganic insulating film, or a siloxane-based insulating film. For an organic resin film, acrylic, epoxy, polyimide, polyamide, polyvinylphenol, benzocyclobutene, or the like can be used. As an inorganic insulating film, a film containing silicon oxide, silicon oxynitride, silicon nitride oxide, or carbon typified by DLC (Diamond Like Carbon), or the like can be used. Note that a mask used for forming an opening by a photolithography method can be formed by a droplet discharging method or a printing method. In addition, the insulating film 730 can be formed by a CVD method, a sputtering method, a droplet discharging method, a printing method, or the like, depending on a material of the insulating film 730.

Next, a conductive film 732 functioning as an antenna is formed so as to be partially in contact with the conductive film 731. The conductive film 732 can be formed using a metal such as silver (Ag), gold (Au), copper (Cu), palladium (Pd), chromium (Cr), platinum (Pt), molybdenum (Mo), titanium (Ti), tantalum (Ta), tungsten (W), aluminum (Al), iron (Fe), cobalt (Co), zinc (Zn), tin (Sn), or nickel (Ni). Alternatively, as the conductive film 732, a film formed of an alloy containing any of the above metals as its main component or a film formed of a compound containing any of the above metals may be used instead of a film formed of any of the above metals. The conductive film 732 may be formed as a single layer of the above film or a stacked layer of the above plurality of films.

The conductive films 732 can be formed by a CVD method, a sputtering method, a printing method such as screen printing or gravure printing, a droplet discharging method, a dispenser method, a plating method, a photolithography method, an evaporation method, or the like.

For example, in the case of using a screen printing method, the conductive film 732 can be formed after being selectively printed over the insulating film 730 with a conductive paste in which conductive particles each have a grain size of several nm to several tens of μm are dispersed in an organic resin. The conductive particle can be formed using silver (Ag), gold (Au), copper (Cu), nickel (Ni), platinum (Pt), palladium (Pd), tantalum (Ta), molybdenum (Mo), tin (Sn), lead (Pb), zinc (Zn), chromium (Cr), titanium (Ti) or the like. Alternatively, the conductive particle can be formed of an alloy containing any of the above metals as its main component or a compound containing any of the above metals instead of a film formed of any of the above metals. Alternatively, a fine particle or a dispersive nanoparticle of silver halide can also be used. As an organic resin contained in the conductive paste, polyimide, a siloxane-based resin, an epoxy resin, a silicon resin, or the like can be used.

As examples of an alloy of the above metals, combinations of silver (Ag) and palladium (Pd), silver (Ag) and platinum (Pt), gold (Au) and platinum (Pt), gold (Au) and palladium (Pd), and silver (Ag) and copper (Cu) are given. Alternatively, a conductive particle in which copper (Cu) is coated with silver (Ag), or the like may be used, for example.

When forming the conductive film 732, baking is preferably performed after the conductive paste is applied by a printing method or a droplet discharging method. For example, in the case where conductive particles (of which grain size is greater than or equal to 1 nm and less than or equal to 100 nm) containing silver as its main component are used for the conductive paste, the conductive paste is baked at a temperature of 150 to 300° C. and thus the conductive film 732 can be formed. Baking may be performed by lamp annealing which uses an infrared lamp, a xenon lamp, a halogen lamp, or the like; furnace annealing which uses an electric furnace; or a laser annealing method which uses an excimer laser or an Nd:YAG laser. Alternatively, a fine particle containing solder or lead-free solder as its main component may be used. In this case, it is preferable to use a fine particle which has a grain size of 20 μm or less. Solder and lead-free solder have an advantage such as low cost.

When a printing method or a droplet discharging method is used, the conductive film 732 can be formed without using a mask for light-exposure. In addition, when a printing method or a droplet discharging method is used, waste of a material which would be removed by etching can be avoided unlike in the case of a photolithography method. Further, since an expensive mask for light-exposure is not necessarily used, the cost spent on the manufacturing of a semiconductor device can be reduced.

Next, as illustrated in FIG. 12B, an insulating film 733 is formed over the insulating film 730 so as to cover the conductive films 731 and 732. The insulating film 733 can be formed using an organic resin film, an inorganic insulating film, or a siloxane-based insulating film. For an organic resin film, for example, acrylic, epoxy, polyimide, polyamide, polyvinylphenol, benzocyclobutene, or the like can be used. As an inorganic insulating film, a film containing silicon oxide, silicon oxynitride, silicon nitride oxide, or carbon typified by DLC (Diamond Like Carbon), or the like can be used. Note that a mask used for forming an opening by a photolithography method can be formed by a droplet discharging method or a printing method. In addition, the insulating film 733 can be formed by a CVD method, a sputtering method, a droplet discharging method, a printing method, or the like, depending on a material of the insulating film 733. Note that it is not always necessary to form the insulating film 733.

Figure 13A:
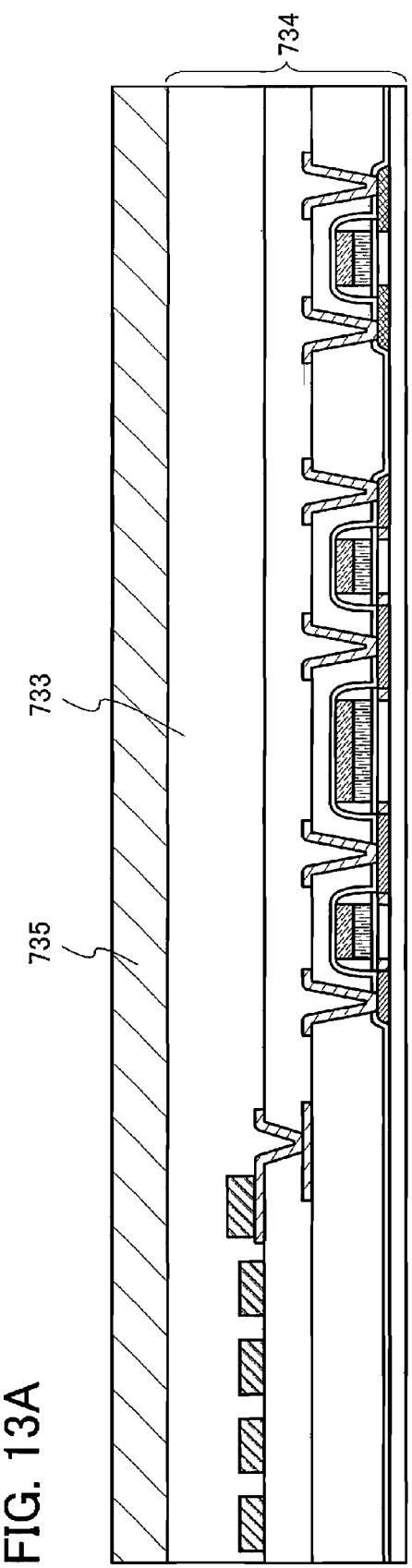
FIGS. 13A and 13B are views illustrating a manufacturing method of a semiconductor device of the present invention.

Next, as illustrated in FIG. 13A, a layer including semiconductor elements typified by TFTs, which are the insulating films 703 to 733, and various conductive films (hereinafter referred to as an element formation layer 734) is peeled from the substrate 700. In this embodiment, a first sheet material 735 is attached to a surface on the insulating film 733 side of the element formation layer 734, and then the element formation layer 734 is peeled from the substrate 700 by a physical force. The peeling layer 702 does not need to be completely removed and may be partially left.

The peeling may be performed by a method utilizing etching of the peeling layer 702. In this case, a groove is formed so that the peeling layer 702 is partially exposed. The groove is formed by dicing, scribing, processing using laser light including UV light, a photolithography method, or the like. It is only necessary that the groove be deep enough to expose the peeling layer 702. In addition, halogen fluoride is used as an etching gas, which is introduced from the groove. In this embodiment, for example, $ClF_3$ (chlorine trifluoride) is used under the following condition: a temperature of 350° C., a flow rate of 300 sccm, a pressure of 6 Torr, and a processing time of 3 hours. Alternatively, a mixed gas of nitrogen and $ClF_3$ may also be used. By using halogen fluoride such as $ClF_3$, the peeling layer 702 is selectively etched, so that the substrate 700 can be separated from the TFTs 706 to 718. Note that halogen fluoride may be either gas or liquid.

Figure 13B:
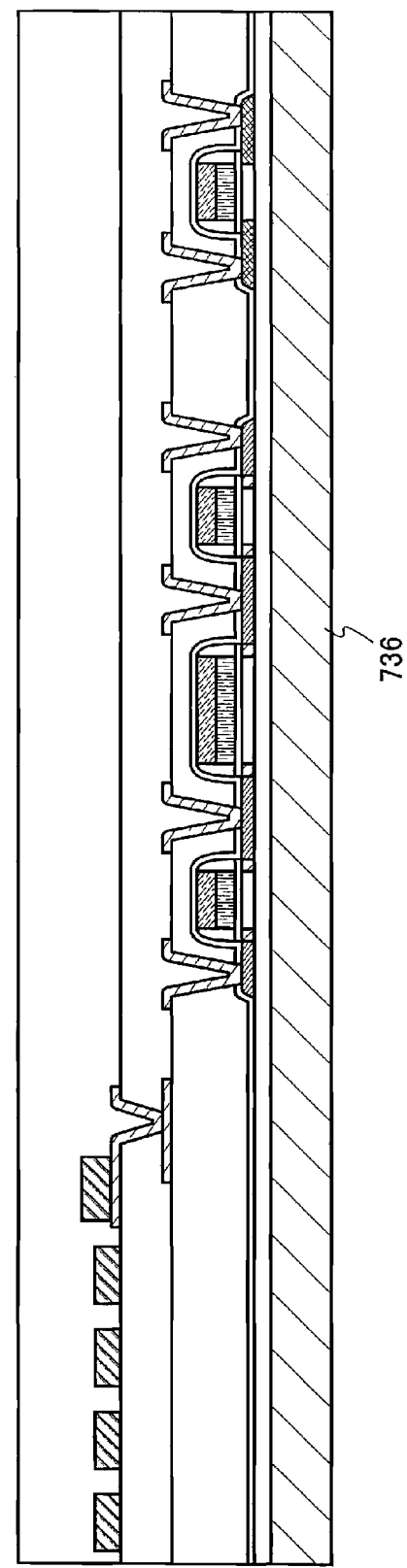

Next, as illustrated in FIG. 13B, after a second sheet material 736 is attached to a surface exposed by the separation of the element formation layer 734, the element formation layer 734 is separated from the first sheet material 735.

Note that the element formation layer 734 is cut for each semiconductor device when a plurality of semiconductor elements corresponding to semiconductor devices are formed over the substrate 700. A laser irradiation apparatus, a dicing apparatus, a scribing apparatus, or the like can be used for cutting.

Note that an example in which an antenna and a semiconductor element are formed over one substrate is described in this embodiment; however, the present invention is not limited to this structure. After formation of the semiconductor element, an antenna which is separately formed may be electrically connected to an integrated circuit. In this case, the antenna and the integrated circuit can be electrically connected to each other after being pressure-bonded with an anisotropic conductive film (ACF), anisotropic conductive paste (ACP), or the like. Alternatively, a conductive adhesive such as a silver paste, a copper paste, or a carbon paste; solder joint; or the like can also be used for the connection.

After the semiconductor device shown in FIG. 13B is completed, a third sheet material may be attached so as to cover the insulating film 733, and the second sheet material 736 and the third sheet material may be attached to each other by one or both heat treatment and pressure treatment. Hot melt films or the like may be used for the second sheet material 736 and the third sheet material. Alternatively, even in the case where the third material is not prepared, the first sheet material 735 and the second sheet material 736 may be attached to each other without separating the first sheet material 735.

As the second sheet material 736 and the third sheet material, a film to which antistatic treatment for preventing static electricity or the like is performed (hereinafter referred to as an antistatic film) can also be used. The sealing is performed using the antistatic film, whereby a semiconductor element can be prevented from being adversely affected due to external static electricity or the like when dealt with as a product.

For the antistatic film, a type in which a material which can prevent static charge (antistatic agent) is mixed into a film, a type in which a film itself has an antistatic effect, a type in which a film is coated with an antistatic agent, and the like are given. For the antistatic agent, nonionic polymers, anionic polymers, cationic polymers, nonionic surfactants, anionic surfactants, cationic surfactants, or amphoteric surfactants can be used. Alternatively, a metal, indium tin oxide (ITO), or the like can be used as the antistatic agent. In addition, for a material of the film which has an antistatic effect, an olefin-based resin, an ABS resin, a styrene-based resin, a PMMA resin, a polycarbonate-based resin, a PVC polyester-based resin, a polyamide resin, a modified PPO resin, or the like can be used.

Note that the case of forming the antenna which has a coil shape with the conductive film 732 is given as an example in this embodiment; however, this embodiment is not limited thereto. In the present invention, the antenna is not limited to have a coil shape. A dipole antenna or a patch antenna may also be used. It is only necessary that the antenna used in this embodiment be antenna which has a function of receiving a radio wave and can be manufactured by a photolithography method.

In addition, an example in which the element formation layer 734 is utilized after being separated from the substrate 700 is shown in this embodiment; however, the element formation layer 734 may be manufactured over the substrate 700 and utilized as a semiconductor device without providing the peeling layer 702.

Note that an example of using a polycrystalline semiconductor or an amorphous semiconductor as the semiconductor film 704 is described in this embodiment; however, by utilizing a silicon on insulator (SOI) substrate, a single crystal semiconductor can also be used as the semiconductor film 704. An SOI substrate can be manufactured using the following, for example: a pasting method such as UNIBOND typified by smart cut, epitaxial layer transfer (ELTRAN), a dielectric separation method, or a plasma assisted chemical etching (PACE) method; a separation by implanted oxygen (SIMOX) method; or the like.

This embodiment can be implemented in combination with any of Embodiment Modes 1 to 3 and Embodiments 1 and 2 as appropriate.

Embodiment 4

In this embodiment, an example of manufacturing the semiconductor device of the present invention with the use of a transistor formed over a single crystal substrate will be described. The transistor formed over a single crystal substrate can suppress variation in characteristics; thus, the number of transistors used for the semiconductor device can be reduced.

Figure 14A:
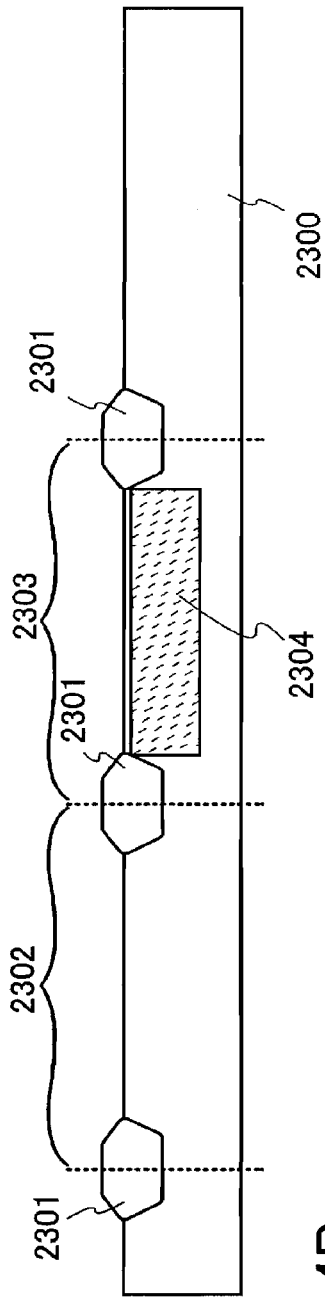
FIGS. 14A to 14C are views illustrating a manufacturing method of a semiconductor device of the present invention.

First, as illustrated in FIG. 14A, an element isolation insulating film 2301 for electrically isolating a semiconductor element is formed of an insulating film over a semiconductor substrate 2300. Formation of the element isolation insulating film 2301 makes it possible to electrically isolate a region for forming a transistor (element formation region) 2302 from an element formation region 2303.

As the semiconductor substrate 2300, a single crystal silicon substrate which has n-type or p-type conductivity or a compound semiconductor substrate (a GaAs substrate, an InP substrate, a GaN substrate, a SiC substrate, a sapphire substrate, a ZnSe substrate, or the like) can be used.

For formation of the element isolation insulating film 2301, a selective oxidation method (LOCOS (Local Oxidation of Silicon) method), a trench isolation method, or the like can be used.

Further, in this embodiment, an example in which a single crystal silicon substrate which has n-type conductivity is used as the semiconductor substrate 2300 and a p-well 2304 is formed in the element formation region 2303 is shown. The p-well 2304 formed in the element formation region 2303 of the semiconductor substrate 2300 can be formed by selective introduction of an impurity element which imparts p-type conductivity into the element formation region 2303. As the impurity element which imparts p-type conductivity, boron (B), aluminum (Al), gallium (Ga), or the like can be used. On the other hand, in the case where a semiconductor substrate which has p-type conductivity is used as the semiconductor substrate 2300, an n-well may be formed in the element formation region 2302 by selective introduction of an impurity element which imparts n-type conductivity.

Note that an impurity element is not introduced into the element formation region 2302 because the semiconductor substrate which has n-type conductivity is used as the semiconductor substrate 2300 in this embodiment. However, an n-well may be formed in the element formation region 2302 by introduction of an impurity element which imparts n-type conductivity. As the impurity element which imparts n-type conductivity, phosphorus (P), arsenic (As), or the like can be used.

Figure 14B:
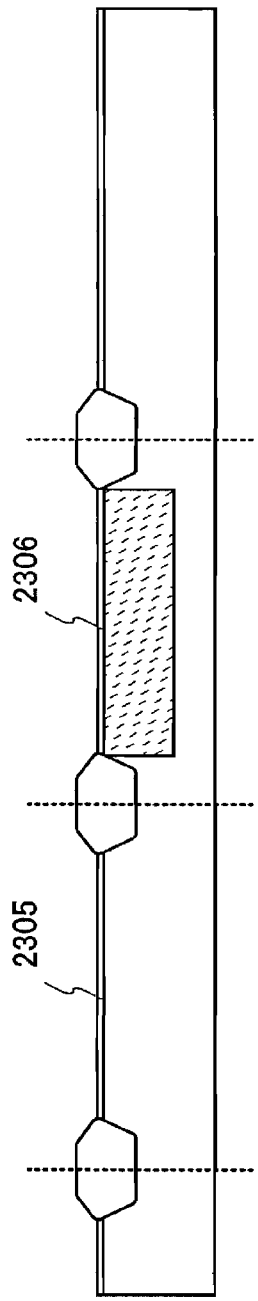

Next, as illustrated in FIG. 14B, insulating films 2305 and 2306 are formed so as to cover the element formation regions 2302 and 2303, respectively. In this embodiment, the insulating films 2305 and 2306 may be formed of silicon oxide films formed in the element formation regions 2302 and 2303 by thermal oxidization of the semiconductor substrate 2300. Alternatively, each of the insulating films 2305 and 2306 may be formed as a stacked layer of a silicon oxide film and a silicon oxynitride film by forming the silicon oxide film by thermal oxidation and then nitriding a surface of the silicon oxide film by nitridation treatment.

Further alternatively, the insulating films 2305 and 2306 may be formed using plasma treatment as described above. For example, by oxidizing or nitriding the surfaces of the semiconductor substrate 2300 by high-density plasma treatment, silicon oxide ($SiO_x$) films or silicon nitride ($SiN_x$) films to be used as the insulating films 2305 and 2306 can be formed in the element formation regions 2302 and 2303.

Figure 14C:
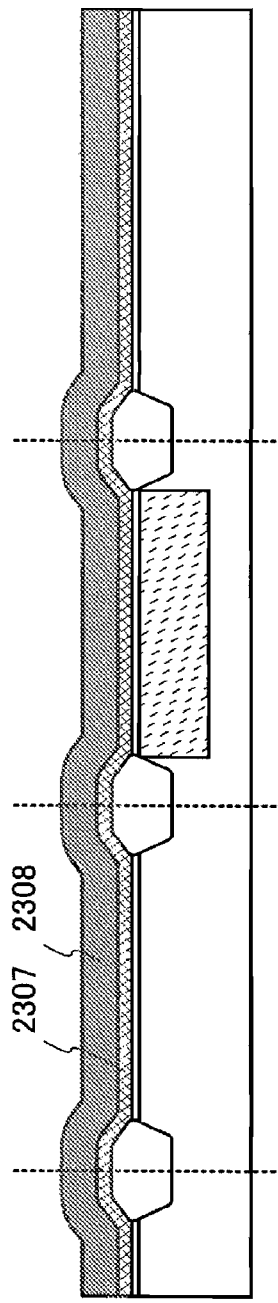

Next, as illustrated in FIG. 14C, a conductive film is formed so as to cover the insulating films 2305 and 2306. In this embodiment, an example in which a conductive film 2307 and a conductive film 2308 are sequentially stacked as the conductive film is shown. The conductive film may be formed as a single layer of a conductive film or a staked layer in which three or more conductive films are stacked.

The conductive film 2307 and the conductive film 2308 can be formed of tantalum (Ta), tungsten (W), titanium (Ti), molybdenum (Mo), aluminum (Al), copper (Cu), chromium (Cr), niobium (Nb), or the like, a film formed of an alloy containing any of the above metals as its main component, or a film formed of a compound containing any of the above metals. Alternatively, a semiconductor material typified by polycrystalline silicon doped with an impurity element which imparts conductivity, such as phosphorus, may be used. In this embodiment, the conductive film 2307 is formed using tantalum nitride, and the conductive film 2308 is formed using tungsten.

Next, as illustrated in FIG. 15A, by processing (patterning) the stacked conductive films 2307 and 2308 to have predetermined shapes, a gate electrode 2309 and a gate electrode 2310 are formed over the insulating films 2305 and 2306.

Next, as illustrated in FIG. 15B, a mask 2311 is selectively formed using a resist so as to cover the element formation region 2302, and an impurity element is introduced into the element formation region 2303. Since the gate electrode 2310 as well as the mask 2311 function as masks, by introduction of the impurity element, impurity regions 2312 functioning as source or drain regions and a channel formation region 2313 are formed in the p-well 2304. As the impurity element, an impurity element which imparts n-type conductivity or an impurity element which imparts p-type conductivity is used. As the impurity element which imparts n-type conductivity, phosphorus (P), arsenic (As), or the like can be used. As the impurity element which imparts p-type conductivity, boron (B), aluminum (Al), gallium (Ga), or the like can be used. In this embodiment, phosphorus (P) is used as the impurity element.

After the mask 2311 is removed, a mask 2314 is selectively formed using a resist so as to cover the element formation region 2303 as illustrated in FIG. 15C, and an impurity element is introduced into the element formation region 2302. Since the gate electrode 2309 as well as the mask 2314 function as masks, by introduction of the impurity element, impurity regions 2315 functioning as source or drain regions and a channel formation region 2316 are formed in the element formation region 2302 of the semiconductor substrate 2300. As the impurity element, an impurity element which imparts n-type conductivity or an impurity element which imparts p-type conductivity is used. As the impurity element which imparts n-type conductivity, phosphorus (P), arsenic (As), or the like can be used. As the impurity element which imparts p-type conductivity, boron (B), aluminum (Al), gallium (Ga), or the like can be used. In this embodiment, an impurity element which imparts conductivity which is different from that of the impurity element introduced into the element formation region 2303 in FIG. 15B (for example, boron (B)) is introduced.

Next, as illustrated in FIG. 16A, an insulating film 2317 is formed so as to cover the insulating films 2305 and 2306 and the gate electrodes 2309 and 2310, and then contact holes are formed in the insulating film 2317 so that the impurity regions 2312 and 2315 are partially exposed. Then, conductive films 2318 connected to the impurity regions 2312 and 2315 through the contact holes are formed. The conductive films 2318 can be formed by a CVD method, a sputtering method, or the like.

The insulating film 2317 can be formed using an inorganic insulating film, an organic resin film, or a siloxane-based insulating film. As an inorganic insulating film, a film containing silicon oxide, silicon oxynitride, silicon nitride oxide, or carbon typified by DLC (Diamond Like Carbon), or the like can be used. For an organic resin film, for example, acrylic, epoxy, polyimide, polyamide, polyvinylphenol, benzocyclobutene, or the like can be used. In addition, the insulating film 2317 can be formed by a CVD method, a sputtering method, a droplet discharging method, a printing method, or the like, depending on a material of the insulating film 2317.

Note that a transistor used for the semiconductor device of the present invention is not limited to a structure illustrated in this embodiment. For example, an inversely-staggered structure may be employed.

Next, as illustrated in FIG. 16B, an interlayer film 2324 is formed. Then, the interlayer film 2324 is etched to form a contact hole so that the conductive film 2318 is partially exposed. The interlayer film 2324 is not limited to a resin and may be any other film such as a CVD oxidation film; however, the interlayer film 2324 is desirably a resin in terms of planarity. Alternatively, a contact hole may be formed using a photosensitive resin without etching. After that, a wiring 2325 in contact with the conductive film 2318 through the contact hole is formed over the interlayer film 2324.

Next, a conductive film 2326 functioning as an antenna is formed so as to be in contact with the wiring 2325. The conductive film 2326 can be formed using a metal such as silver (Ag), gold (Au), copper (Cu), palladium (Pd), chromium (Cr), platinum (Pt), molybdenum (Mo), titanium (Ti), tantalum (Ta), tungsten (W), aluminum (Al), iron (Fe), cobalt (Co), zinc (Zn), tin (Sn), or nickel (Ni). Alternatively, as the conductive film 2326, a film formed of an alloy containing any of the above metals as its main component or a film formed of a compound containing any of the above metals may be used instead of a film formed of any of the above metals. The conductive film 2326 can be formed as a single layer of the above film or a stacked layer of the above plurality of films.

The conductive films 2326 can be formed by a CVD method, a sputtering method, a printing method such as screen printing or gravure printing, a droplet discharging method, a dispenser method, a plating method, a photolithography method, an evaporation method, or the like.

Note that an example in which an antenna and a semiconductor element are formed over one substrate is described in this embodiment; however, the present invention is not limited thereto. After formation of the semiconductor element, an antenna which is separately formed may be electrically connected to an integrated circuit. In this case, the antenna and the integrated circuit can be electrically connected to each other after being pressure-bonded with an anisotropic conductive film (ACF), anisotropic conductive paste (ACP), or the like. Alternatively, a conductive adhesive such as a silver paste, a copper paste, or a carbon paste; solder joint; or the like can be used for the connection.

Note that this embodiment can be implemented in combination with any of the above embodiment modes and embodiments.

Embodiment 5

In this embodiment, a structure of the rectifier circuit and the power supply circuit of the present invention illustrated in FIG. 1B will be described with reference to a top view thereof.

Figure 17:
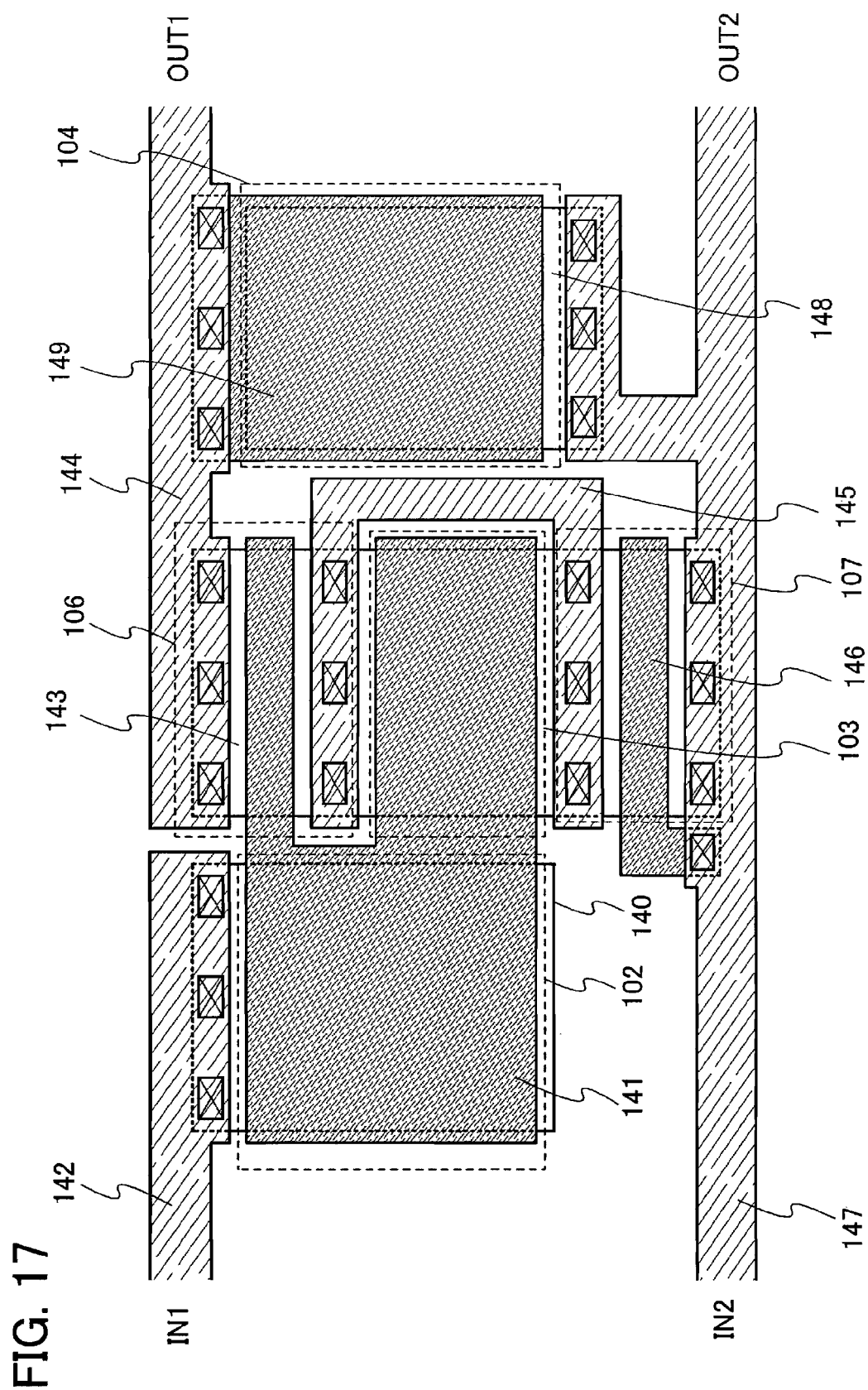
FIG. 17 is a top view of a power supply circuit of the present invention.
Figure 18:
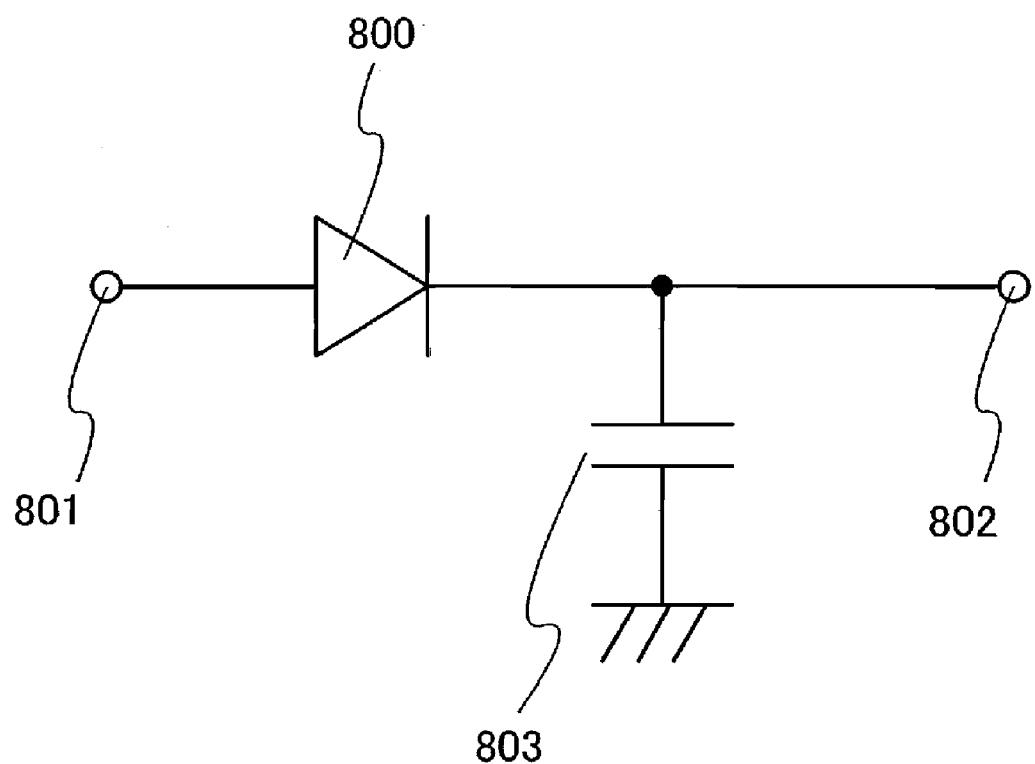
FIG. 18 is a circuit diagram illustrating a structure of a conventional rectifier circuit.
Figure 19A:
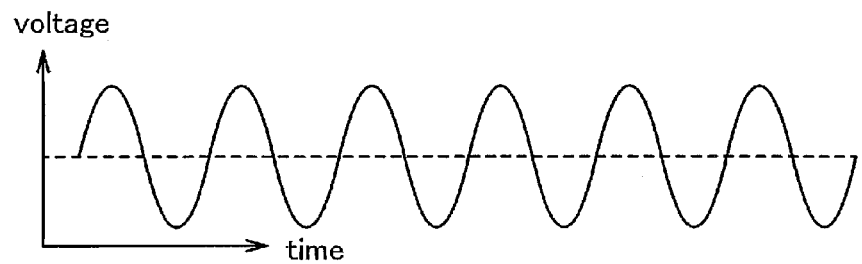
FIGS. 19A to 19E are graphs each illustrating temporal change of a voltage which is outputted from a rectifier circuit.
Figure 19B:
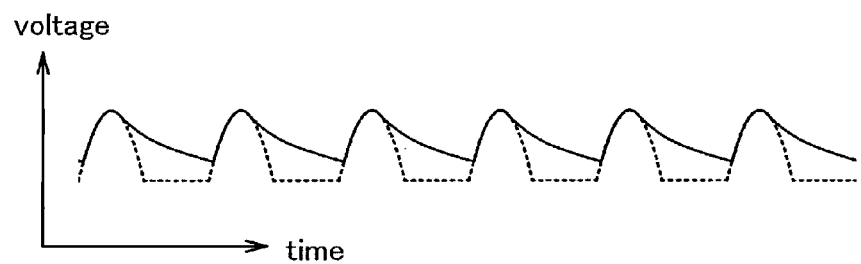
Figure 19C:
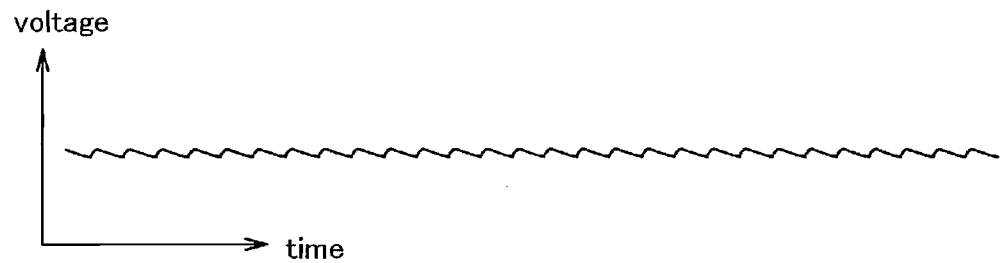
Figure 19D:
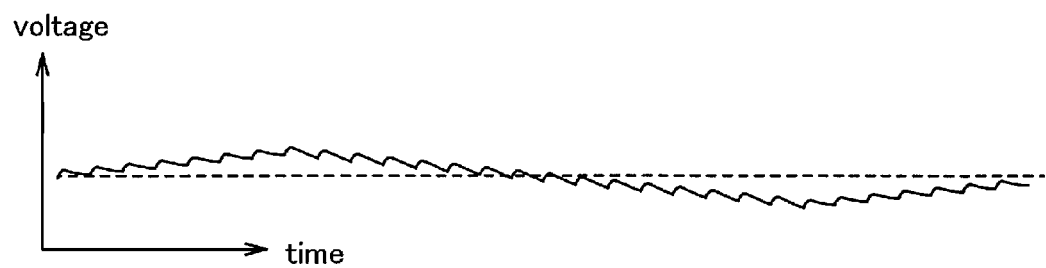
Figure 19E:
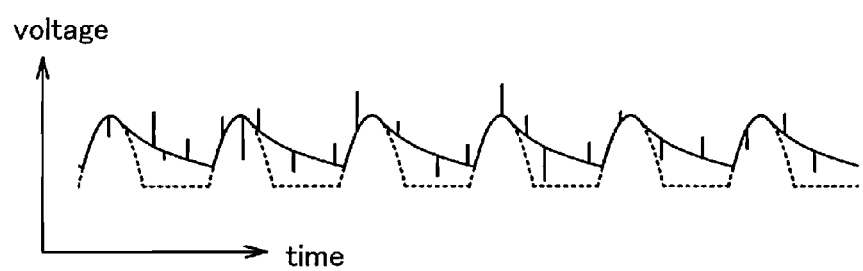

FIG. 17 illustrates a top view of the rectifier circuit and the power supply circuit of the present invention. As illustrated in FIG. 17, in this embodiment, a first capacitor 102 includes a semiconductor film 140, part of a conductive film 141, and a gate insulating film provided between the semiconductor film 140 and the conductive film 141. Further, the semiconductor film 140 is connected to the conductive film 142, and an AC signal fed to an input terminal IN1 from the conductive film 142 is inputted.

A second capacitor 103 includes part of a semiconductor film 143, another part of the conductive film 141, and a gate insulating film provided between the semiconductor film 143 and the conductive film 141. Further, part of the conductive film 141 and yet another part of the semiconductor film 143 are used as a gate electrode and an active layer, respectively, of a transistor 106. Furthermore, one of portions which function as source or drain regions of the transistor 106 in the semiconductor film 143 is connected to a conductive film 144, and the other is connected to a conductive film 145.

A conductive film 146 and yet another part of the semiconductor film 143 are used as a gate electrode and an active layer, respectively, of a transistor 107 which functions as a diode. One of portions which function as source or drain regions of the transistor 107 in the semiconductor film 143 is connected to a conductive film 147, and the other is connected to the conductive film 145. The conductive film 147 is connected to the conductive film 146. Further, a voltage of an input terminal IN2 is fed to the conductive film 147 and a voltage of the conductive film 147 is outputted to a circuit of a next stage as a voltage of an output terminal OUT 2.

A third capacitor 104 includes a semiconductor film 148, part of a conductive film 149, and a gate insulating film provided between the semiconductor film 148 and the conductive film 149. The semiconductor film 148 and the conductive film 149 are connected to the conductive film 147 and the conductive film 144, respectively. A voltage of the conductive film 144 is outputted to a circuit of a next stage as a voltage of an output terminal OUT1.

The rectifier circuit and the power supply circuit of the present invention can be formed using a process for a normal thin film transistor.

Embodiment 6

The semiconductor device of the present invention has a battery, and the battery (a secondary battery) may be charged using a DC voltage outputted from a power supply circuit. A nickel-cadmium battery, a lithium-ion secondary battery, a lead battery, or the like may be used as the battery; however, a lithium-ion secondary battery is widely used due to the advantage such as the fact that it does not have a memory effect and the fact that a large amount of current can be obtained when it is used. In addition, research on thinning lithium-ion secondary batteries has recently been carried out, and a lithium-ion battery which has a thickness of 1 to several μm has been manufactured. Such a thin film secondary battery can be utilized as a flexible secondary battery. In this embodiment, a structure of a thin film secondary battery which is used as a battery will be described.

Figure 22:
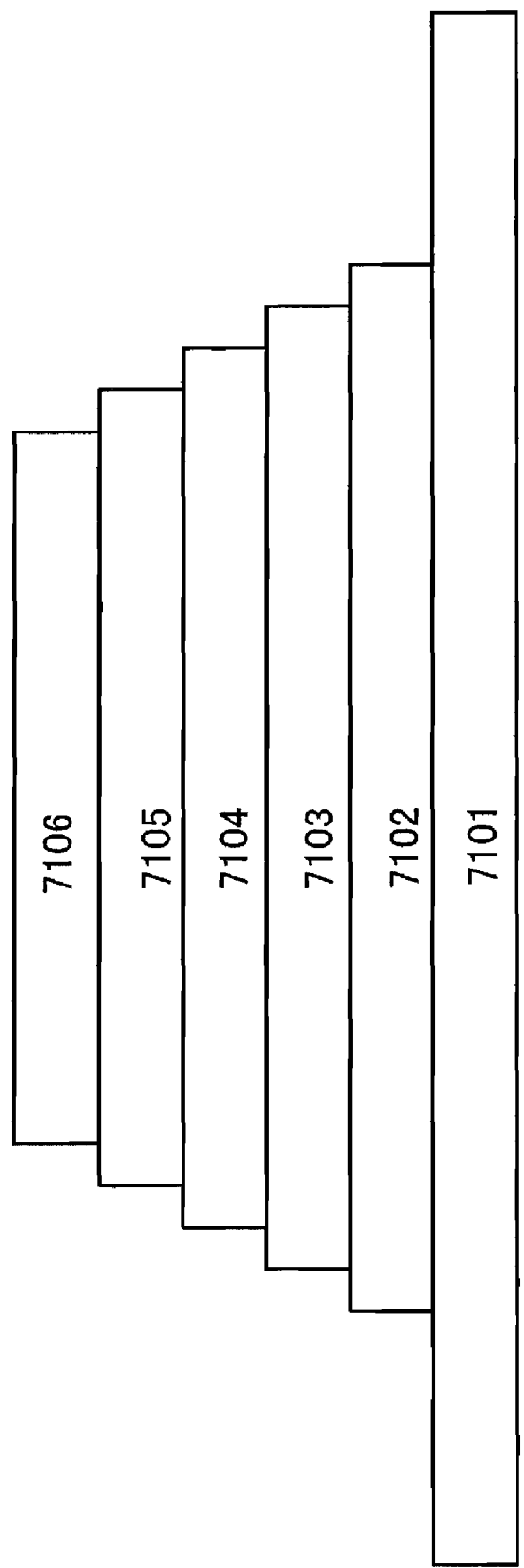
FIG. 22 is a view illustrating a structure of a thin film secondary battery used in a semiconductor device of the present invention.

FIG. 22 illustrates a structure of a cross section of the thin film secondary battery. A collector thin film 7102 which later serves as an electrode is formed over a substrate 7101. The collector thin film 7102 needs to have high adhesion to a negative electrode active material layer 7103 and have low resistance. As specific examples, aluminum, copper, nickel, vanadium, or the like can be used as the collector thin film 7102.

The negative electrode active material layer 7103 is formed over the collector thin film 7102. Vanadium oxide ($V_2O_5$) or the like is generally used for the negative electrode active material layer 7103. A solid electrolyte layer 7104 is formed over the negative electrode active material layer 7103. Lithium phosphorus oxide ($Li_3PO_4$) or the like is generally used for the solid electrolyte layer 7104. A positive electrode active material layer 7105 is formed over the solid electrolyte layer 7104. Lithium manganese oxide ($LiMn_2O_4$) or the like is generally used for the positive electrode active material layer 7105. Lithium cobalt oxide ($LiCoO_2$) or lithium nickel oxide ($LiNiO_2$) may also be used. A collector thin film 7106 which later serves as an electrode is formed over the positive electrode active material layer 7105. The collector thin film 7106 needs to have high adhesion to the positive electrode active material layer 7105 and have low resistance. As the collector thin film 7106, aluminum, copper, nickel, vanadium, or the like can be used. Each of these thin film layers may be formed using a sputtering technique or an evaporation technique. A thickness of each layer is desirably 0.1 to 3 μm.

Hereinafter, operations at the time of charging and discharging are described. At the time of charging, lithium is separated from the positive electrode active material layer 7105 to be an ion. The lithium ion is absorbed by the negative electrode active material layer 7103 through the solid electrolyte layer 7104. At this time, electrons are discharged outside from the positive electrode active material layer 7105. At the time of discharging, lithium is separated from the negative electrode active material layer 7103 to be an ion. The lithium ion is absorbed by the positive electrode active material layer 7105 through the solid electrolyte layer 7104. At this time, electrons are discharged outside from the negative electrode active material layer 7103.

By using such a thin film secondary battery that is illustrated in FIG. 22, a miniaturized and lightweight battery can be formed.

This embodiment can be implemented in combination with any of Embodiment Modes 1 to 3 and Embodiments 1 to 5 as appropriate.

Embodiment 7

A semiconductor device of the present invention can be utilized in a broader range of fields because of high tolerance to excessive current or excessive voltage.

Figure 20A:
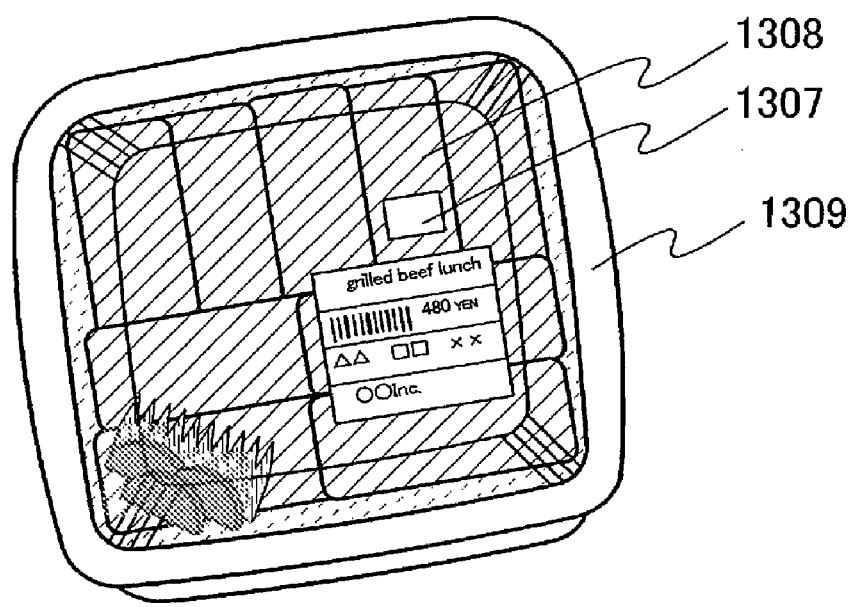
FIGS. 20A and 20B are views each illustrating usage of a semiconductor device of the present invention.

FIG. 20A illustrates a packed lunch 1309 for sale, which is wrapped in a packaging material 1308 incorporating a semiconductor device 1307 of the present invention. The packaging material corresponds to a support shapable or shaped to wrap an object, such as plastic wrap, plastic bottle, tray, and capsule. When the price and the like of the article are recorded in the semiconductor device 1307, the packed lunch 1309 can be paid for at a cash register functioning as an interrogator.

Alternatively, the semiconductor device of the present invention may be attached to, for example, a label of the article to perform distribution management of the article which uses the semiconductor device.

Figure 20B:
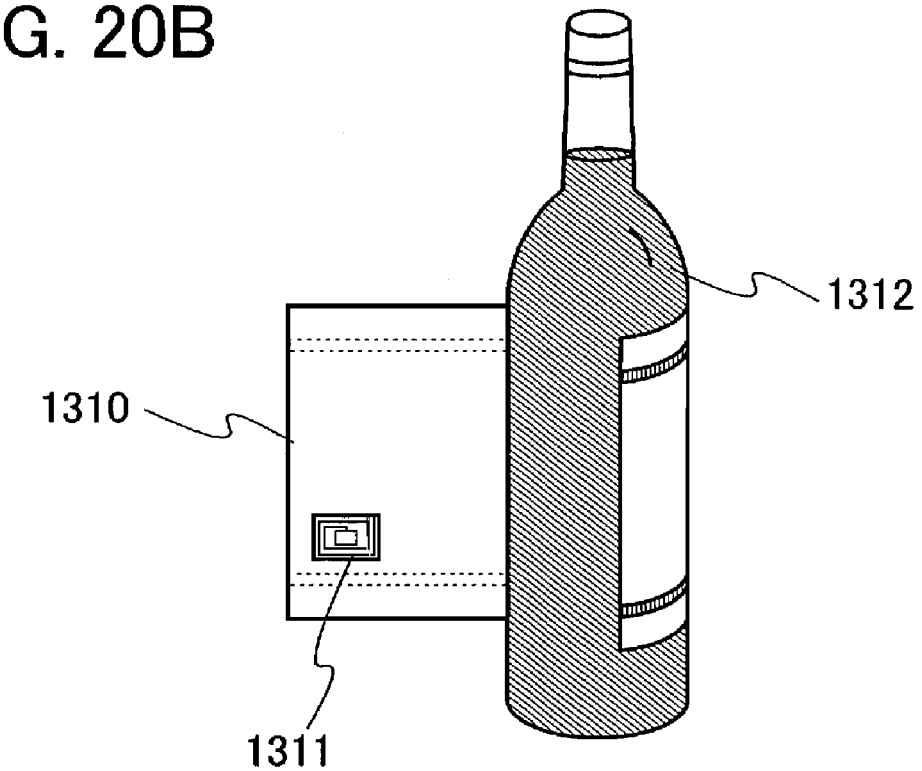

As illustrated in FIG. 20B, a semiconductor device 1311 of the present invention is attached to a support such as a label 1310 of an article, the opposite surface of which has adhesion. The label 1310 to which the semiconductor device 1311 is attached is put on an article 1312. Identification data on the article 1312 can be read wirelessly from the semiconductor device 1311 attached to the label 1310. Accordingly, the semiconductor device 1311 facilitates article management in the distribution process.

For example, if a rewritable nonvolatile memory is used as a memory of an integrated circuit in the semiconductor device 1311, the distribution process of the article 1312 can be recorded. In addition, when the production process of the product is recorded, a wholesaler, a retailer, and a consumer can easily find out a production area, a producer, a date of manufacture, a processing method, and the like.

This embodiment can be implemented in combination with any of Embodiment Modes 1 to 3 and Embodiments 1 to 6 as appropriate.

Embodiment 8

Figure 21A:
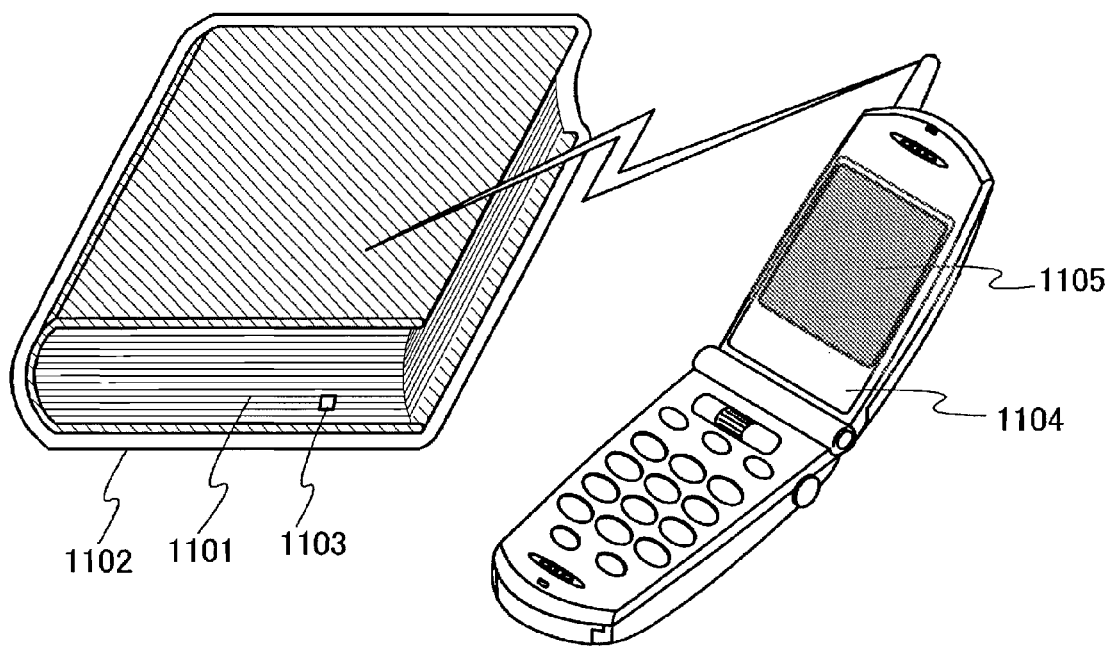
FIGS. 21A and 21B are views each illustrating usage of a semiconductor device of the present invention.

In this embodiment, a method for utilizing a semiconductor device of the present invention will be described. In the case of products such as a book, a DVD, a CD, and the like as illustrated in FIG. 21A, each of which has a value on information inherent therein; the commercial value thereof is declined when all inherent information is disclosed. However, there is a problem that it is difficult to know the commercial value of the foregoing products when the inherent information is not disclosed at all.

By wrapping the above products in a packing material incorporating the semiconductor device of the present invention and storing part of the information of the products in the semiconductor device, a customer can be told what the value of the products is without debasing the value of the product. FIG. 21A illustrates a book 1101 is wrapped in a packing material 1102 incorporating the semiconductor device 1103 of the present invention.

Figure 21B:
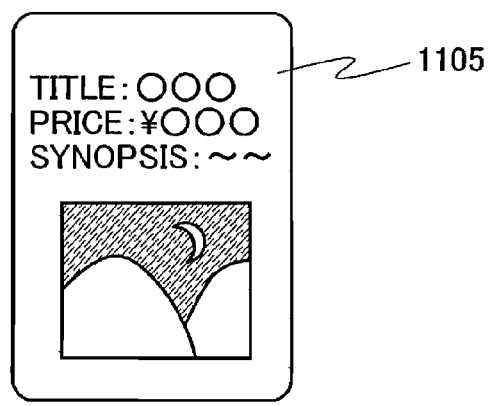

By adding the function as an interrogator to a portable information terminal such as a cellular phone, a customer can know partly the contents of the book 1101. FIG. 21B illustrates the state that the contents of the book 1101 are displayed on a display portion 1105 of a cellular phone 1104.

According to the above structure, a customer can know the contents of products without disclosing all information inhere in the products.

This embodiment can be implemented in combination with any of Embodiment Modes 1 to 3 and Embodiments 1 to 6 as appropriate.

Embodiment 9

In this embodiment, a structure and an operation of a semiconductor device of the present invention in the case where a battery is incorporated will be described.

Figure 23:
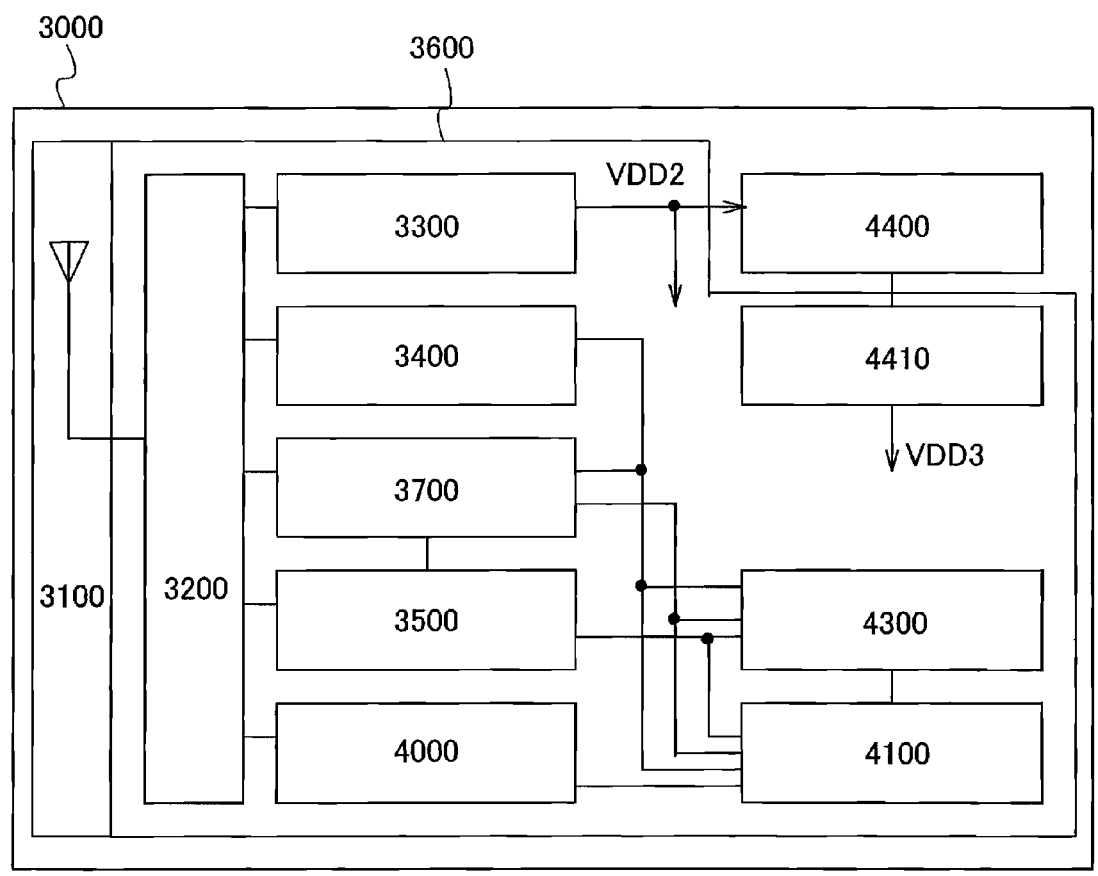
FIG. 23 is a block diagram illustrating a structure of a semiconductor device of the present invention.

First, the structure in the case where a battery is incorporated in a semiconductor device of the present invention is described with reference to FIG. 23. A semiconductor device 3000 of the present invention includes an antenna 3100 and an integrated circuit 3600. In addition, the integrated circuit 3600 has a high frequency circuit 3200, a power supply circuit 3300, a reset circuit 3400, a demodulation circuit 3500, a clock generation circuit 3700, a modulation circuit 4000, a first control circuit 4100, and a memory circuit 4300. Further, the semiconductor device 3000 has a battery 4400 and a second control circuit 4410.

Figure 24:
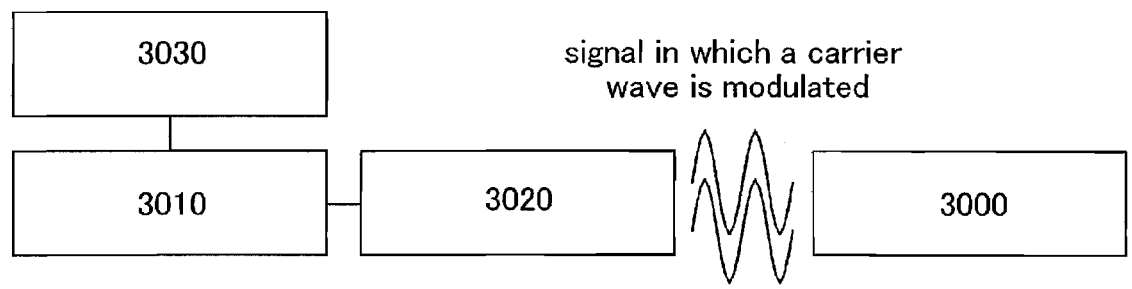
FIG. 24 is a diagram illustrating an operation of a semiconductor device of the present invention.

Next, the operation in the case where the battery is incorporated in the semiconductor device 3000 of the present invention is described with reference to FIGS. 23 and 24. A wireless signal is transmitted from an antenna unit 3020 which is connected to an interrogator 3010. Here, the wireless signal includes an instruction transmitted from the interrogator 3010 to the semiconductor device 3000.

The antenna 3100 included in the semiconductor device 3000 receives the wireless signal. Then, the received wireless signal is transmitted to each circuit block through the high frequency circuit 3200 which is connected to the antenna 3100. The power supply circuit 3300, the reset circuit 3400, the clock generation circuit 3700, the demodulation circuit 3500, and the modulation circuit 4000 are connected to the high frequency circuit 3200.

A first high power supply potential (VDD1) and a second high power supply potential (VDD2) are generated in the power supply circuit 3300. In this embodiment, the VDD2 of the two generated high power supply potentials is to be supplied to each circuit block. Note that each circuit block has a low power supply potential (VSS) in common in this embodiment. Here, the power supply circuit 3300 has a rectifier circuit, a capacitor element, and a constant voltage circuit.

An operation of the power supply circuit 3300 is briefly described. For example, as the power supply circuit 3300, the case where one capacitor element and constant voltage circuit are connected to one rectifier circuit is considered. The wireless signal transmitted to the power supply circuit 3300 through the high frequency circuit 3200, which is inputted into the rectifier circuit, is rectified. Then, the wireless signal is smoothed by the capacitor element which is connected to the rectifier circuit; thus, the first high power supply potential (VDD1) is generated. By passing through the constant voltage circuit, the generated VDD1 is a stable voltage of (the second high power supply potential, VDD2) which is less than or equal to an input. The VDD2 which is an output voltage of the constant voltage circuit is supplied to each circuit block as a power supply. Note that the generated VDD1 may be supplied to each circuit block as a power supply voltage. Further, both the VDD1 and the VDD2 may be supplied to each circuit block. The way the supply of the VDD1 or the VDD2 is used is desirably determined according to operation conditions and usage of each circuit block.

Here, the constant voltage circuit has a function to keep a DC voltage constant, and any circuit may be used as the constant voltage as long as a DC voltage can be kept constant by either a voltage or a current, or both.

Further, a reset signal is generated in the reset circuit 3400. The reset signal is a signal that performs initialization of the semiconductor device 3000, which is supplied to each circuit block in the semiconductor device 3000.

Furthermore, in the clock generation circuit 3700, a reference clock signal is generated by dividing the signal transmitted through the high frequency circuit 3200. The reference clock signal generated in the clock generation circuit 3700 is transmitted to each circuit block, which is used for latching and selecting the signal in each circuit block, counting time, or the like.

A demodulated signal is generated in the demodulation circuit 3500. The generated demodulated signal is supplied to each circuit block. Here, the demodulation circuit 3500 has a plurality of resistive elements and plurality of capacitor elements. Note that the rectifier circuit of the present invention is used as a rectifier circuit. In addition, the structure of the demodulation circuit is not limited to the above structure, and any structure may be employed as long as a circuit which has a function of rectifying current is combined with an element such as a resistor, a capacitor, or a coil so as to have a function capable of demodulating.

Each circuit block and the first control circuit 4100 are connected to each other, and signals generated in each circuit block (such as the reset signal, the demodulated signal, the reference clock signal, the VDD1, and the VDD2) are supplied to the first control circuit 4100.

The instruction transmitted from the interrogator 3010 to the semiconductor device 3000 is extracted from the supplied signals by the first control circuit 4100 and the first control circuit 4100 determines what kind of instruction is transmitted. In addition, the first control circuit 4100 has a role of controlling the memory circuit 4300.

In this manner, it is determined what kind of instruction has been transmitted from the interrogator 3010, and the memory circuit 4300 is operated in accordance with the determined instruction. Then, a signal including specific data such as an ID number, which is stored or written in the memory circuit 4300, is outputted. Alternatively, information transmitted from the interrogator 3010 is stored in the memory circuit 4300.

Here, as the memory circuit 4300, the following can be used: a dynamic random access memory (DRAM), a static random access memory (SRAM), a ferroelectric random access memory (FeRAM), a mask read only memory (ROM), an electrically programmable read only memory (EPROM), an electrically erasable and programmable read only memory (EEPROM), or a flash memory.

Further, the first control circuit 4100 also has a role of converting the signal including specific data such as an ID number, which is stored or written in the memory circuit 4300, into a signal encoded by an encoding method which conforms to a standard such as an ISO standard or the like. Then, in accordance with the encoded signal, the signal transmitted to the antenna 3100 is modulated by the modulation circuit 4000.

The modulated signal is received by the antenna unit 3020 which is connected to the interrogator 3010. Then, the received signal is analyzed by the interrogator 3010, so that the specific data such as an ID number of the semiconductor device 3000 can be recognized.

Lastly, a function and an operation of the battery 4400 incorporated in the semiconductor device 3000 of the present invention are described.

The battery 4400 is electrically connected to the power supply circuit 3300 and the second control circuit 4410.

Further, an electric charge may be supplied at least from either the VDD1 or the VDD2 to the battery 4400 from the power supply circuit 3300. Usually, an electric charge which is supplied at least from either the VDD1 or the VDD2 is stored.

The second control circuit 4410 generates a third high power supply potential (VDD3) by controlling the operation of the battery 4400. Here, the second control circuit 4410 may be connected at least to one circuit block of the circuit blocks included in the semiconductor device 3000 of the present invention.

The second control circuit 4410 does not operate when the VDD2, which is supplied to each circuit block, is sufficient to operate each circuit block. The second control circuit 4410 operates when the VDD2, which is supplied to each circuit block, is not sufficient to operate each circuit block, and the VDD3 is supplied to each circuit block by controlling the battery 4400. Accordingly, transmission and reception between the antenna unit 3020, which is connected to the interrogator 3010, and the semiconductor device 3000, in which the battery 4400 is incorporated, can be performed.

Here, as an example of the case where the VDD2, which is supplied to each circuit block, is not sufficient to operate each circuit block, the case is given where the antenna unit 3020, which is electrically connected to the interrogator 3010, and the semiconductor device 3000, in which the battery 4400 is incorporated, are not close to each other. Generally, when the antenna unit and the semiconductor device are not close to each other, it is difficult to transmit and receive a signal. However, when the battery is incorporated, the battery is usually charged during transmission and reception, and a power supply voltage is supplied from the battery when transmission and reception is difficult, so that transmission and reception can be performed even when the antenna unit and the semiconductor device are not close to each other.

Note that the case where the VDD2, which is supplied to each circuit block, is not sufficient to operate each circuit block is not limited to the above example.

In a wireless communication system which uses the semiconductor device 3000 in which the battery 4400 is incorporated, the semiconductor device 3000 in which the battery 4400 is incorporated, the antenna unit 3020 which is connected to the interrogator 3010 which has a known structure, and a control terminal 3030 for controlling the interrogator 3010 can be used. A communication method of the semiconductor device 3000 in which the battery 4400 is incorporated and the antenna unit 3020 which is connected to the interrogator 3010 is one-way communication or two-way communication. Any of a space division multiplexing method, a polarization division multiplexing method, a frequency-division multiplexing method, a time-division multiplexing method, a code division multiplexing method, and an orthogonal frequency division multiplexing method can be used as the method.

The wireless signal is a signal in which a carrier wave is modulated. Modulation of a carrier wave is an analog modulation or a digital modulation, which may be any of an amplitude modulation, a phase modulation, a frequency modulation, and spread spectrum.

As for a frequency of a carrier wave, any of the following can be employed: 300 GHz to 3 THz which is a submillimeter wave; 30 GHz to 300 GHz which is a millimeter wave; 3 GHz to 30 GHz which is a microwave; 300 MHz to 3 GHz which is an ultra high frequency; 30 MHz to 300 MHz which is a very high frequency; 3 MHz to 30 MHz which is a high frequency; 300 kHz to 3 MHz which is a medium frequency; 30 kHz to 300 kHz which is a low frequency; and 3 kHz to 30 kHz which is a very low frequency.

The antenna 3100 and the antenna unit 3020 can be any one of a dipole antenna, a patch antenna, a loop antenna, and a Yagi antenna. In addition, a wireless signal in the antenna 3100 and the antenna unit 3020 may be transmitted and received by any one of an electromagnetic coupling method, and electromagnetic induction method, and a radio wave method.

Further, in the present invention, the term "being connected" is synonymous with the term "being electrically connected". Therefore, another element or the like may be sandwiched between elements.

Note that this embodiment can be implemented in combination with any of the above embodiment modes and embodiments.

The present application is based on Japanese Patent Application serial no. 2006-321034 filed in Japan Patent Office on Nov. 29, 2006, the entire contents of which are hereby incorporated by reference.

What is claimed is:

1. A semiconductor device comprising:
a first capacitor;
a second capacitor;
a transistor; and
a diode,
wherein the first capacitor, the second capacitor, and the diode are connected in series in that order between an input terminal and a first output terminal,
wherein the second capacitor is connected between one of source and drain regions and a gate electrode of the transistor, and
wherein the other one of the source and drain regions of the transistor is connected to a second output terminal.

2. The semiconductor device according to claim 1, wherein the transistor is an n-channel type, and the one of the source and drain regions of the transistor is connected to a cathode of the diode.

3. The semiconductor device according to claim 1, wherein the transistor is a p-channel type, and the one of the source and drain regions of the transistor is connected to an anode of the diode.

4. The semiconductor device according to claim 1, wherein the diode is a transistor in which source or drain region is connected to a gate electrode.

5. The semiconductor device according to claim 1, further comprising a memory.

6. The semiconductor device according to claim 1,
wherein the semiconductor device is configured to be wrapped in a packing material together with a product, and
wherein the semiconductor device is configured to store part of an information of the product.

7. A semiconductor device comprising:
a first capacitor;
a second capacitor;
a third capacitor;
a transistor; and
a diode,
wherein the first capacitor, the second capacitor, and the diode are connected in series in that order between an input terminal and a first output terminal,
wherein the second capacitor is connected between one of source and drain regions and a gate electrode of the transistor,
wherein the other one of the source and drain regions of the transistor is connected to a second output terminal, and
wherein the third capacitor is connected between the first and second output terminals.

8. The semiconductor device according to claim 7, wherein the transistor is an n-channel type, and the one of the source and drain regions of the transistor is connected to a cathode of the diode.

9. The semiconductor device according to claim 7, wherein the transistor is a p-channel type, and the one of the source and drain regions of the transistor is connected to an anode of the diode.

10. The semiconductor device according to claim 7, wherein the diode is a transistor in which source or drain region is connected to a gate electrode.

11. The semiconductor device according to claim 7, further comprising a memory.

12. The semiconductor device according to claim 7,
wherein the semiconductor device is configured to be wrapped in a packing material together with a product, and
wherein the semiconductor device is configured to store part of an information of the product.

13. A semiconductor device comprising:
a first capacitor;
a second capacitor;
a third capacitor;
a transistor;
a diode; and
a resistor,
wherein the first capacitor, the second capacitor, and the diode are connected in series in that order between an input terminal and a first output terminal,
wherein the second capacitor is connected between one of source and drain regions and a gate electrode of the transistor,
wherein the other one of the source and drain regions of the transistor is connected to a second output terminal,
wherein the third capacitor is connected between the first and second output terminals, and
wherein the resistor is connected between the gate electrode of the transistor and the first or second output terminal.

14. The semiconductor device according to claim 13, wherein the transistor is an n-channel type, and the one of the source and drain regions of the transistor is connected to a cathode of the diode.

15. The semiconductor device according to claim 13, wherein the transistor is a p-channel type, and the one of the source and drain regions of the transistor is connected to an anode of the diode.

16. The semiconductor device according to claim 13, wherein the diode is a transistor in which source or drain region is connected to a gate electrode.

17. The semiconductor device according to claim 13, further comprising a memory.

18. The semiconductor device according to claim 13,
wherein the semiconductor device is configured to be wrapped in a packing material together with a product, and
wherein the semiconductor device is configured to store part of an information of the product.

* * * * *

UNITED STATES PATENT AND TRADEMARK OFFICE
CERTIFICATE OF CORRECTION

| | |
|---|---|
| PATENT NO. | : 8,050,070 B2 |
| APPLICATION NO. | : 13/022789 |
| DATED | : November 1, 2011 |
| INVENTOR(S) | : Yutaka Shionoiri |

Page 1 of 2

It is certified that error appears in the above-identified patent and that said Letters Patent is hereby corrected as shown below:

At column 8, line 38, "V1" should be --VI--;

At column 8, line 40, "V1" should be --VI--;

At column 8, line 42, "V1" should be --VI--;

At column 8, line 46, "V1" should be --VI--;

At column 8, line 49, "V1" should be --VI--;

At column 8, line 50, "V1" should be --VI--;

At column 8, line 51, "V1" should be --VI--;

At column 8, line 56, "V1" should be --VI--;

At column 8, line 59, "V1" should be --VI--;

At column 8, line 61, "V1" should be --VI--;

At column 9, line 15, "V1" should be --VI--;

At column 12, line 16, "V1" should be --VI--;

At column 12, line 19, "V1" should be --VI--;

At column 12, line 20, "V1" should be --VI--;

At column 12, line 24, "V1" should be --VI--;

At column 12, line 27, "V1" should be --VI--;

At column 12, line 28, "V1" should be --VI--;

At column 12, line 29, "V1" should be --VI--;

At column 12, line 34, "V1" should be --VI--;

At column 12, line 37, "V1" should be --VI--;

At column 12, line 39, "V1" should be --VI--;

At column 12, line 60, "V1" should be --VI--;

At column 15, line 8, "N1" should be --INI--;

Signed and Sealed this
Twenty-seventh Day of December, 2011

David J. Kappos
*Director of the United States Patent and Trademark Office*

CERTIFICATE OF CORRECTION (continued)
U.S. Pat. No. 8,050,070 B2

At column 26, line 52, "bather" should be --barrier--.